United States Patent
Lee et al.

(10) Patent No.: US 12,291,540 B2
(45) Date of Patent: May 6, 2025

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Jiyoun Lee, Anyang-si (KR); Soyeon Kim, Seoul (KR); Yongsuk Cho, Hwaseong-si (KR); Jongwon Choi, Yongin-si (KR); Dmitry Kravchuk, Hwaseong-si (KR); Banglin Lee, Suwon-si (KR); Hyun Koo, Seongnam-si (KR); Sunghun Lee, Hwaseong-si (KR); Yuri Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 871 days.

(21) Appl. No.: 16/831,700

(22) Filed: Mar. 26, 2020

(65) Prior Publication Data
US 2020/0308205 A1    Oct. 1, 2020

(30) Foreign Application Priority Data

Mar. 29, 2019  (KR) .................. 10-2019-0037213
Mar. 24, 2020  (KR) .................. 10-2020-0035405

(51) Int. Cl.
C07F 15/00     (2006.01)
H10K 50/11    (2023.01)
H10K 85/30    (2023.01)
H10K 101/10   (2023.01)

(52) U.S. Cl.
CPC ....... *C07F 15/0033* (2013.01); *H10K 85/342* (2023.02); *H10K 50/11* (2023.02); *H10K 2101/10* (2023.02)

(58) Field of Classification Search
CPC . C07F 15/0033; H01L 51/0085; C09K 11/06; C09K 2211/185; H10K 85/342
See application file for complete search history.

(56) References Cited

U.S. PATENT DOCUMENTS

| | | | |
|---|---|---|---|
| 6,465,115 B2 | 10/2002 | Shi et al. | |
| 6,596,415 B2 | 7/2003 | Shi et al. | |
| 7,799,440 B2 | 9/2010 | Chen et al. | |
| 2001/0019782 A1 | 9/2001 | Igarashi et al. | |
| 2003/0068526 A1* | 4/2003 | Kamatani | C09K 11/06 546/10 |
| 2004/0239237 A1* | 12/2004 | Matsusue | H10K 50/18 313/504 |
| 2007/0015005 A1 | 1/2007 | Chen et al. | |
| 2009/0295281 A1* | 12/2009 | Shin | C07F 15/0033 546/10 |
| 2010/0219407 A1* | 9/2010 | Kamatani | H01L 51/0034 257/E51.026 |
| 2010/0289406 A1 | 11/2010 | Ma et al. | |
| 2015/0364701 A1 | 12/2015 | Horiuchi et al. | |
| 2020/0099000 A1* | 3/2020 | Zhang | C07F 15/0033 |
| 2021/0193937 A1 | 6/2021 | Kim et al. | |
| 2021/0355148 A1* | 11/2021 | Choi | C07F 15/0033 |

FOREIGN PATENT DOCUMENTS

| | | | | |
|---|---|---|---|---|
| CN | 101077971 A | 11/2007 | | |
| CN | 101538290 A | 9/2009 | | |
| CN | 102264864 A | 11/2011 | | |
| CN | 108610383 A | 10/2018 | | |
| CN | 113004337 A | 6/2021 | | |
| EP | 1418217 A1 | 5/2004 | | |
| EP | 2182002 A1 * | 5/2010 | .......... | C07F 15/0033 |
| EP | 2182002 B1 | 7/2012 | | |
| JP | 2000003782 A | 1/2000 | | |
| KR | 20030041968 A | 5/2003 | | |

(Continued)

OTHER PUBLICATIONS

Su et al., "Highly Efficient Red ElectrophosphorescentDevices Based on Iridium Isoquinoline Complexes: Remarkable External Quantum Efficiency Over a Wide Range of Current" Advanced Materials, vol. 15 (2003) pp. 884-888. (Year: 2003).*
Konno et al., machine translation of WO-2008069322-A1 (2010) pp. 1-43. (Year: 2010).*
Extended European Search Report of EP 20165175.9, dated May 27, 2020, 9 pp.
M. A. Baldo, et al., Nature, 1998, vol. 395, 151-154, Highly efficient phosphorescent emission Fromorganic electroluminescent devices.
M.A. Baldo, et al., Appl. Phys. Lett. 1999, 75, 4, https://doi.org/10.1063/1.124258, Very high-efficiency green organic light-emitting devices based on electrophosphorescence.

(Continued)

*Primary Examiner* — Dylan C Kershner
(74) *Attorney, Agent, or Firm* — CANTOR COLBURN LLP

(57) ABSTRACT

Provided are an organometallic compound represented by Formula 1, an organic light-emitting device including the same, and an electronic apparatus including the organic light-emitting device:

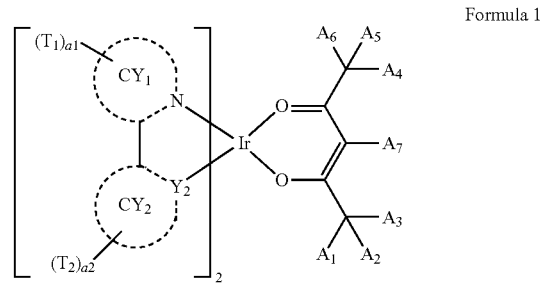

Formula 1 wherein, in Formula 1, $Y_2$, ring $CY_1$, ring $CY_2$, $T_1$, $T_2$, $A_1$ to $A_7$, a1, and a2 are as defined in the specification.

16 Claims, 1 Drawing Sheet

(56) References Cited

FOREIGN PATENT DOCUMENTS

| KR | 20070006617 A | 1/2007 | | |
|---|---|---|---|---|
| KR | 20100047466 A | 5/2010 | | |
| KR | 1020110077350 A | 7/2011 | | |
| KR | 101850953 B1 | 4/2018 | | |
| KR | 1020200115008 A | 10/2020 | | |
| WO | 2002099008 A1 | 12/2002 | | |
| WO | WO-2008069322 A1 | * | 6/2008 | ............ C07D 221/04 |
| WO | WO-2010031738 A1 | * | 3/2010 | .......... C07F 15/0033 |
| WO | 2011051749 A1 | 5/2011 | | |
| WO | 2019221487 A1 | 11/2019 | | |

OTHER PUBLICATIONS

Raymond C. Kwong, et al., Appl. Phys. Lett. 81, 162 (2002); https://doi.org/10.1063/1.1489503, High operational stability of electrophosphorescent devices.

Sergey Lamansky, et al., Inorg. Chem. 2001, 40, 1704-1711, Synthesis and Characterization of Phosphorescent Cyclometalated Iridium Complexes.

Sergey Lamansky, et al., J. Am. Chem. Soc. 2001, 123, 4304-4312, Highly Phosphorescent Bis-Cyclometalated Iridium Complexes: Synthesis, Photophysical Characterization, and Use in Organic Light Emitting Diodes.

XP055694565, Novel Compounds for Electronic Material and Organic Electronic Device using the Same, Young Jun Cho, et al., May 13, 2020, 4 pp.

English Abstract of Office Action dated Mar. 12, 2024, issued in corresponding CN Patent Application No. 202010228605.1, 11 pp.

Office Action dated Mar. 12, 2024, issued in corresponding CN Patent Application No. 202010228605.1, 10 pp.

English Translation of Office Action dated Aug. 28, 2024, issued in corresponding KR Patent Application No. 10-2020-0035405, 9 pp.

Office Action dated Aug. 28, 2024, issued in corresponding KR Patent Application No. 10-2020-0035405, 10 pp.

\* cited by examiner

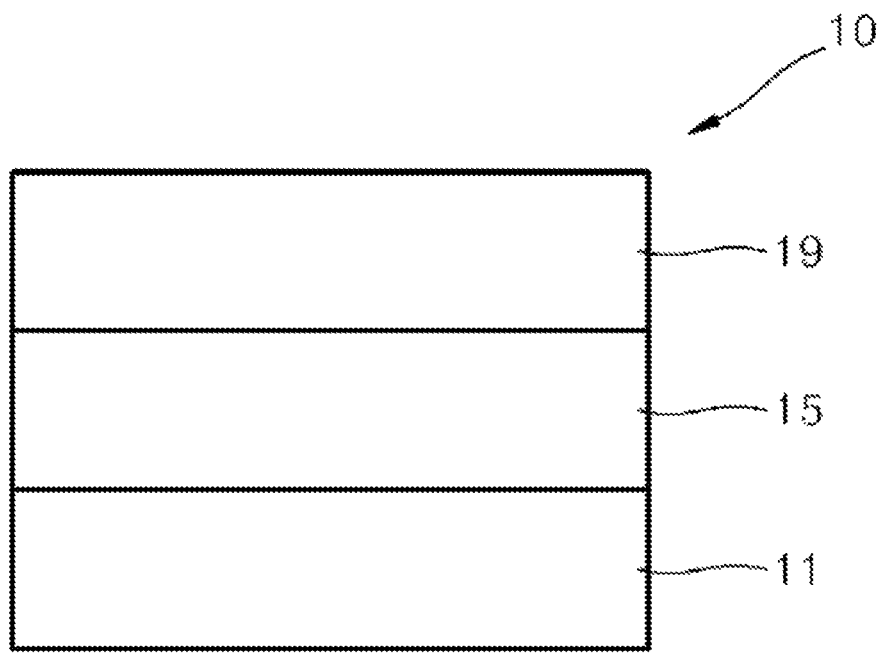

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Applications No. 10-2019-0037213, filed on Mar. 29, 2019, and No. 10-2020-0035405, filed on Mar. 24, 2020, in the Korean Intellectual Property Office, and all the benefits accruing under 35 U.S.C. § 119, the contents of which is incorporated herein in its entirety by reference.

BACKGROUND

1. Field

One or more embodiments relate to an organometallic compound, an organic light-emitting device including the organometallic compound, and an electronic apparatus including the organic light-emitting device.

2. Description of the Related Art

Organic light-emitting devices are self-emission devices, which have better characteristics in terms of a viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

Aspects of the present disclosure provide an organometallic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments.

An aspect of the present disclosure provides an organometallic compound represented by Formula 1:

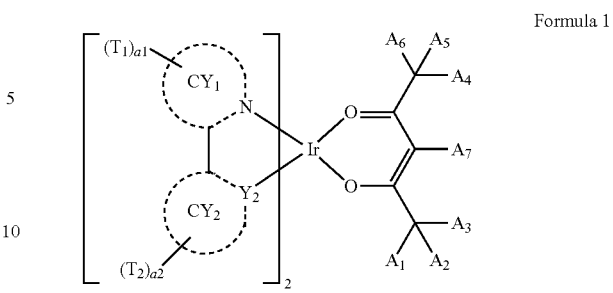

Formula 1 wherein, in Formula 1,
$Y_2$ is C or N,
ring $CY_1$ is a $C_5$-$C_{30}$ polycyclic group in which three or more monocyclic groups are condensed to one another, wherein the group represented by in Formula 1 is not a group represented by

* is a binding site to iridium (Ir) in Formula 1, and is a binding site to the ring $CY_2$ in Formula 1,
ring $CY_2$ is a $C_5$-$C_{30}$ carbocyclic group or a $C_1$-$C_{30}$ heterocyclic group,
$T_1$, $T_2$ and $A_1$ to $A_7$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), a1 and a2 are each independently an integer of 0 to 20; when a1 is 2 or greater, two or more $T_1(s)$ are identical to or different from each other; when a2 is 2 or greater, two or more $T_2(s)$ are identical to or different from each other; and the sum of a1 and a2 is 1 or greater, at least one of $T_1(s)$ in number of a1, at least one of $T_2(s)$ in number of a2, or any combination thereof includes at least one fluoro group (—F)

two or more of $T_1(s)$ in number of a1 are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, two or more of $T_2(s)$ in number of a2 are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, $T_1$ and $T_2$ are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, two or more of $A_1$ to $A_7$ are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$.

$R_{1a}$ is the same as defined in connection with $A_7$, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group are each independently:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or any combination thereof;

—N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$); or any combination thereof, $Q_1$ to $Q_9$, $Q_{11}$ to $Q_{19}$, $Q_{21}$ to $Q_{29}$ and $Q_{31}$ to $Q_{39}$ are each independently:

hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$o heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Another aspect of the present disclosure provides an organic light-emitting device including: a first electrode; a second electrode; and an organic layer disposed between the first electrode and the second electrode and including an emission layer, the organic layer including at least one organometallic compound represented by Formula 1.

Another aspect of the present disclosure provides an electronic apparatus including the above-described organic light-emitting device.

In one or more embodiments, the organometallic compound may be in the emission layer of the organic layer, and the organometallic compound in the emission layer may serve as a dopant.

BRIEF DESCRIPTION OF THE DRAWING

These and/or other aspects will become apparent and more readily appreciated from the following description of the embodiments, taken in conjunction with the accompanying drawing in which:

FIGURE is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES It will be understood that relative terms are intended to encompass different orientations of the device in addition to the orientation depicted in the FIGURES For example, if the device in one of the FIGURES is turned over, elements described as being on the "lower" side of other elements would then be oriented on "upper" sides of the other elements The exemplary term "lower," can therefore, encompasses both an orientation of "lower" and "upper," depending on the particular orientation of the FIGURE Similarly, if the device in one of the FIGURES is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1:

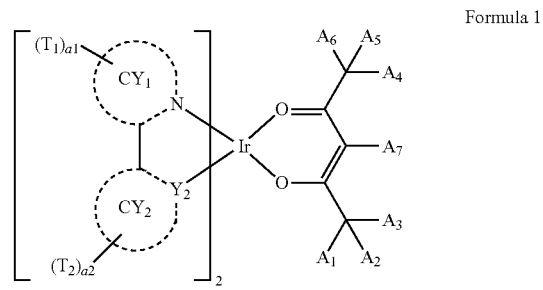

Formula 1

In Formula 1, $Y_2$ may be C or N. For example, $Y_2$ may be C.

In Formula 1, ring $CY_1$ may be a $C_5$-$C_{30}$ polycyclic group in which three or more (for example, three, four, five, or six) monocyclic groups are condensed to one another, wherein the group represented by

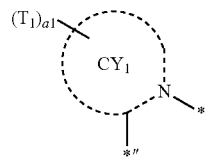

in Formula 1 may be not a group represented by

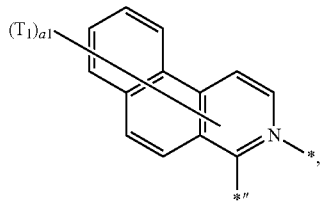

* is a binding site to iridium (Ir) in Formula 1, and *" is a binding site to the ring $CY_2$ in Formula 1.

For example, the monocyclic group may be a cyclopentane group, a cyclopentene group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, a triazasilole group, an adamantane group, a norbornane group, a norbornene group, a cyclohexane group, a cyclohexene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group, and the three or more monocyclic groups may be the same or different.

In one or more embodiments, the monocyclic group may include: a benzene group; and at least one of a pyridine group, a pyrimidine group, a pyrazine group, and a pyridazine group.

In one or more embodiments, the monocyclic group may include: a benzene group; and at least one of a pyridine group, a pyrimidine group, a pyrazine group, and a pyridazine group, and optionally, further include a cyclopentane group, a cyclopentene group, a cyclohexane group, a cyclohexene group, an adamantane group, a norbornane group, a norbornene group, or any combination thereof.

In one or more embodiments, in Formula 1, ring $CY_1$ may include one or two nitrogens.

In Formula 1, ring $CY_2$ may be a $C_5$-$C_{30}$ carbocyclic group or a $C_1$-$C_{30}$ heterocyclic group.

For example, in Formula 1, ring $CY_2$ may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazol group, a benzopyrazole group, a benzimidazole group, a benzoxazole group, a benzothiazole group, a benzoxadiazole group, a benzothiadiazol group, a 5,6,7,8-tetrahydroisoquinoline group, a 5,6,7,8-tetrahydroquinoline group, a phenoxazine group, a phenothiazine group, a dihydrophenazine group, a dihydroacridine group, an azaphenoxazine group, an azaphenothiazine group, an azadihydrophenazine group, or an azadihydroacridine group.

In one or more embodiments, in Formula 1, ring $CY_2$ may be a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

In one or more embodiments, in Formula 1, ring $CY_2$ may be a benzene group, a dibenzothiophene group, a dibenzofuran group, a carbazole group, a fluorene group, or a dibenzosilole group.

In Formula 1, $T_1$, $T_2$, and $A_1$ to $A_7$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$). Here, $Q_1$ to $Q_9$ will be understood with reference to the descriptions thereof in the specification.

For example, in Formula 1, $T_1$, $T_2$, and $A_1$ to $A_7$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, a $C_2$-$C_{20}$ alkenyl group, a $C_1$-$C_{20}$ alkoxy group, or $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{20}$ alkyl group, a deuterated C$_2$-C$_{20}$ alkyl group, a C$_1$-C$_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a (C$_1$-C$_{20}$ alkyl)cyclopentyl group, a (C$_1$-C$_{20}$ alkyl)cyclohexyl group, a (C$_1$-C$_{20}$ alkyl)cycloheptyl group, a (C$_1$-C$_{20}$ alkyl)cyclooctyl group, a (C$_1$-C$_{20}$ alkyl)adamantanyl group, a (C$_1$-C$_{20}$ alkyl)norbornanyl group, a (C$_1$-C$_{20}$ alkyl)norbornenyl group, a (C$_1$-C$_{20}$ alkyl)cyclopentenyl group, a (C$_1$-C$_{20}$ alkyl)cyclohexenyl group, a (C$_1$-C$_{20}$ alkyl)cycloheptenyl group, a (C$_1$-C$_{20}$ alkyl)bicyclo[1.1.1]pentyl group, a (C$_1$-C$_{20}$ alkyl)bicyclo[2.1.1]hexyl group, a (C$_1$-C$_{20}$ alkyl)bicyclo[2.2.2]octyl group, a phenyl group, a (C$_1$-C$_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N(Q$_1$)(Q$_2$), —Si(Q$_3$)(Q$_4$)(Q$_5$), —Ge(Q$_3$)(Q$_4$)(Q$_5$), —B(Q$_6$)(Q$_7$), —P(=O)(Q$_8$)(Q$_9$), or —P(Q$_8$)(Q$_9$); and Q$_1$ to Q$_9$ may each independently be:

deuterium, —F, —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, —CD$_2$CDH$_2$, —CF$_3$, —CF$_2$H, —CFH$_2$, —CH$_2$CF$_3$, —CH$_2$CF$_2$H, —CH$_2$CFH$_2$, —CHFCH$_3$, —CHFCF$_2$H, —CHFCFH$_2$, —CHFCF$_3$, —CF$_2$CF$_3$, —CF$_2$CF$_2$H, or —CF$_2$CFH$_2$; or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, a phenyl group, a biphenyl group, or a naphthyl group, each unsubstituted or substituted with deuterium, —F, C$_1$-C$_{10}$ alkyl group, a phenyl group, or any combination thereof.

In one or more embodiments, in Formula 1, T$_1$, T$_2$, and A to A$_7$ may each independently be hydrogen, deuterium, —F, —CH$_3$, —CD$_3$, —CD$_2$H, —CDH$_2$, —CF$_3$, —CF$_2$H, —CFH$_2$, a C$_2$-C$_{10}$ alkenyl group, a C$_1$-C$_{10}$ alkoxy group, a C$_1$-C$_{10}$ alkylthio group, one of groups represented by Formulae 9-1 to 9-39, one of groups represented by Formulae 9-1 to 9-39 in which at least one hydrogen is substituted with deuterium, one of groups represented by Formulae 9-1 to 9-39 in which at least one hydrogen is substituted with —F, one of groups represented by Formulae 9-201 to 9-237, one of groups represented by Formulae 9-201 to 9-237 in which at least one hydrogen is substituted with deuterium, one of groups represented by Formulae 9-201 to 9-237 in which at least hydrogen is substituted with —F, one of groups represented by Formulae 10-1 to 10-129, one of groups represented by Formulae 10-1 to 10-129 in which at least one hydrogen is substituted with deuterium, one of groups represented by Formulae 10-1 to 10-129 in which at least one hydrogen is substituted with —F, one of groups represented by Formulae 10-201 to 10-350, one of groups represented by Formulae 10-201 to 10-350 in which at least one hydrogen is substituted with deuterium, one of groups represented by Formulae 10-201 to 10-350 in which at least one hydrogen is substituted with —F, —Si(Q₃)(Q₄)(Q₅), or —Ge(Q₃)(Q₄)(Q₅)(wherein Q₃ to Q₀₅ will be understood with reference to the descriptions thereof in the specification).
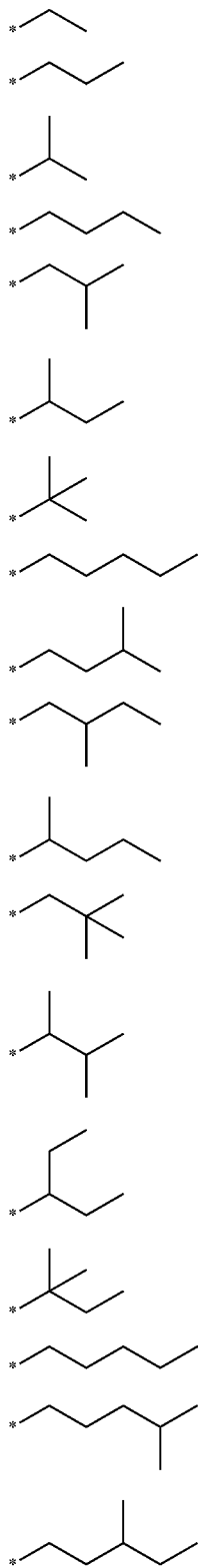
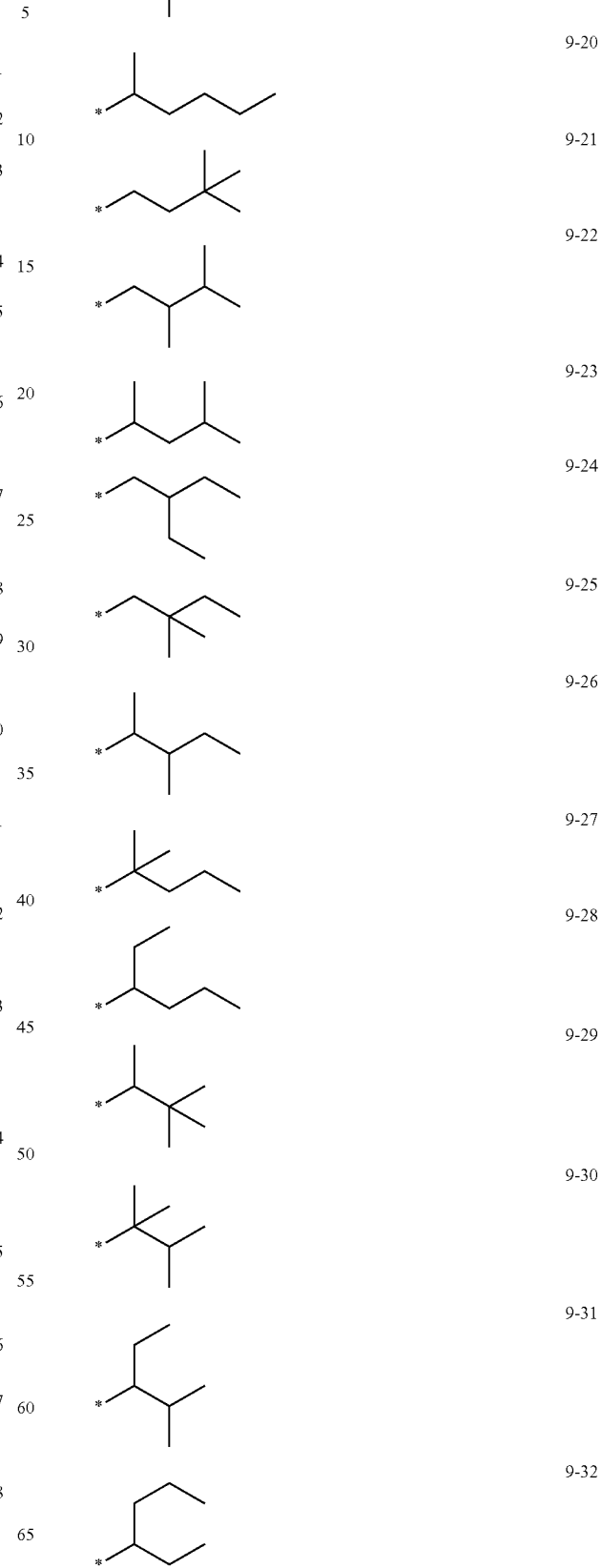
-continued

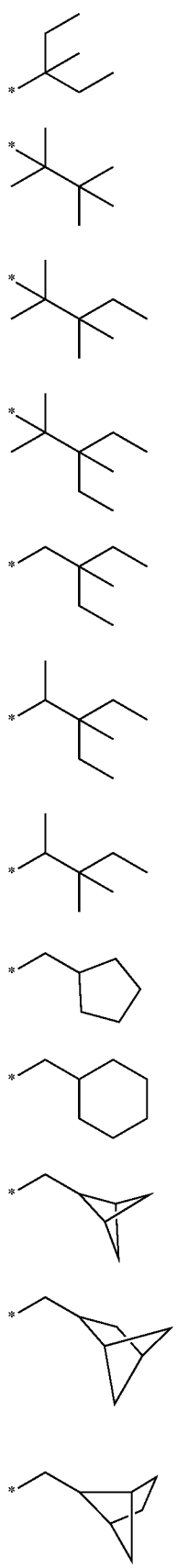
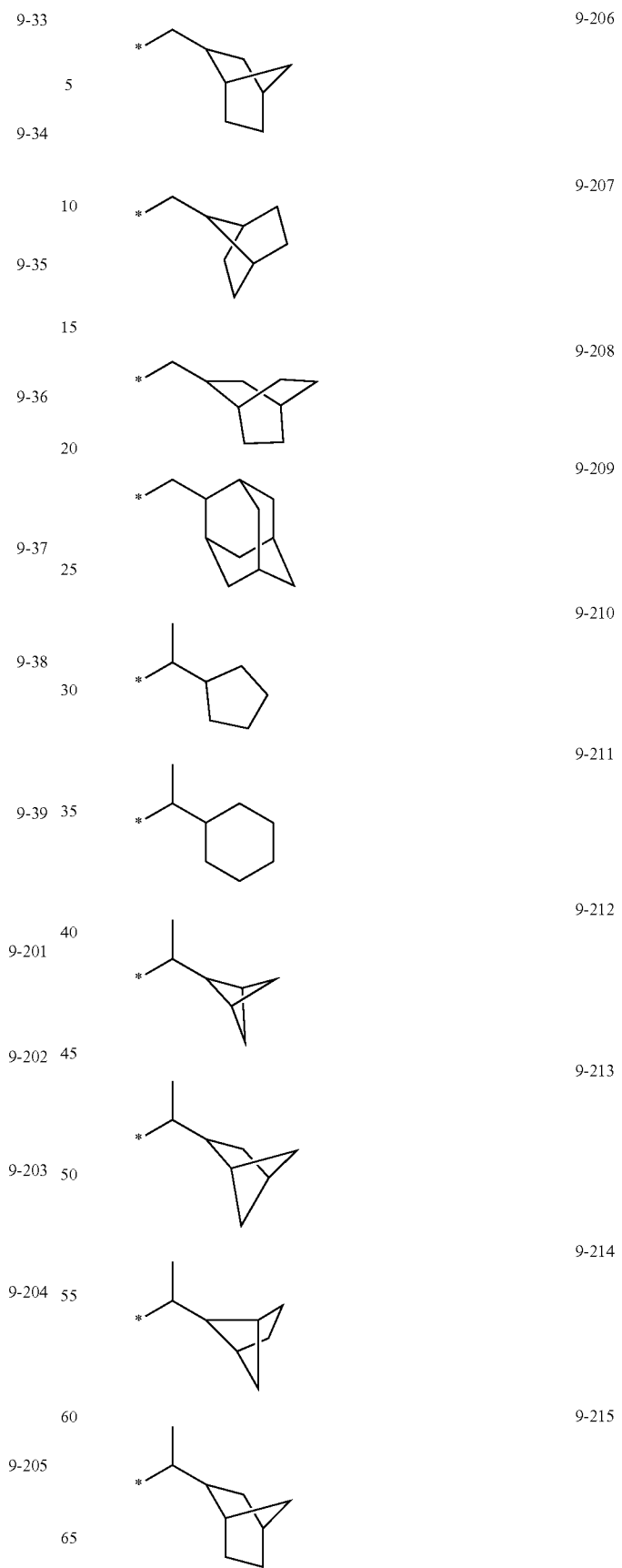

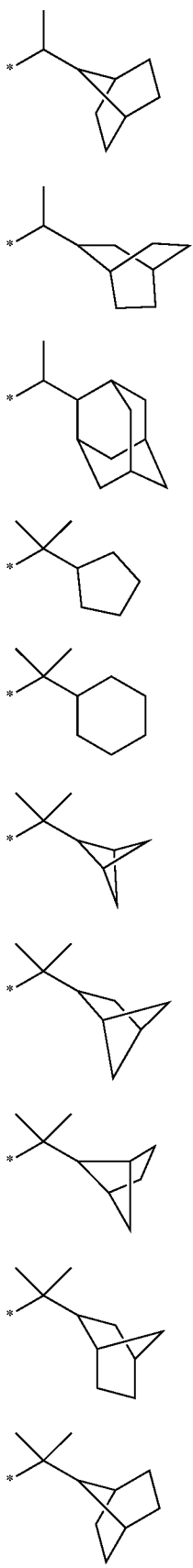
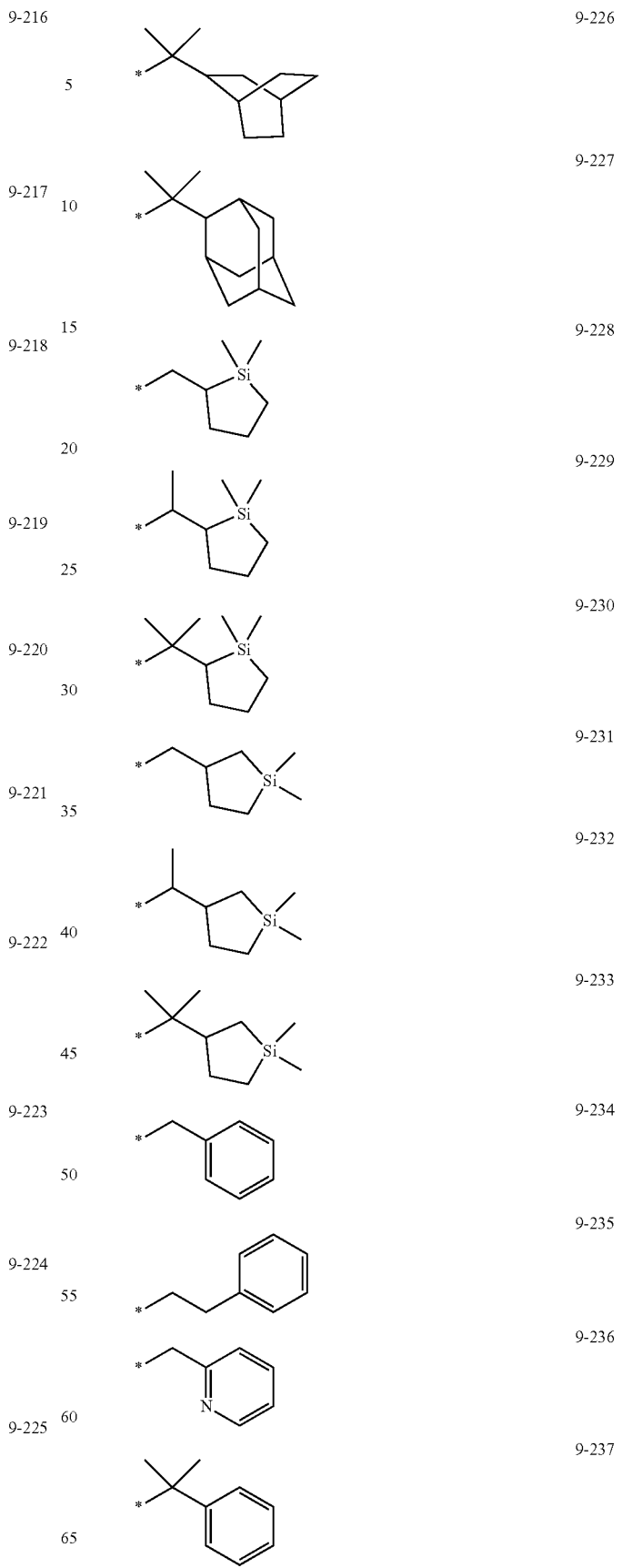

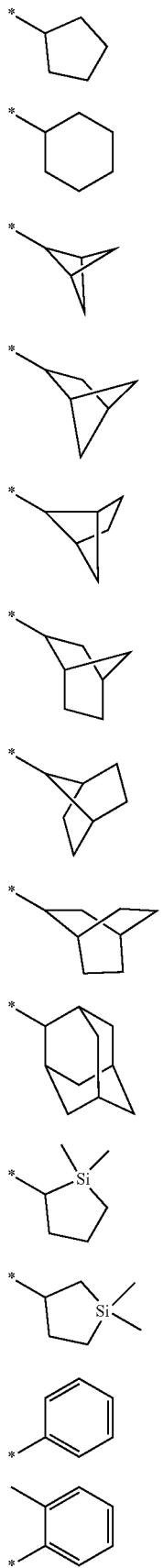
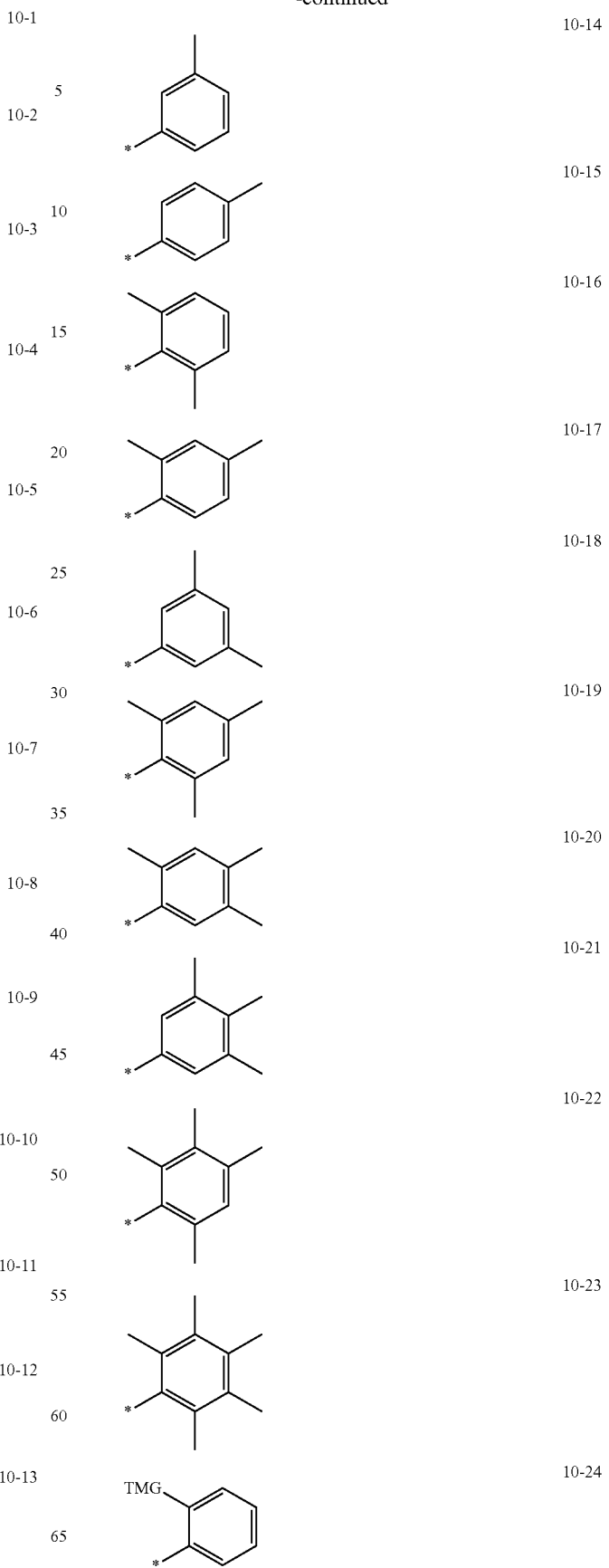

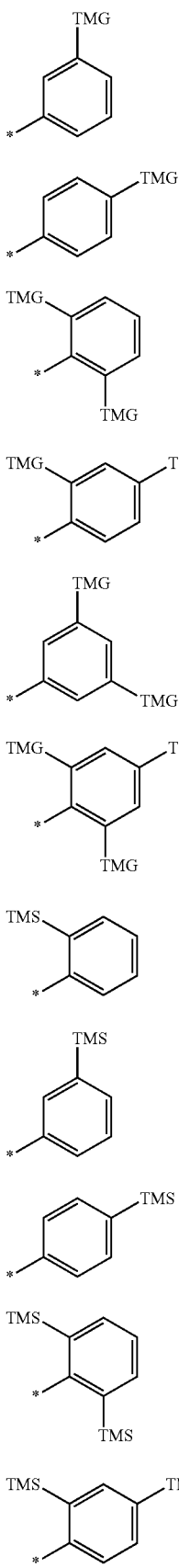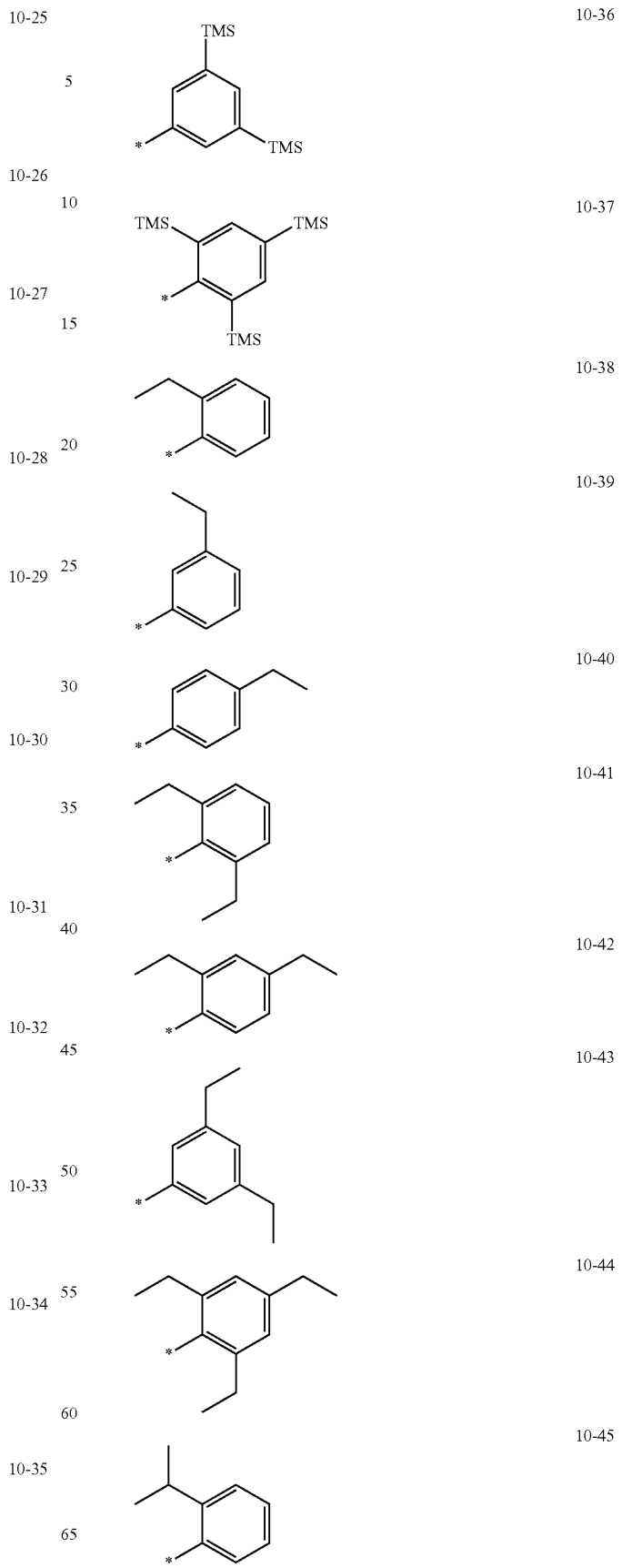

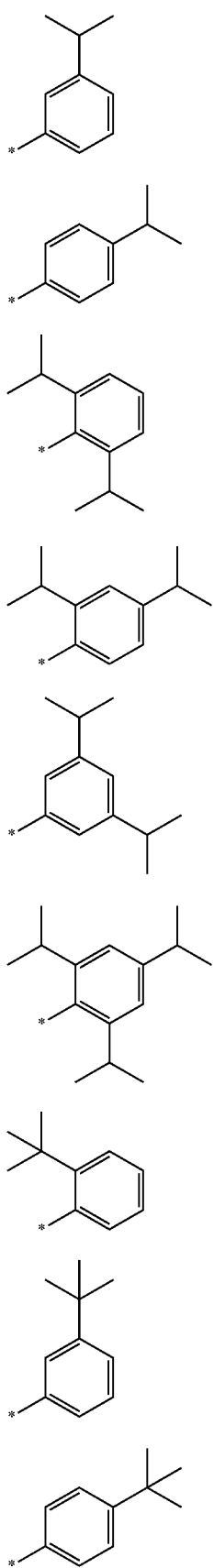
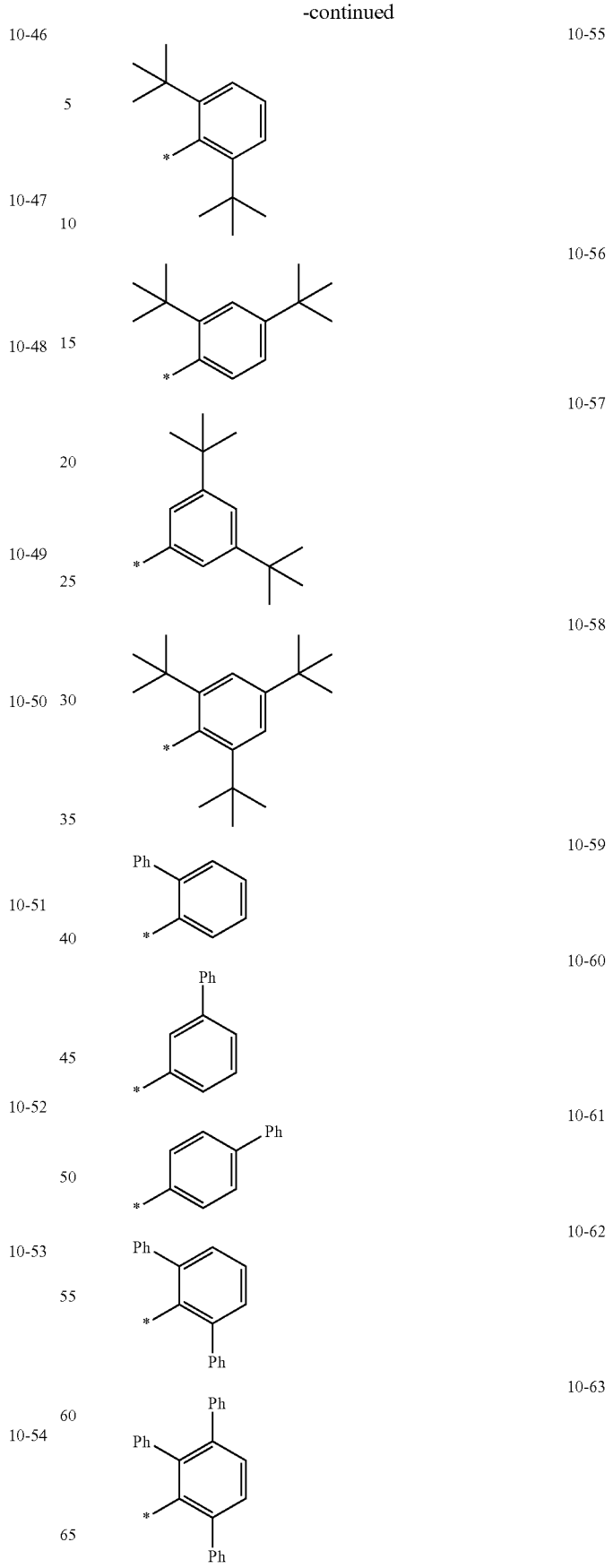

-continued
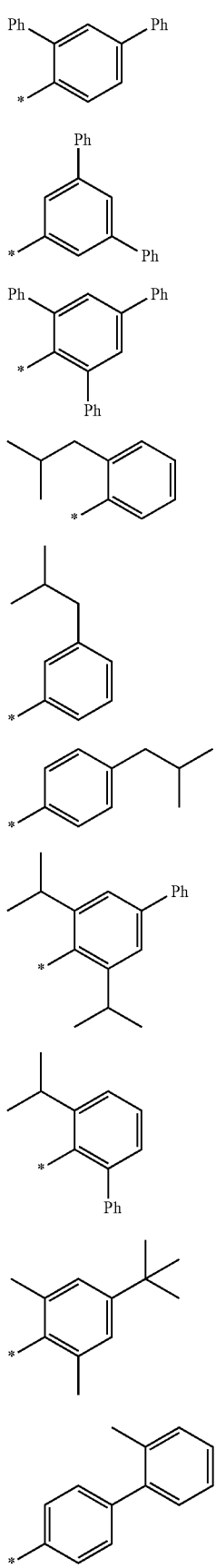
-continued
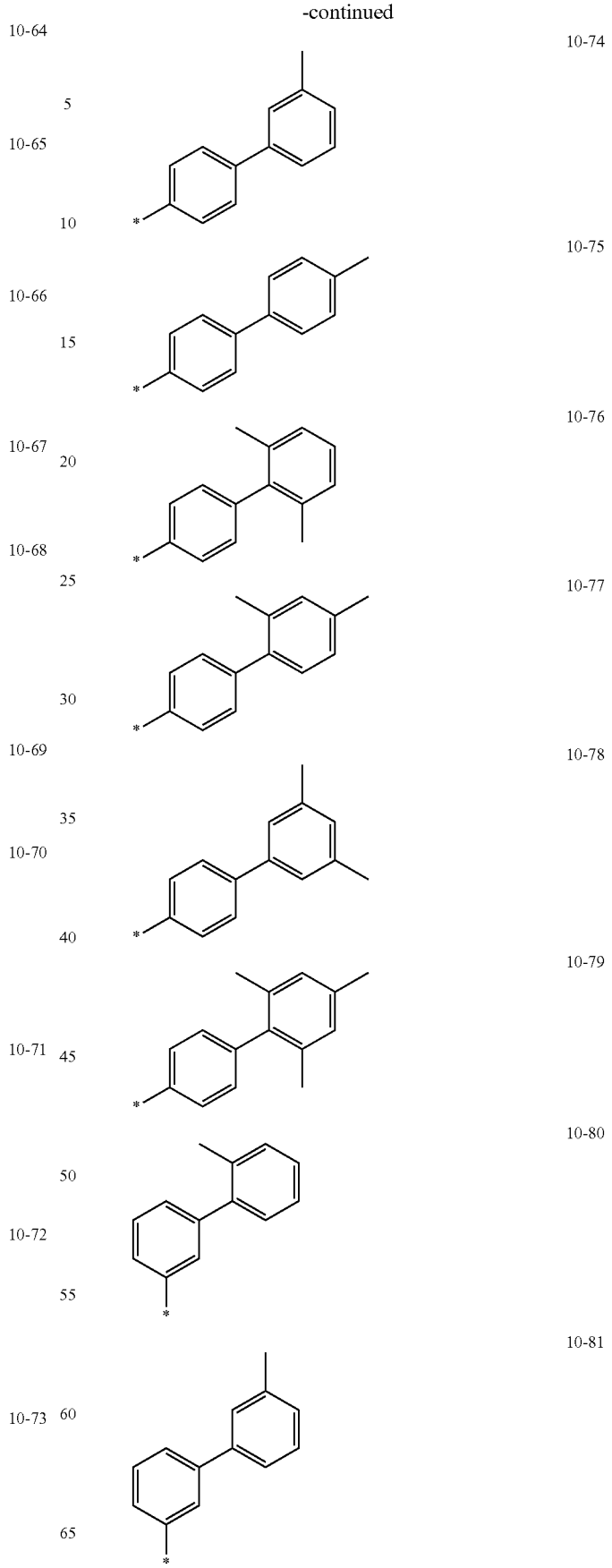

10-82
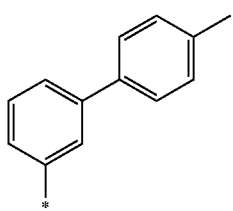
10-83
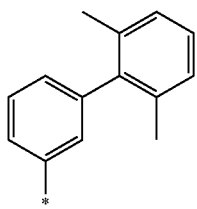
10-84
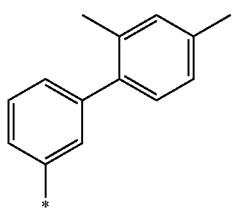
10-85
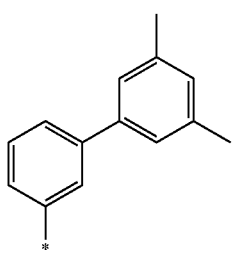
10-86
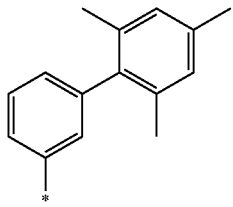
10-87
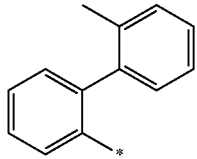
10-88
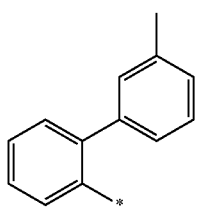
10-89
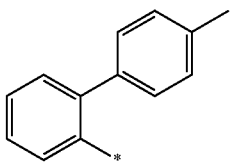
10-90
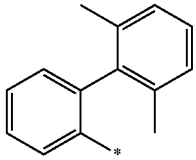
10-91
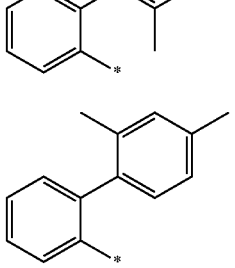
10-92
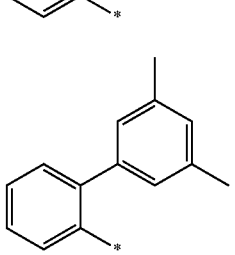
10-93
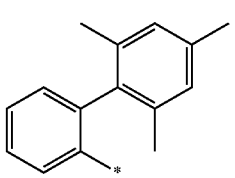
10-94
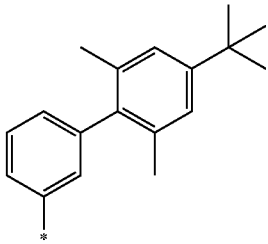
10-95
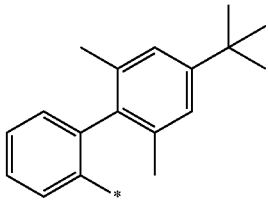
10-96
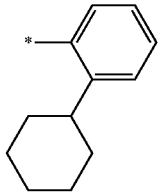

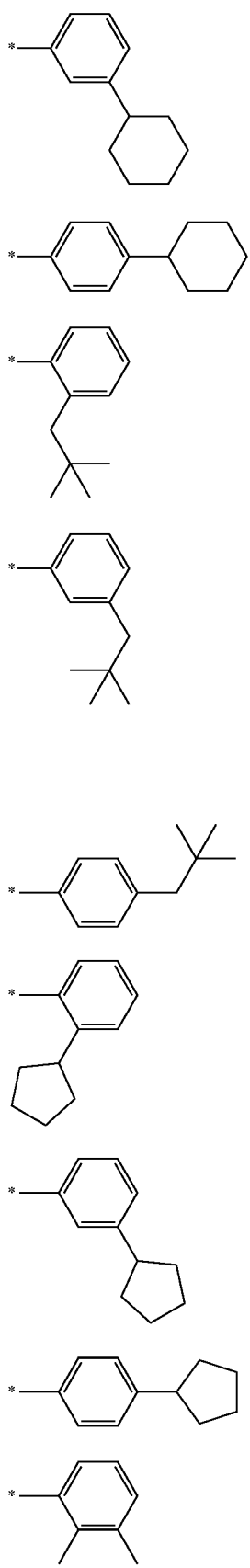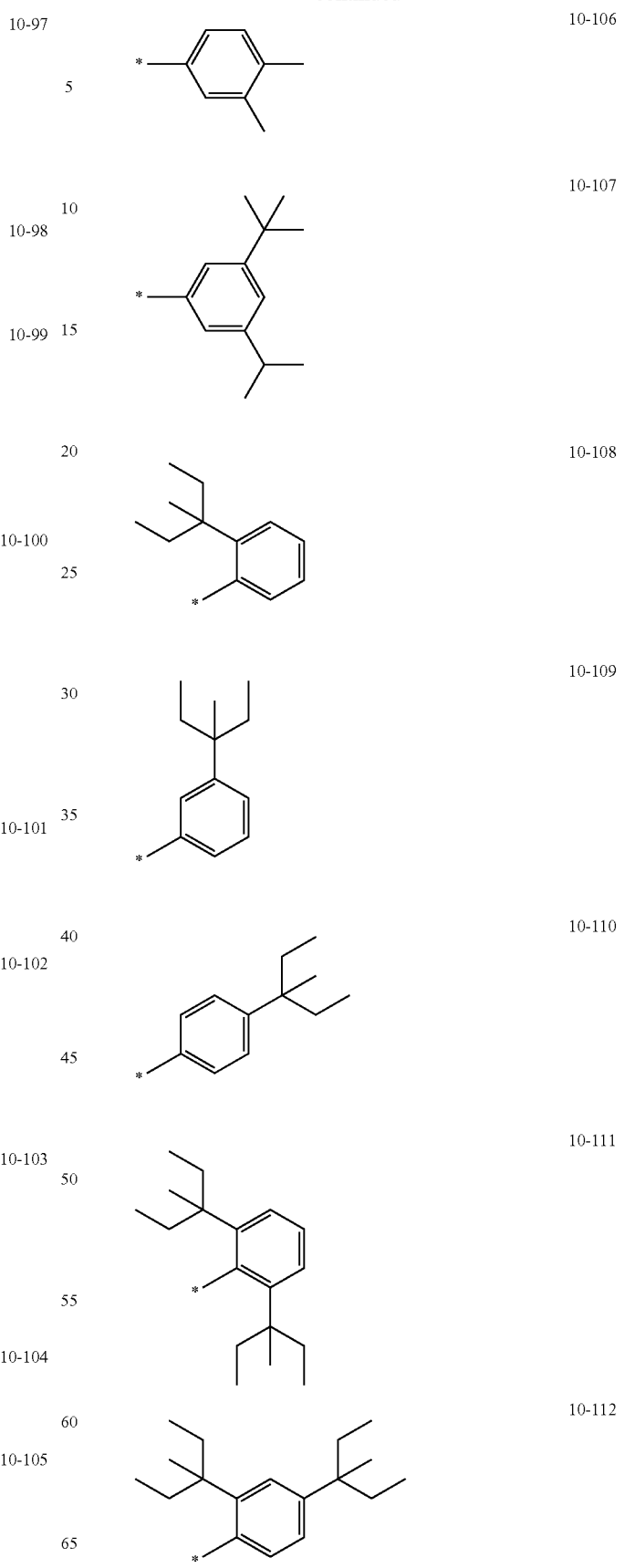

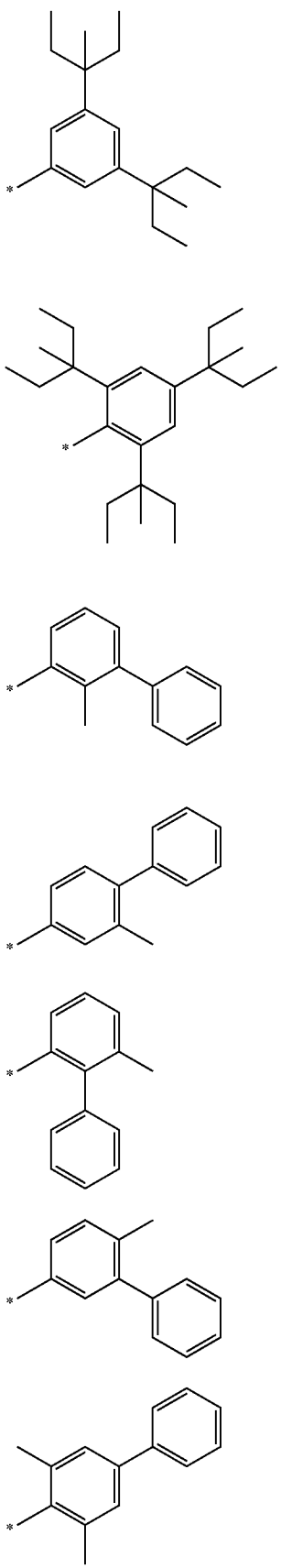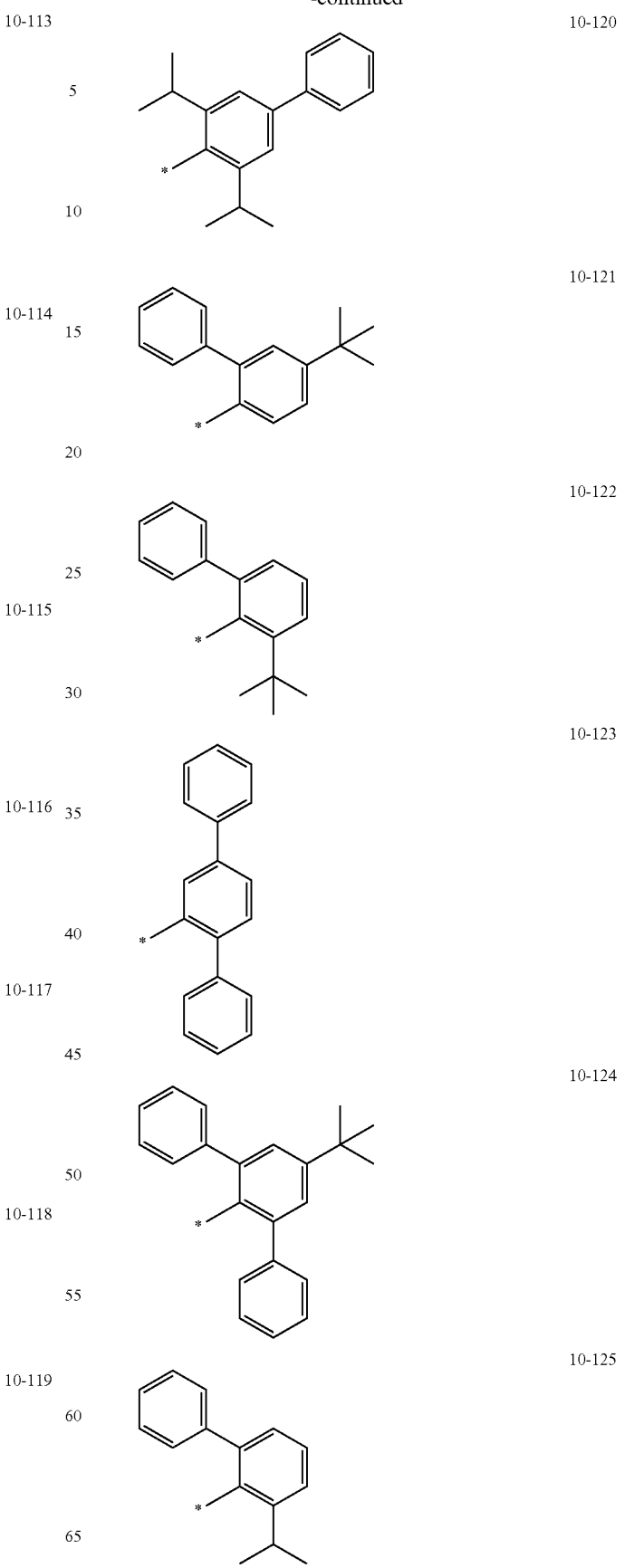

10-126 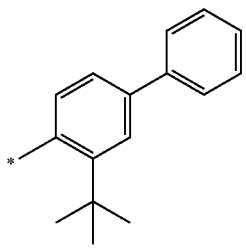
10-127 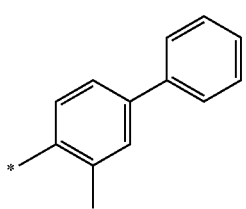
10-128 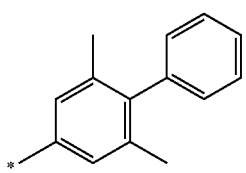
10-129 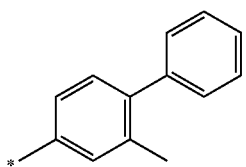
10-201 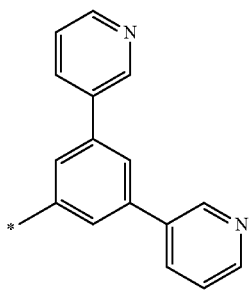
10-202 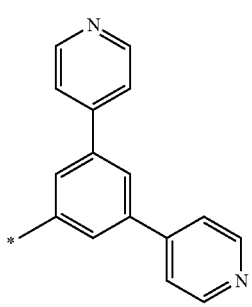
10-203 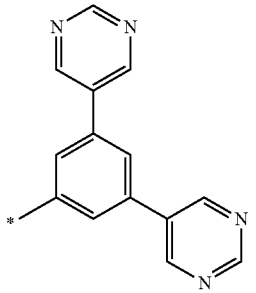
10-204 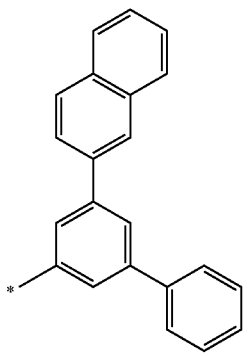
10-205 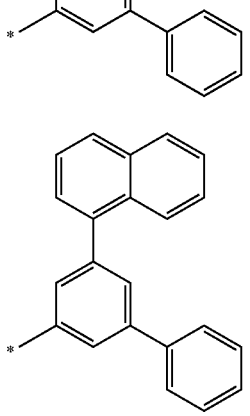
10-206 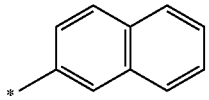
10-207 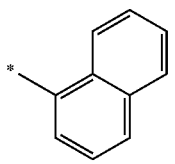
10-208 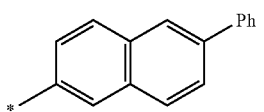
10-209 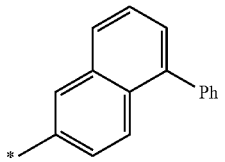

-continued
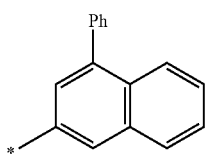
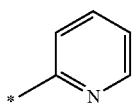
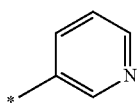
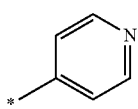
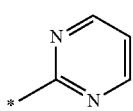
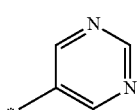
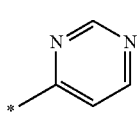
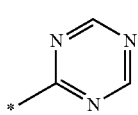
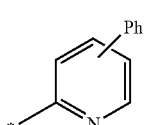
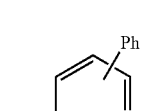
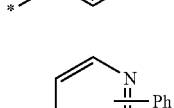
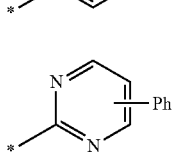
-continued
10-210
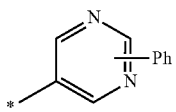
10-211
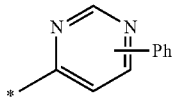
10-212
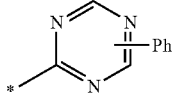
10-213
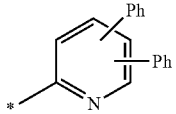
10-214
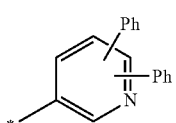
10-215
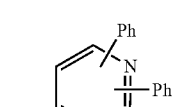
10-216
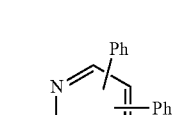
10-217
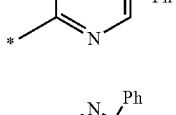
10-218
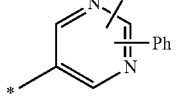
10-219
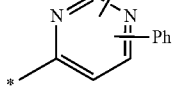
10-220
10-221
10-222
10-223
10-224
10-225
10-226
10-227
10-228
10-229
10-230
10-231
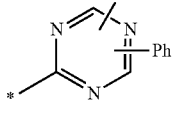
10-232
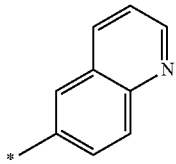

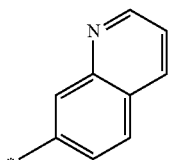
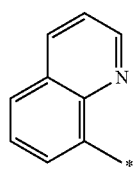
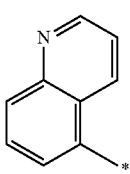
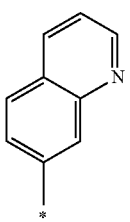
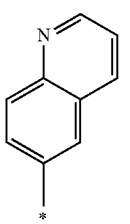
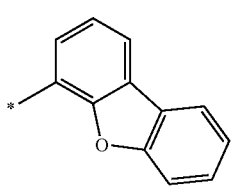
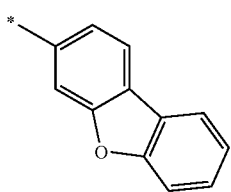
10-233
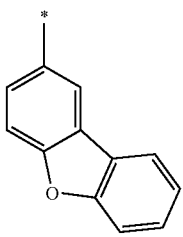
10-234
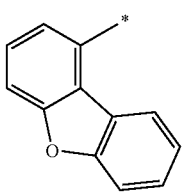
10-235
10-236
10-237
10-238
10-239
10-240
10-241
10-242
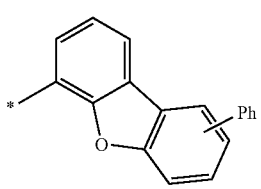
10-243
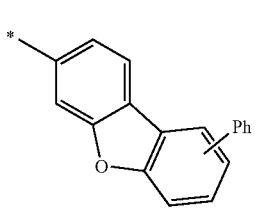
10-244
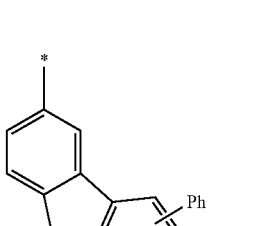
10-245
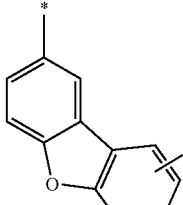
10-246
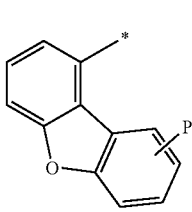
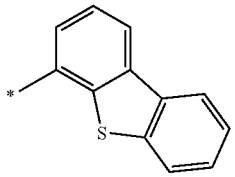

10-247 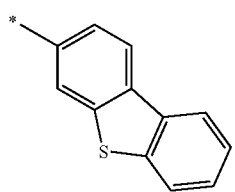
10-248 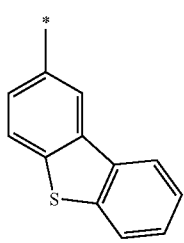
10-249 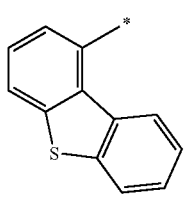
10-250 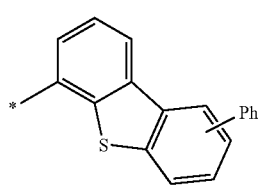
10-251 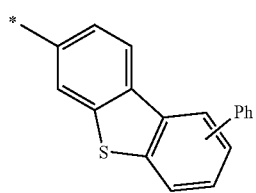
10-252 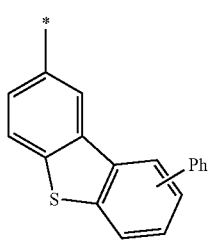
10-253 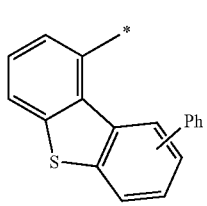
10-254 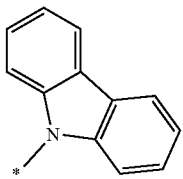
10-255 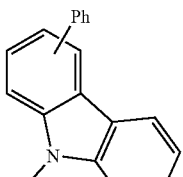
10-256 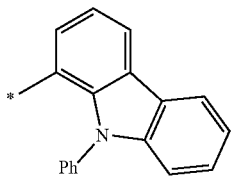
10-257 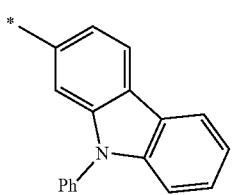
10-258 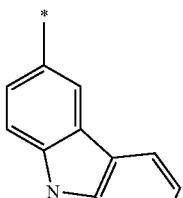
10-259 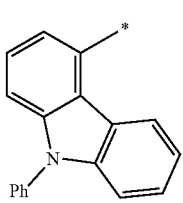
10-260 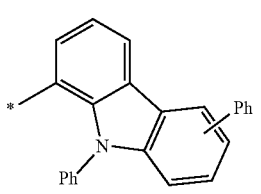
10-261 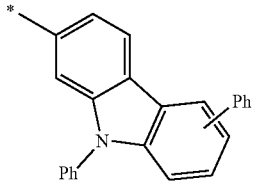

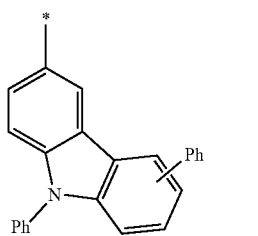
10-262
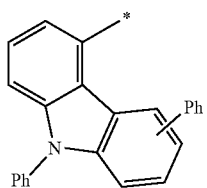
10-263
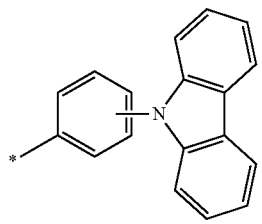
10-264
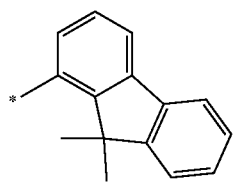
10-265
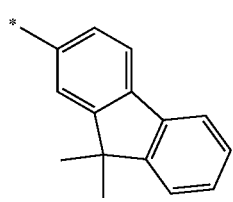
10-266
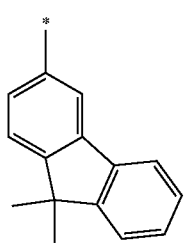
10-267
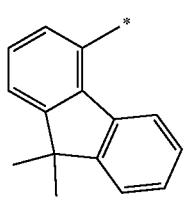
10-268
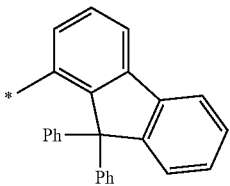
10-269
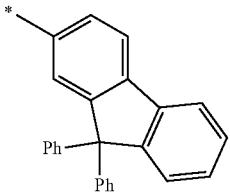
10-270
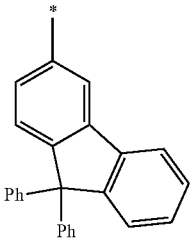
10-271
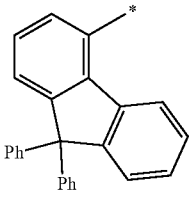
10-272
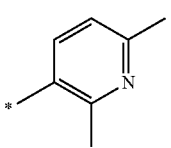
10-273
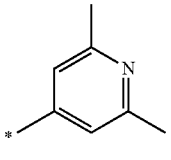
10-274
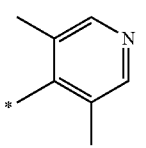
10-275
10-276

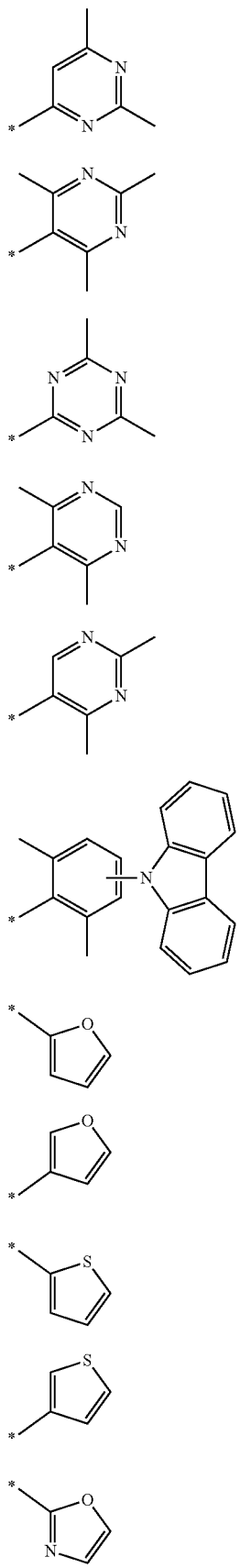
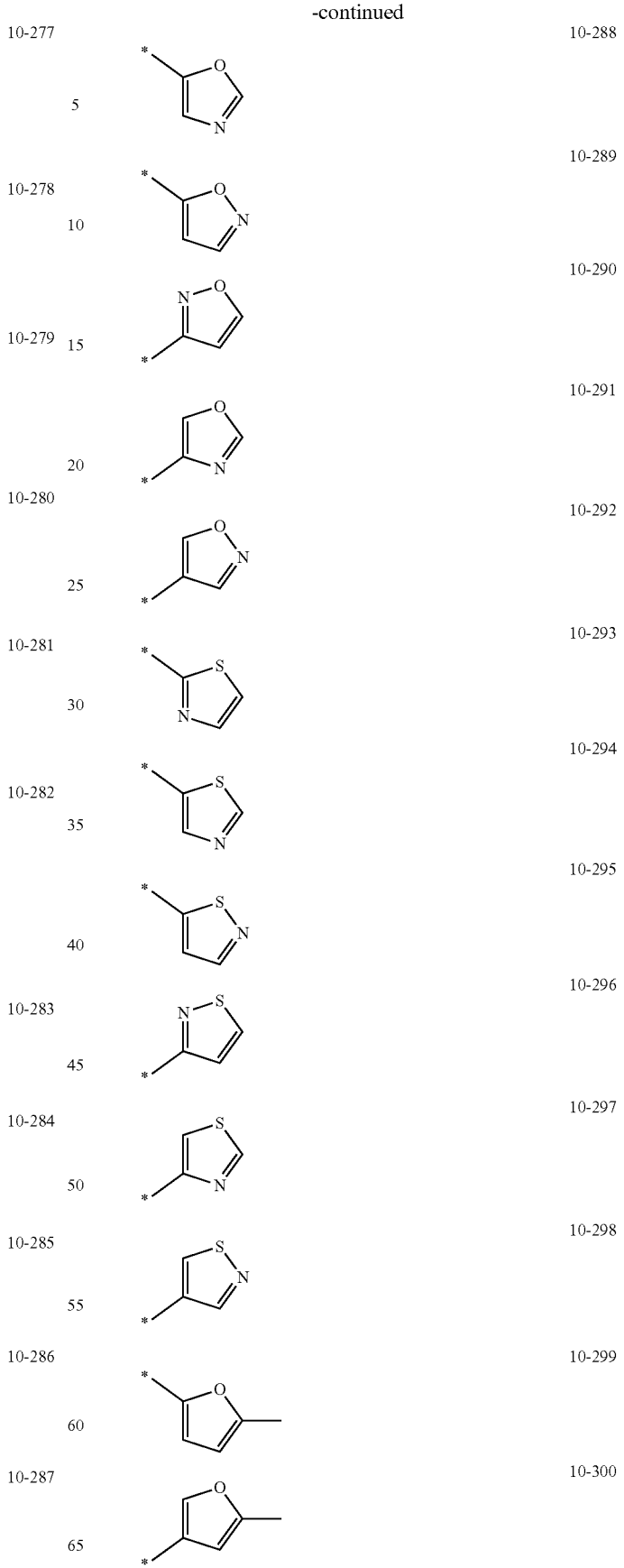

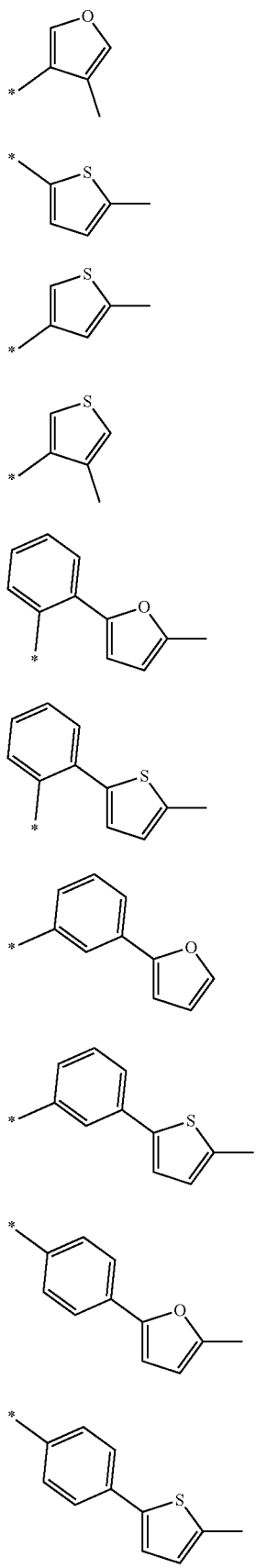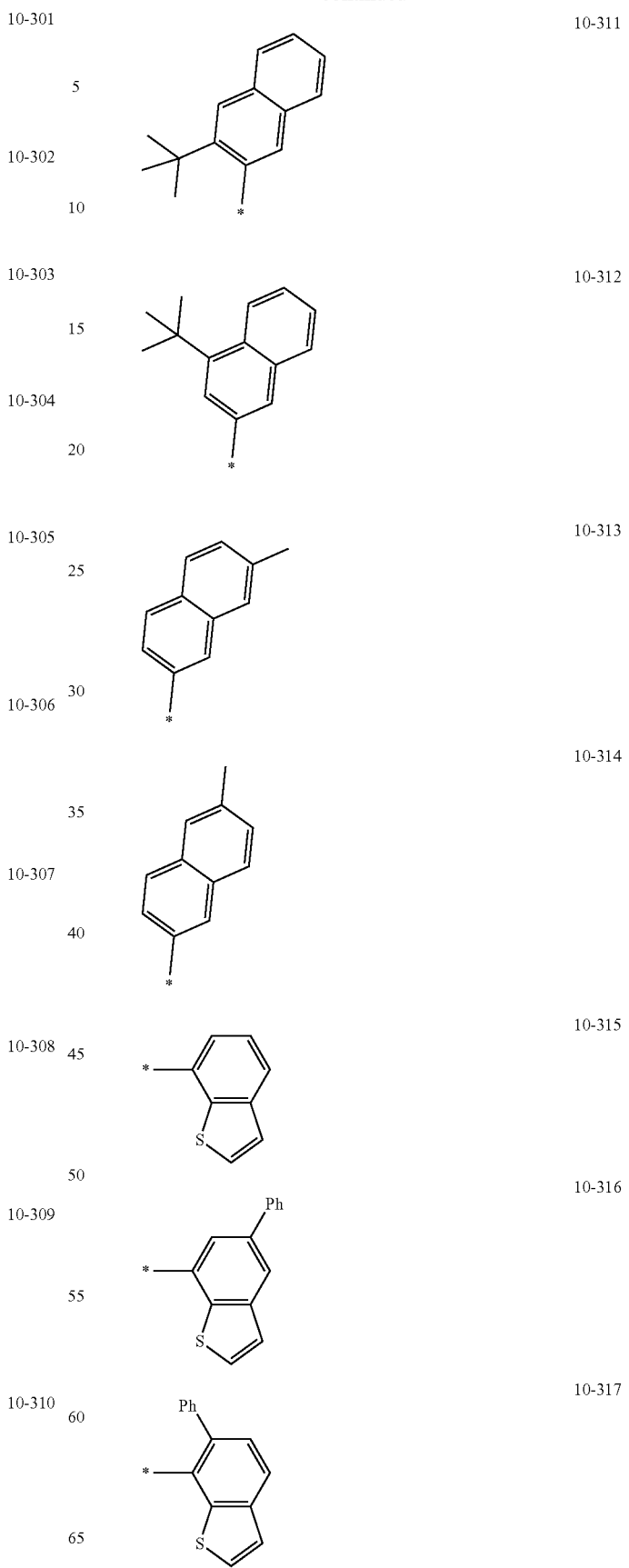

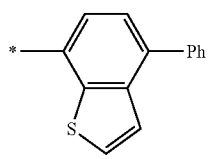
10-318
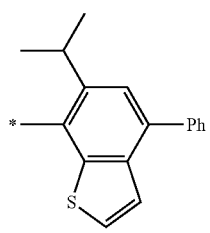
10-319
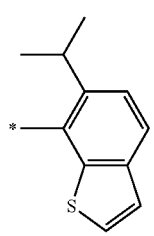
10-320
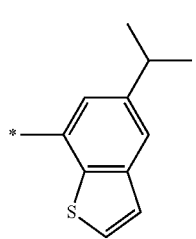
10-321
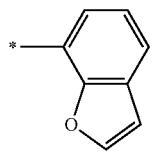
10-322
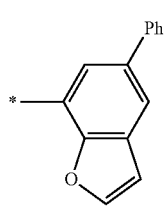
10-323
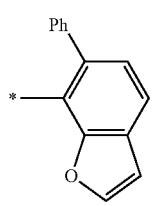
10-324
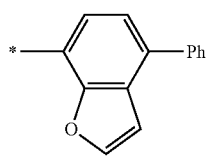
10-325
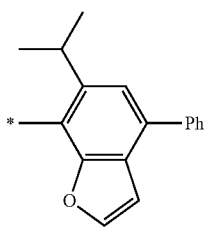
10-326
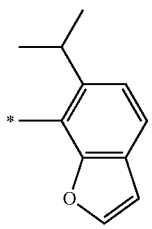
10-327
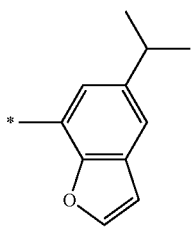
10-328
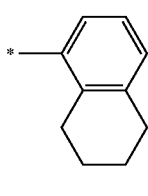
10-329
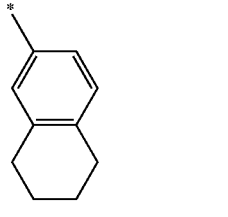
10-330
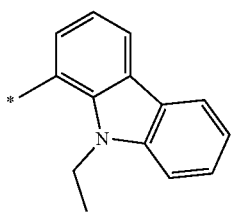
10-331
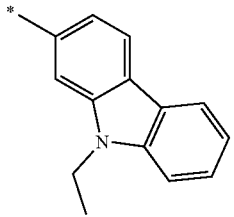
10-332

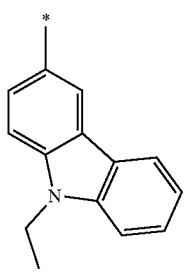
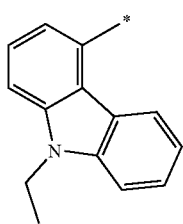
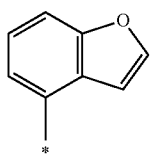
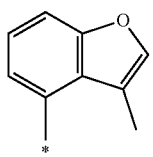
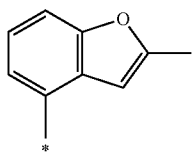
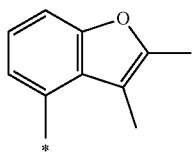
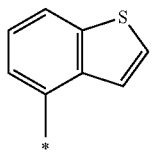
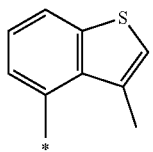
10-333
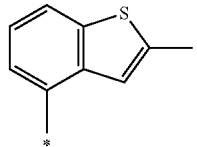
10-334
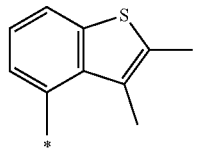
10-335
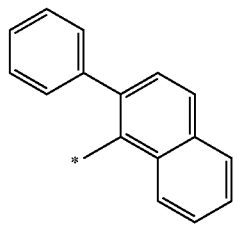
10-336
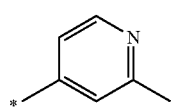
10-337
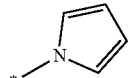
10-338
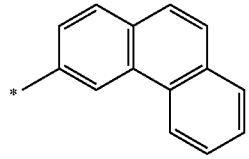
10-339
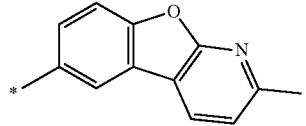
10-340
10-341
10-342
10-343
10-344
10-345
10-346
10-347
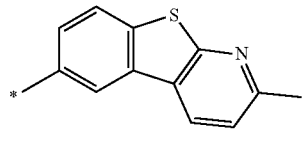
10-348
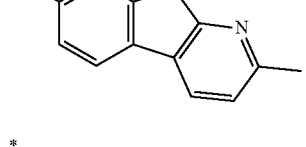
10-349
10-350
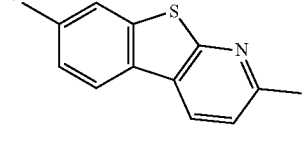

In Formulae 9-1 to 9-39, 9-201 to 9-237, 10-1 to 10-129 and 10-201 to 10-350, * indicates a binding site to an adjacent atom, Ph indicates a phenyl group, TMS indicates a trimethylsilyl group, and TMG indicates a trimethylgermyl group.

The groups represented by Formulae 9-1 to 9-39 in which at least one hydrogen is substituted with deuterium, and the groups represented by Formulae 9-201 to 9-237 in which at least one hydrogen is substituted with deuterium may be, for example, groups represented by Formulae 9-501 to 9-514 and 9-601 to 9-636.

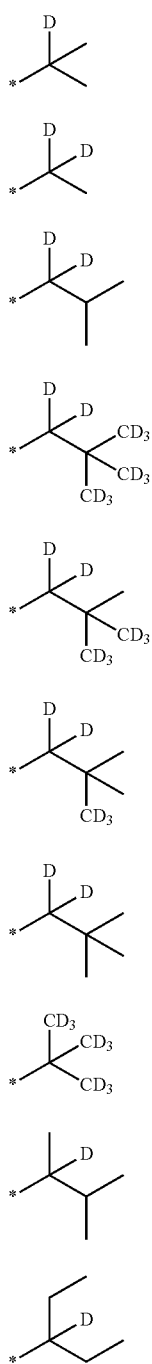

9-501
9-502
9-503
9-504
9-505
9-506
9-507
9-508
9-509
9-510

-continued

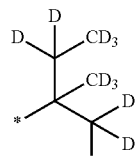
9-5111

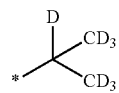
9-512

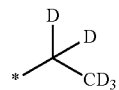
9-513

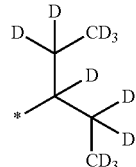
9-514

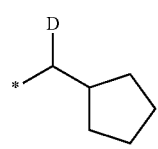
9-601

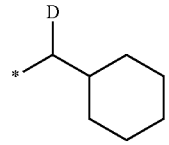
9-602

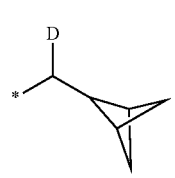
9-603

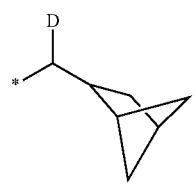
9-604

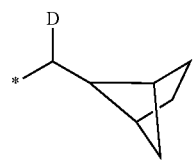
9-605

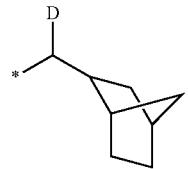
9-606

| | |
|---|---|
| 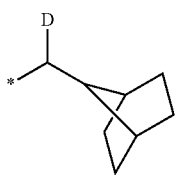 9-607 | 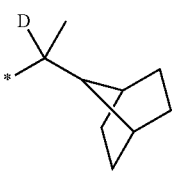 9-616 |
| 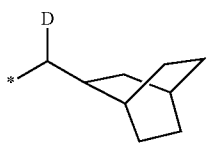 9-608 | 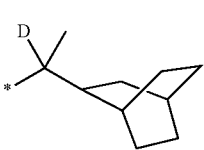 9-617 |
| 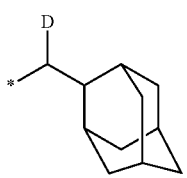 9-609 | 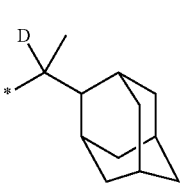 9-618 |
| 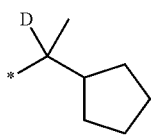 9-610 | 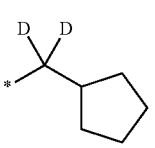 9-619 |
| 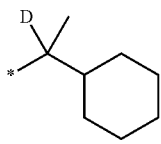 9-611 | 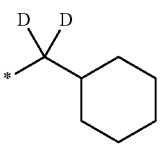 9-620 |
| 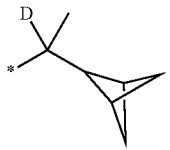 9-612 | 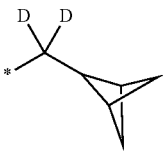 9-621 |
| 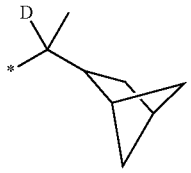 9-613 | 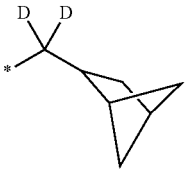 9-622 |
| 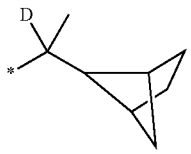 9-614 | 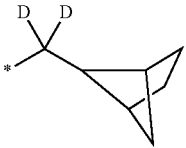 9-623 |
| 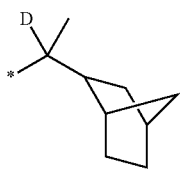 9-615 | 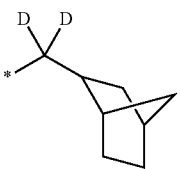 9-624 |

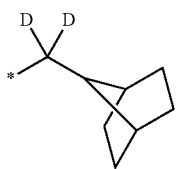
9-625

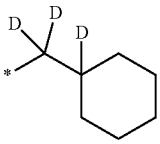
9-635

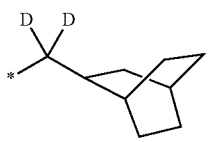
9-626

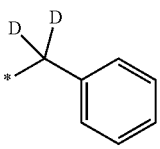
9-636

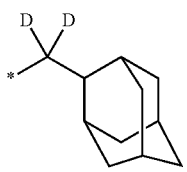
9-627

The groups represented by Formulae 9-1 to 9-39 in which at least one hydrogen is substituted with —F, and the group represented by Formulae 9-201 to 9-236 in which at least one hydrogen is substituted with —F may be, for example, groups represented by Formulae 9-701 to 9-710.

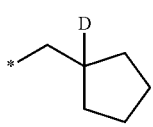
9-628

9-701

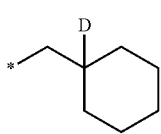
9-629

9-702

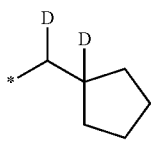
9-630

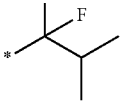
9-703

*—CF₃
9-704

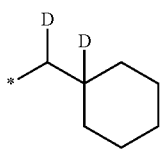
9-631

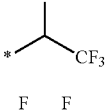
9-705

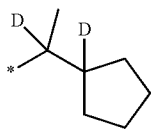
9-632

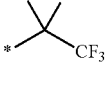
9-706

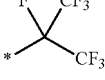
9-707

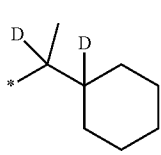
9-633

9-708

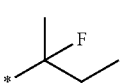
9-709

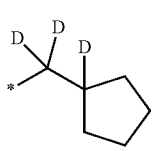
9-634

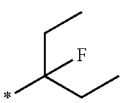
9-710

The group represented by Formulae 10-1 to 10-129 in which at least one hydrogen is substituted with deuterium, and the groups represented by Formulae 10-201 to 10-350 in which at least one hydrogen is substituted with deuterium may be, for examples, groups represented by Formulae 10-501 to 10-553.
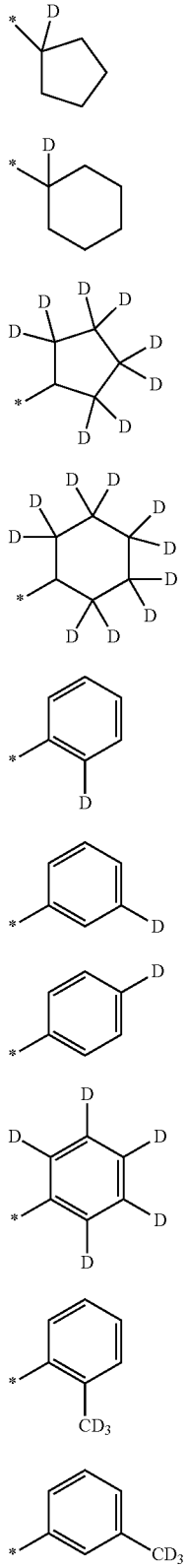
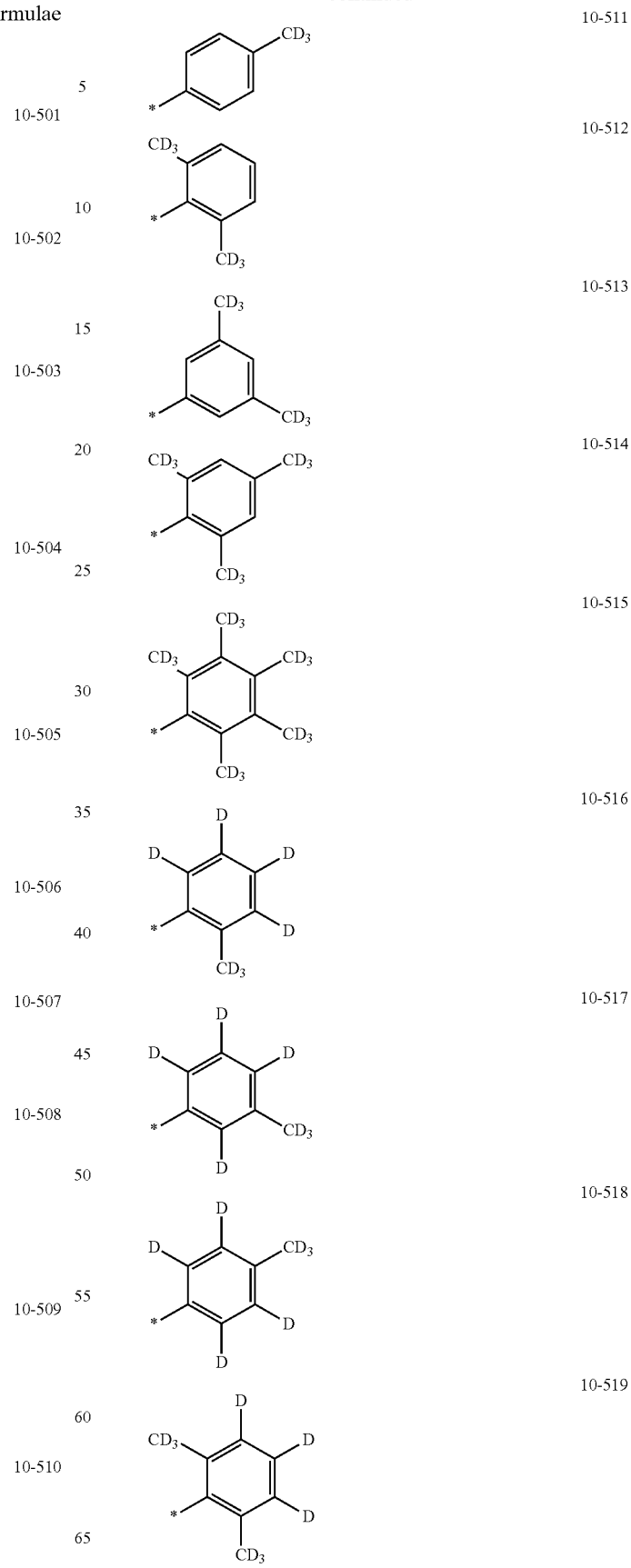

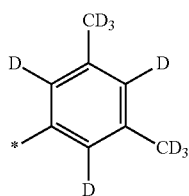
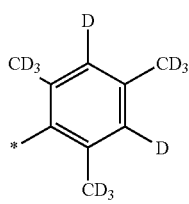
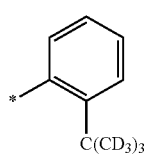
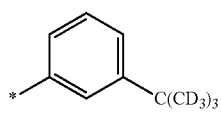
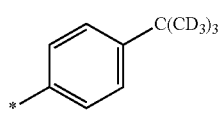
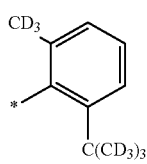
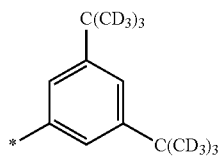
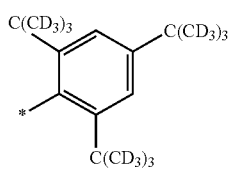
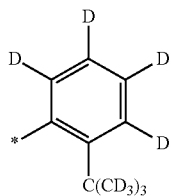
10-520
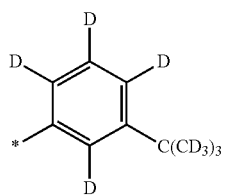
10-521
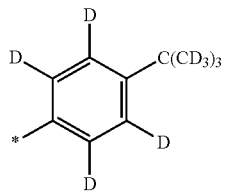
10-522
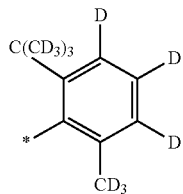
10-523
10-524
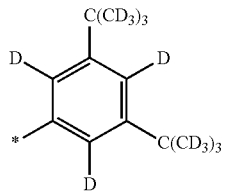
10-525
10-526
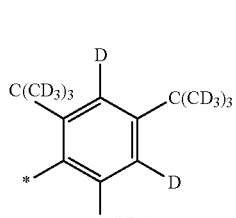
10-527
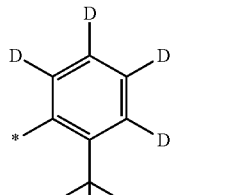
10-528
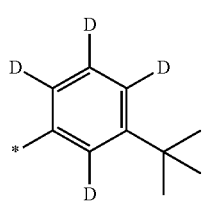
10-529
10-530
10-531
10-532
10-533
10-534
10-535

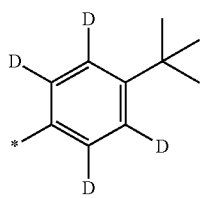
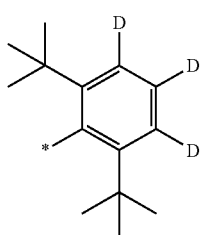
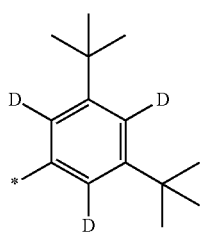
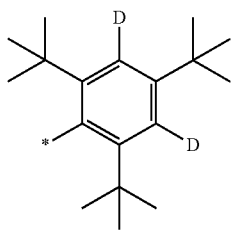
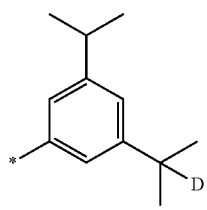
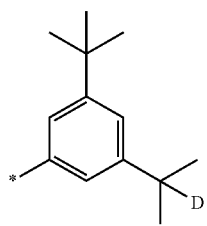
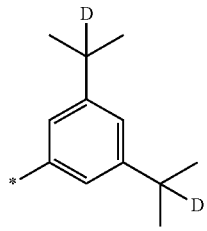
10-536
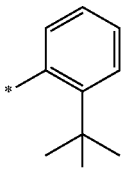
10-537
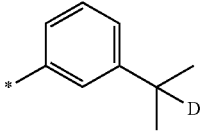
10-538
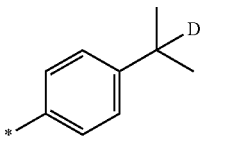
10-540
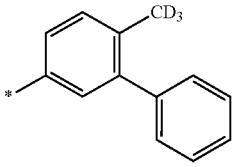
10-541
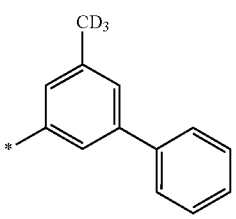
10-542
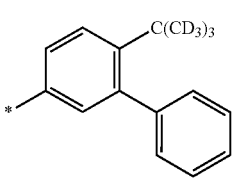
10-543
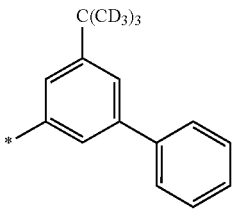
10-544
10-545
10-546
10-547
10-548
10-549
10-550
10-551
10-552

10-553
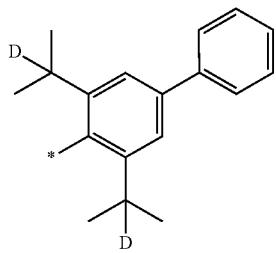
The groups represented by Formulae 10-1 to 10-129 in which at least one hydrogen is substituted with —F, and the groups represented by Formula 10-201 to 10-350 in which at least one hydrogen is substituted with —F may be, for examples, groups represented by Formulae 10-601 to 10-617.
10-601
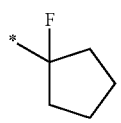
10-602
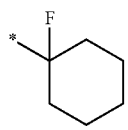
10-603
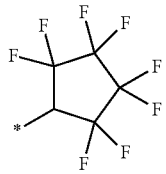
10-604
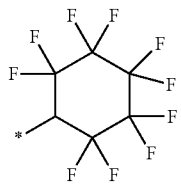
10-605
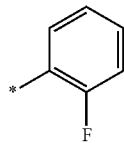
10-606
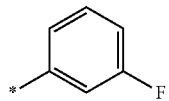
10-607
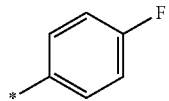
10-608
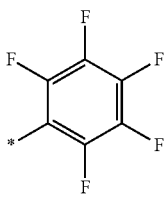
10-609
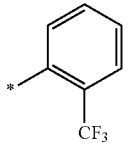
10-610
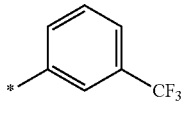
10-611
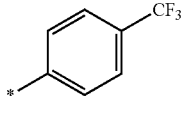
10-612
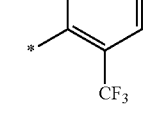
10-613
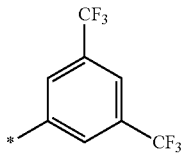
10-614
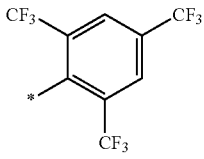
10-615
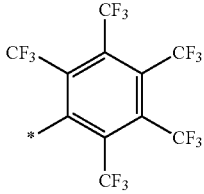
10-616
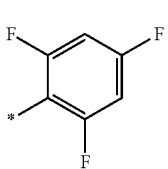

10-617

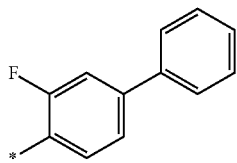

In Formula 1, a1 and a2 indicate the number of $T_1(s)$ and the number of $T_2(S)$, respectively, and may each independently be an integer of 0 to 20, for example, an integer of 0 to 8. When a1 is 2 or greater, two or more $T_1(s)$ may be identical to or different from each other. When a2 is two or grater, two or more $T_2(s)$ may be identical to or different from each other. In Formula 1, the sum of a1 and a2 may be 1 or greater. For example, in Formula 1, a1 may be an integer of 1 to 20, for example, an integer of 1 to 8.

In Formula 1, at least one of $T_1(s)$ in number of a1, at least one of $T_2(s)$ in number of a2, or any combination thereof may include at least one fluoro group (—F).

In one or more embodiments, in Formula 1, $T_1$, $T_2$, and $A_1$ to $A_7$ may each independently be hydrogen, deuterium, —F, a substituted or unsubstituted $C_1$-$C_{20}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted a phenyl group, a substituted or unsubstituted a biphenyl group, a substituted or unsubstituted a terphenyl group, —Si($Q_3$)($Q_4$)($Q_5$), or —Ge($Q_3$)($Q_4$)($Q_5$).

In one or more embodiments, in Formula 1, $T_1$ and $A_1$ to $A_7$ may each independently be:

hydrogen, deuterium, —F, $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with —F, $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof; or —Si($Q_3$)($Q_4$)($Q_5$), or —Ge($Q_3$)($Q_4$)($Q_5$).

In one or more embodiments, in Formula 1, a1 may be an integer of 1 to 20, and at least one of $T_1(s)$ in number of a1 may include at least one —F.

In one or more embodiments, in Formula 1, a1 may be an integer of 1 to 20, and at least one of $T_1(s)$ in number of a1 may each independently be:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof.

In one or more embodiments, in Formula 1, $T_2$ may do not include —F and a cyano group.

In one or more embodiments, in Formula 1, $T_2$ and $A_1$ to $A_7$ may each independently be:

hydrogen, deuterium, $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof; or —Si($Q_3$)($Q_4$)($Q_5$), or —Ge($Q_3$)($Q_4$)($Q_5$).

In Formula 1, 1) two or more of $T_1(s)$ in number of a1 may optionally be linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, 2) two or more of $T_2(s)$ in number of a2 may optionally be linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, 3) $T_1$ and $T_2$ may optionally be linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, 4) two or more of $A_1$ to $A_7$ may optionally be linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$. Here, $R_{1a}$ will be understood with reference to the description of $A_7$ provided above.

In one or more embodiments, in Formula 1, the group represented by

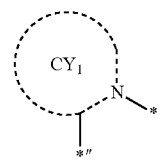

may be one of groups represented by Formulae CY1-1 to CY1-27.

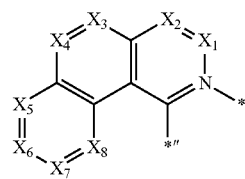

CY1-1

CY1-2
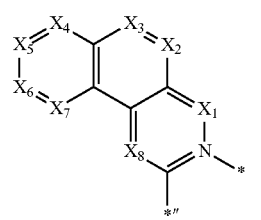
CY1-3
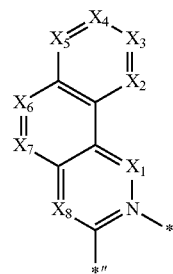
CY1-4
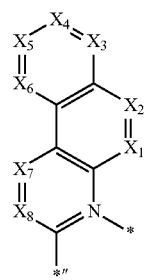
CY1-5
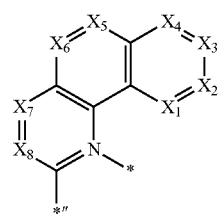
CY1-6
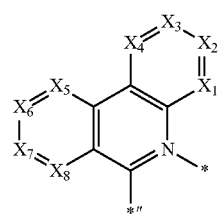
CY1-7
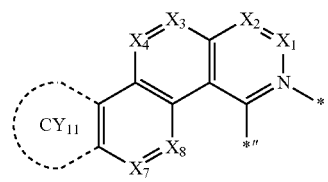
CY1-8
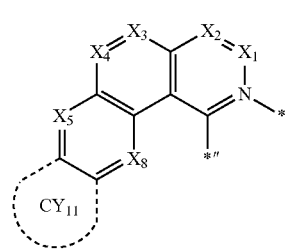
CY1-9
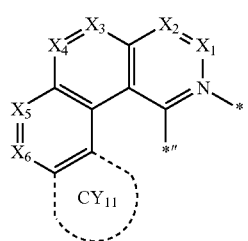
CY1-10
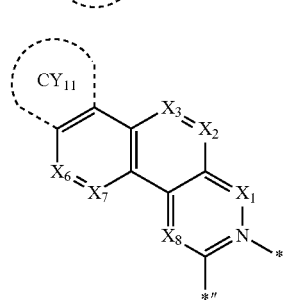
CY1-11
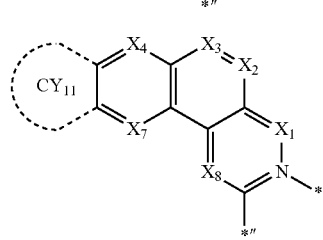
CY1-12
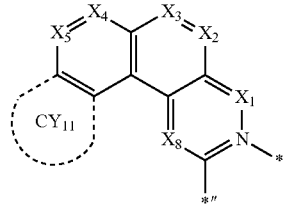
CY1-13
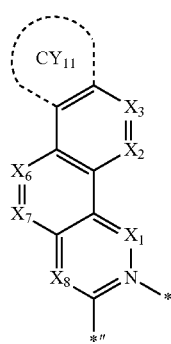
CY1-14
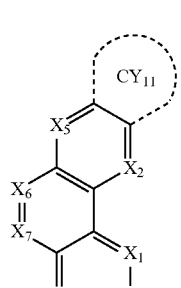

CY1-15
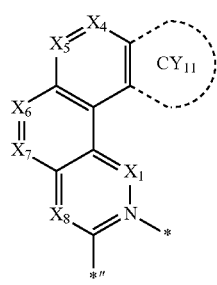
CY1-16
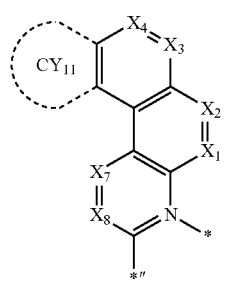
CY1-17
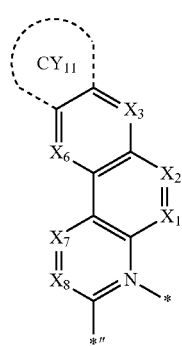
CY1-18
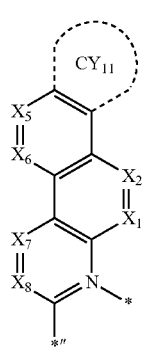
CY1-19
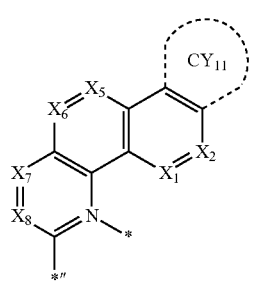
CY1-20
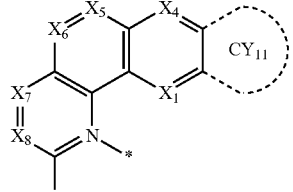
CY1-21
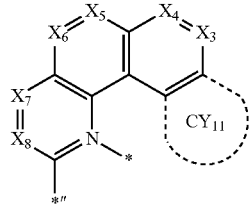
CY1-22
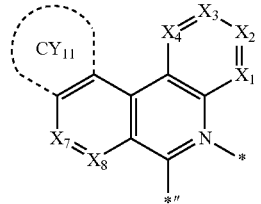
CY1-23
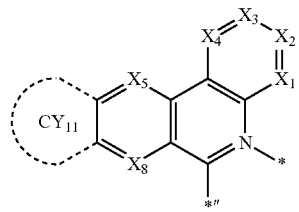
CY1-24
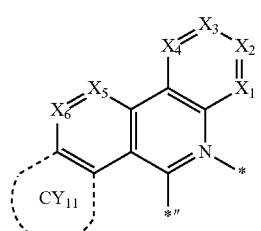
CY1-25
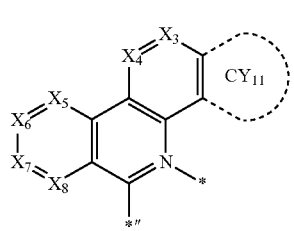
CY1-26
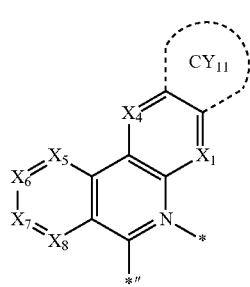

-continued

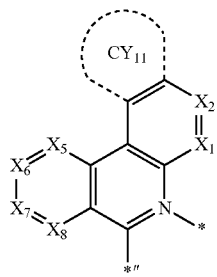
CY1-27

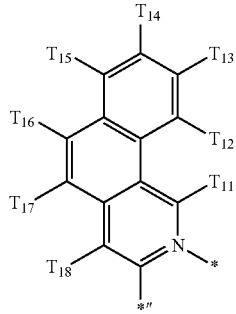
CY1(3)

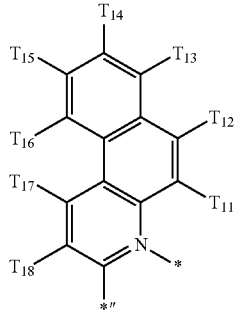
CY1(4)

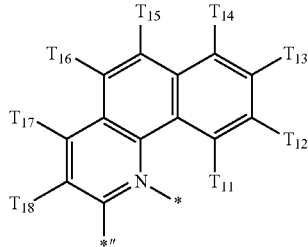
CY1(5)

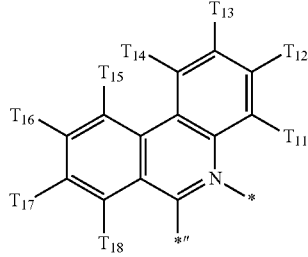
CY1(6)

In Formulae CY1-1 to CY1-27, $X_1$ to $X_8$ may each independently be C or N, wherein the case where all of $X_1$ to $X_8$ are N is excluded, ring CY11 may be a cyclopentane group, a cyclopentene group, a cyclohexane group, a cyclohexene group, an adamantane group, a norbornane group, a norbornene group, a benzene group, a pyridine group, a pyrimidine group, a pyrazine group, a pyridazine group, a naphthalene group, a quinoline group, an isoquinoline group, or a quinoxaline group,

*indicates a binding site to Ir in Formula 1, and

*'' indicates a binding site to ring $CY_2$ in Formula 1.

In one or more embodiments, in Formula 1, the group represented by

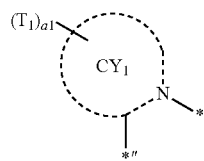

may be one of groups represented by Formulae CY1(1) to CY1(6).

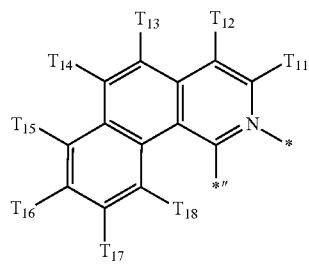
CY1(1)

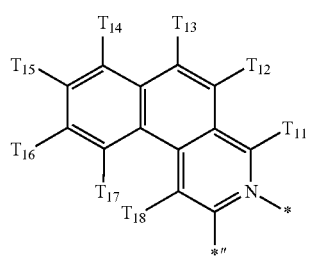
CY1(2)

In Formulae CY1(1) to CY1(6), $T_{11}$ to $T_{18}$ will be understood with reference to the description of $T_1$ herein, provided that at least one of $T_{11}$ to $T_{18}$ may include a fluoro group (—F),

* indicates a binding site to Ir in Formula 1, and

*'' indicates a binding site to ring $CY_2$ in Formula 1.

For example, one, two, or three of $T_{11}$ to $T_{18}$ in Formulae CY1(1) to CY1(6) may include at least one —F, and the remaining $T_{11}$ to $T_{18}$ in Formulae CY1(1) to CY1(6), not including —F, may each independently be:

hydrogen, deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof; or —Si($Q_3$)($Q_4$)($Q_5$), or —Ge($Q_3$)($Q_4$)($Q_5$).

In one or more embodiments, one, two, or three of $T_{11}$ to $T_{18}$ in Formulae CY1(1) to CY1(6) may each independently be:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof.

In one or more embodiments, in Formula 1, the group represented by

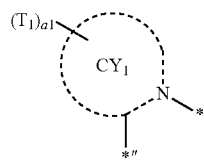

may be one of groups represented by Formulae CY1(1)-1 to CY1(1)-64, Formulae CY1(4)-1 to CY1(4)-16, and Formulae CY1(6)-1 to CY1(6)-16.

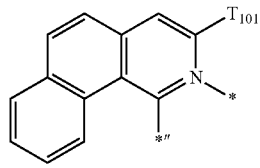
CY1(1)-1

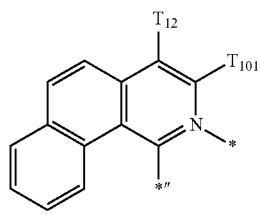
CY1(1)-2

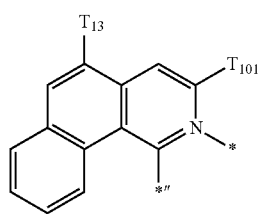
CY1(1)-3

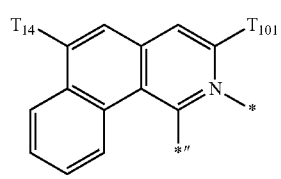
CY1(1)-4

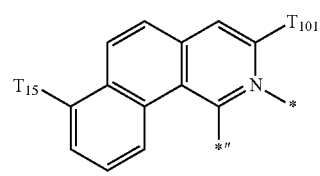
CY1(1)-5

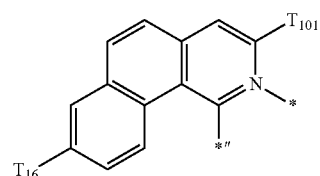
CY1(1)-6

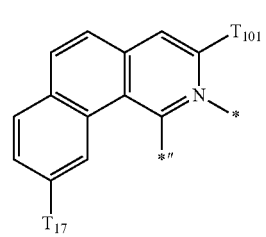
CY1(1)-7

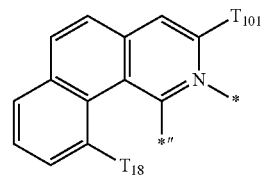
CY1(1)-8

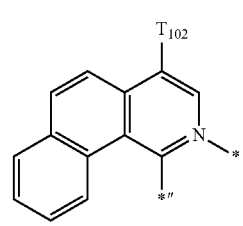
CY1(1)-9

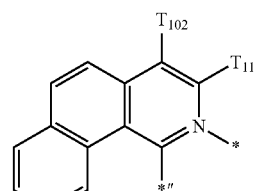
CY1(1)-10

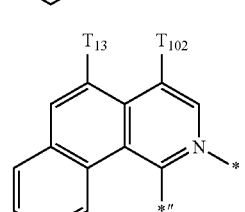
CY1(1)-11

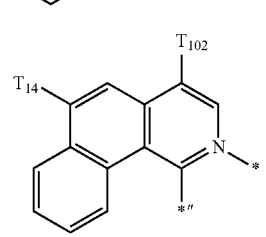
CY1(1)-12

-continued
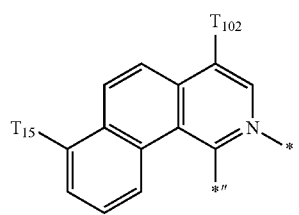
CY1(1)-13
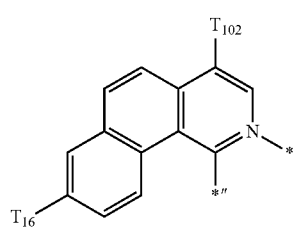
CY1(1)-14
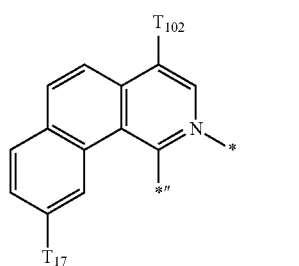
CY1(1)-15
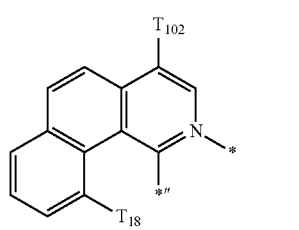
CY1(1)-16
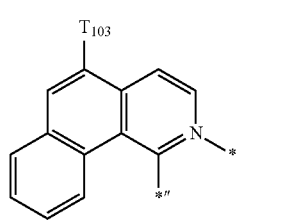
CY1(1)-17
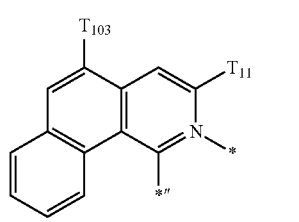
CY1(1)-18
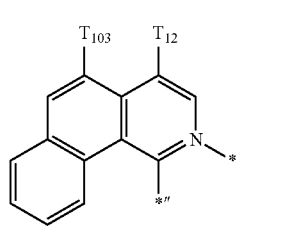
CY1(1)-19
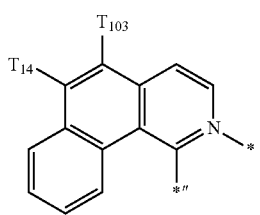
CY1(1)-20
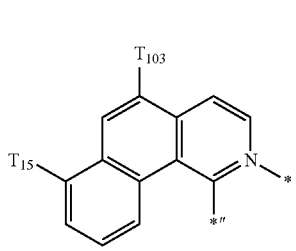
CY1(1)-21
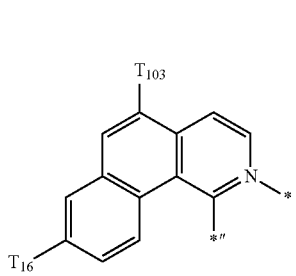
CY1(1)-22
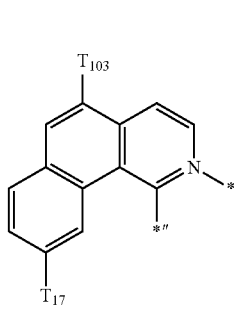
CY1(1)-23
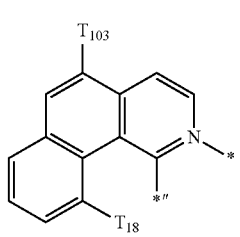
CY1(1)-24
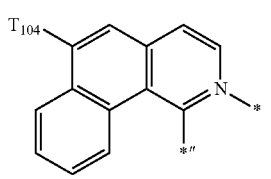
CY1(1)-25
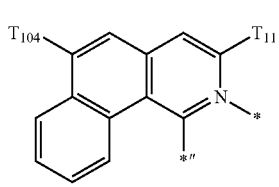
CY1(1)-26

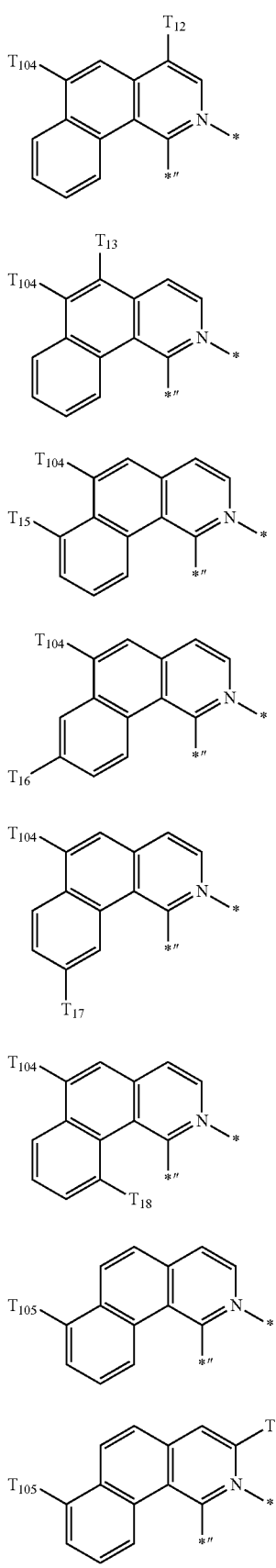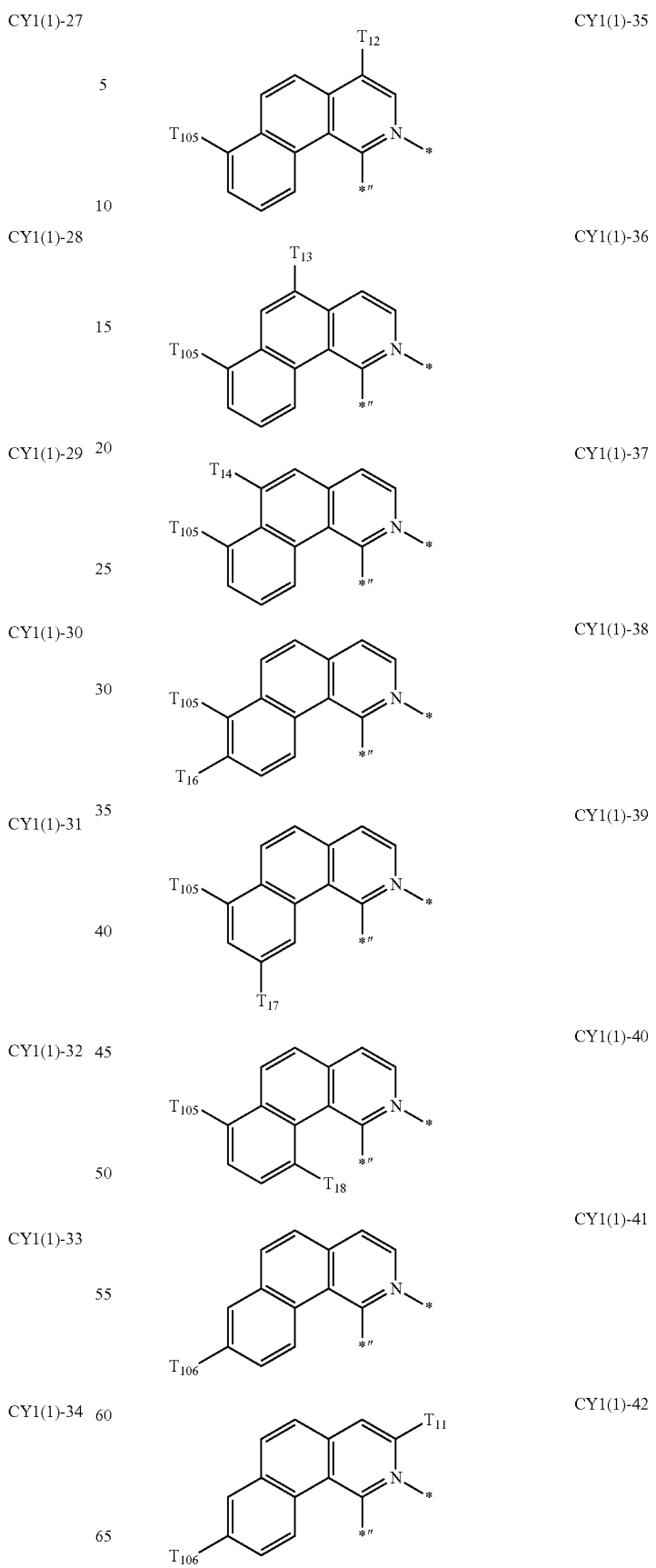

CY1(1)-43
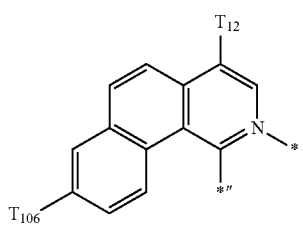
CY1(1)-44
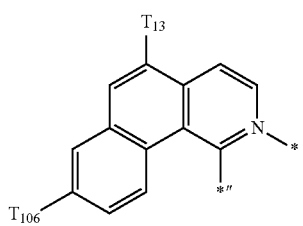
CY1(1)-45
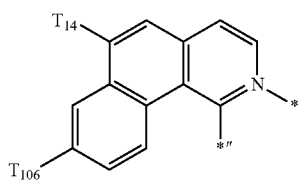
CY1(1)-46
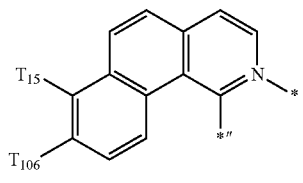
CY1(1)-47
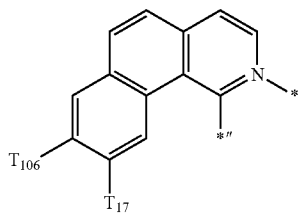
CY1(1)-48
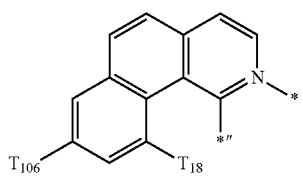
CY1(1)-49
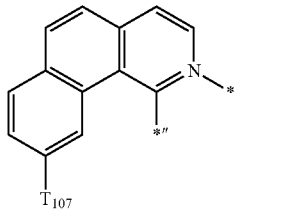
CY1(1)-50
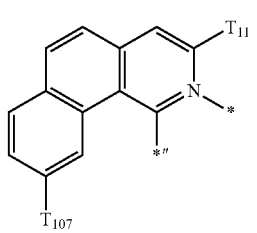
CY1(1)-51
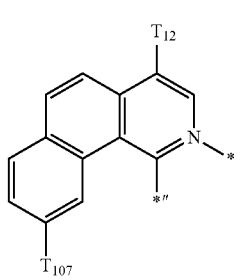
CY1(1)-52
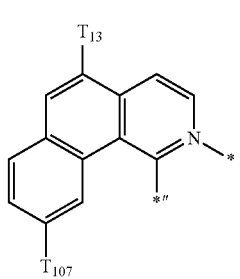
CY1(1)-53
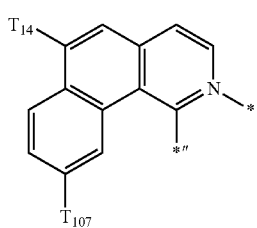
CY1(1)-54
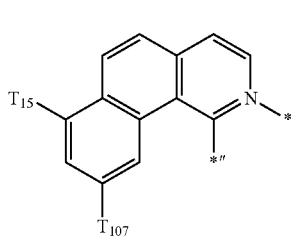
CY1(1)-55
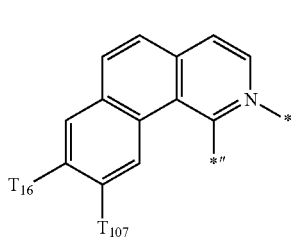

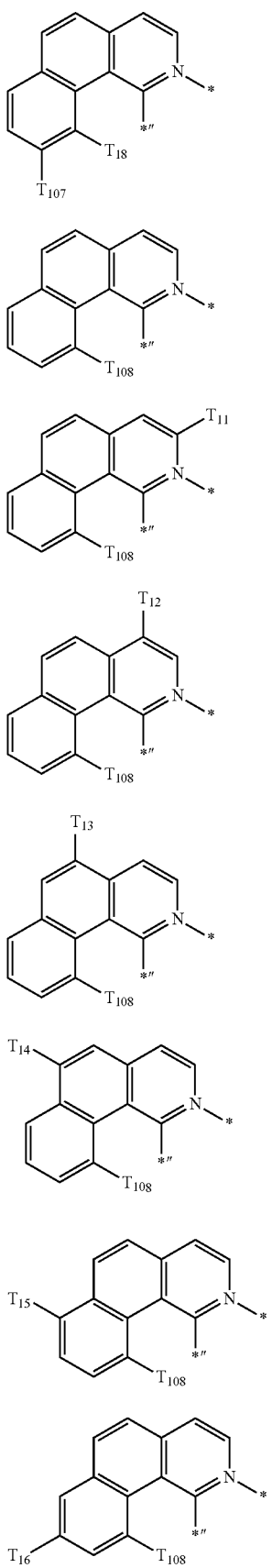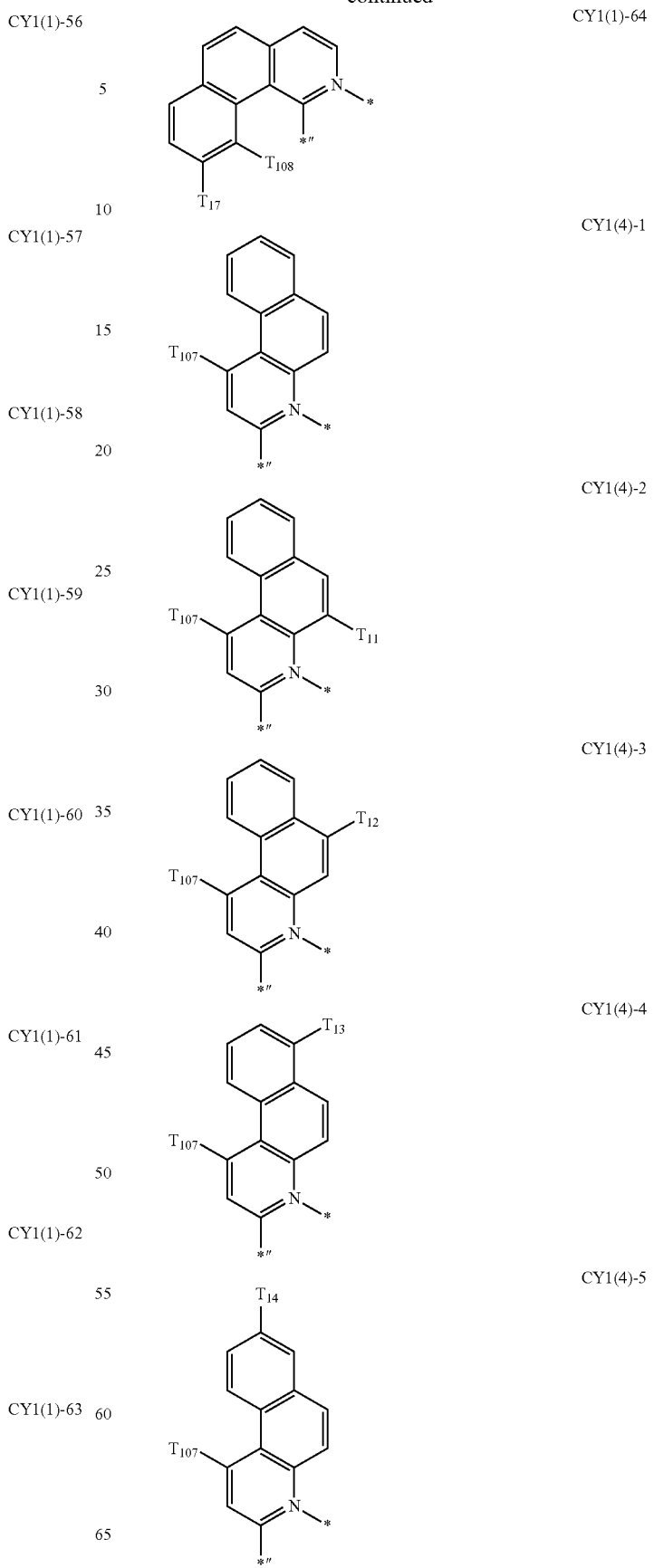

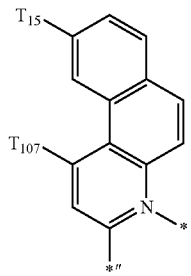 CY1(4)-6
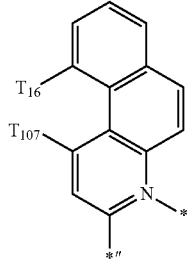 CY1(4)-7
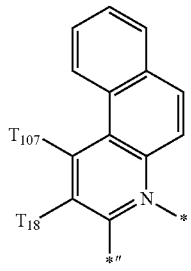 CY1(4)-8
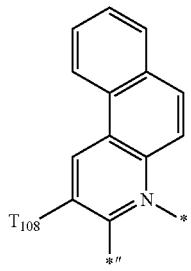 CY1(4)-9
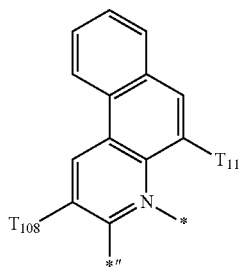 CY1(4)-10
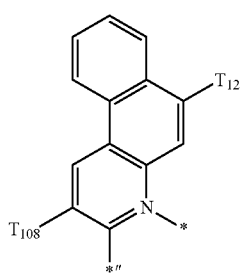 CY1(4)-11
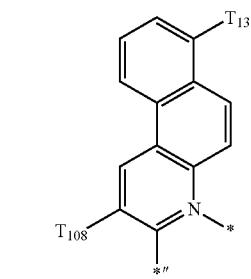 CY1(4)-12
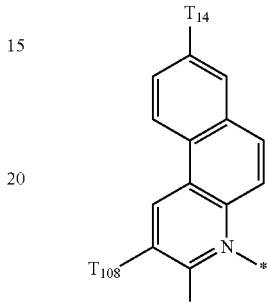 CY1(4)-13
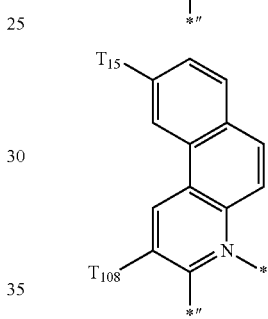 CY1(4)-14
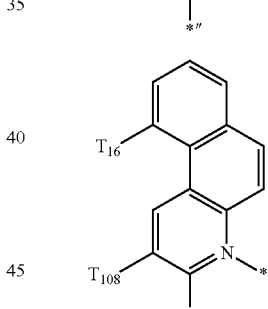 CY1(4)-15
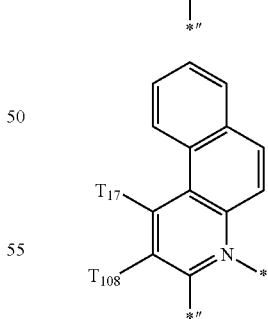 CY1(4)-16
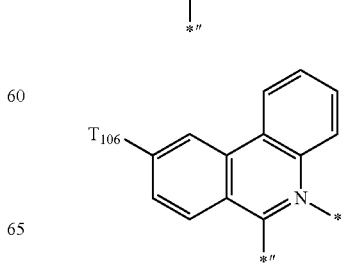 CY1(6)-1

-continued
CY1(6)-2
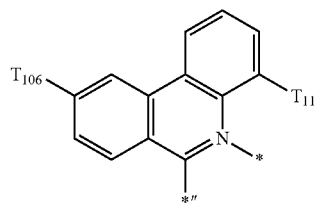
CY1(6)-3
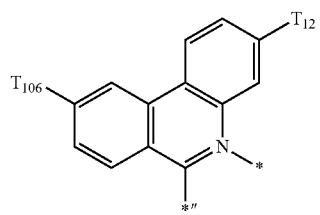
CY1(6)-4
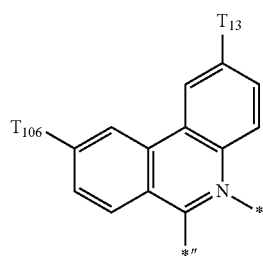
CY1(6)-5
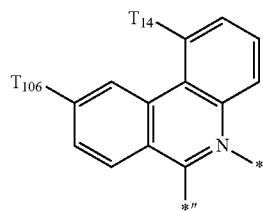
CY1(6)-6
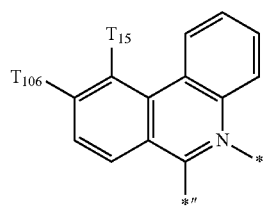
CY1(6)-7
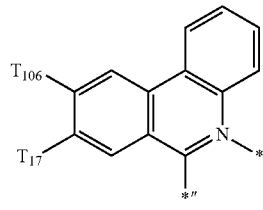
CY1(6)-8
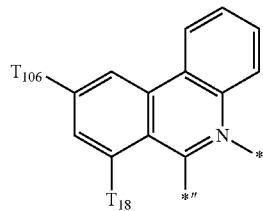
CY1(6)-9
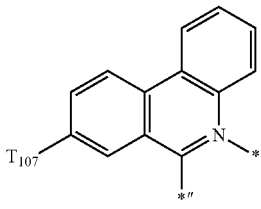
CY1(6)-10
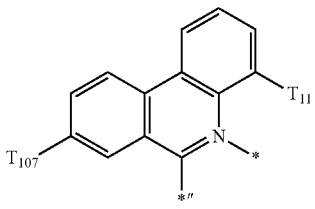
CY1(6)-11
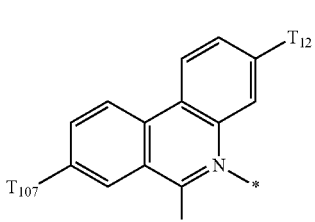
CY1(6)-12
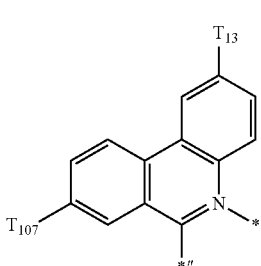
CY1(6)-13
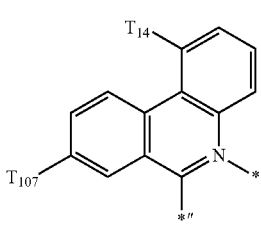
CY1(6)-14
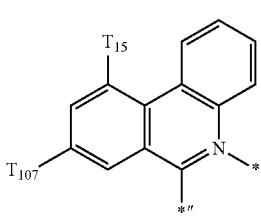
CY1(6)-15
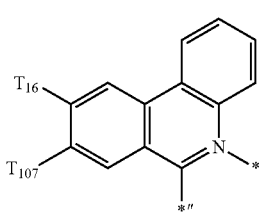

-continued

CY1(6)-16

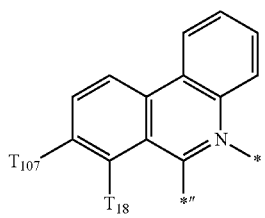

In Formulae CY1(1)-1 to CY1(1)-64, Formulae CY1(4)-1 to CY1(4)-16, and Formulae CY1(6)-1 to CY1(6)-16, $T_{11}$ to $T_{18}$ will be understood with reference to the description of $T_1$ herein, provided that each of $T_{11}$ to $T_{18}$ is not hydrogen, $T_{101}$ to $T_{108}$ may each include at least one fluoro group (—F), \* indicates a binding site to Ir in Formula 1, and \*′′′ indicates a binding site to ring $CY_2$ in Formula 1.

For example, in Formulae CY1(1)-1 to CY1(1)-64, Formulae CY1(4)-1 to CY1(4)-16, and Formulae CY1(6)-1 to CY1(6)-16, $T_{11}$ to $T_{18}$ may each independently be:

deuterium, a $C_1$-$C_{20}$ alkyl group, a $C_3$-$C_{10}$ cycloalkyl group, a $C_1$-$C_1$ heterocycloalkyl group, a phenyl group, a biphenyl group, or a terphenyl group;

a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof; or —Si($Q_3$)($Q_4$)($Q_5$), or —Ge($Q_3$)($Q_4$)($Q_5$).

In one or more embodiments, in Formulae CY1(1)-1 to CY1(1)-64, Formulae CY1(4)-1 to CY1(4)-16, and Formulae CY1(6)-1 to CY1(6)-16, $T_{101}$ to $T_{108}$ may each independently be:

—F; or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof.

In one or more embodiments, in Formula 1, the group represented by

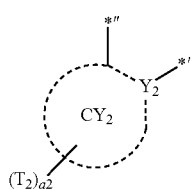

may be one of groups represented by Formulae CY2-1 to CY2-31.

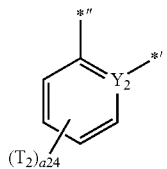
CY2-1

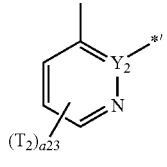
CY2-2

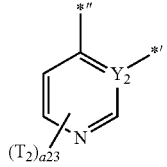
CY2-3

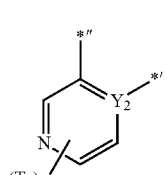
CY2-4

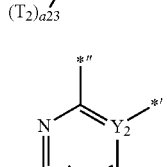
CY2-5

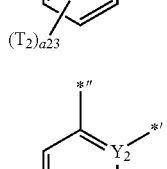
CY2-6

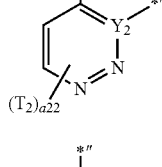
CY2-7

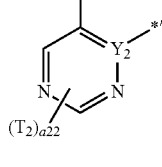
CY2-8

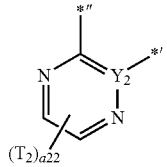
CY2-9

CY2-10 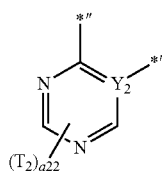
CY2-11 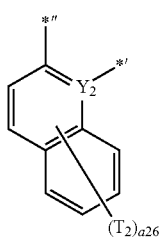
CY2-12 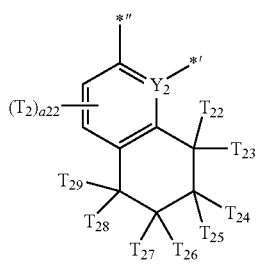
CY2-13 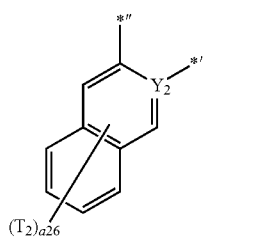
CY2-14 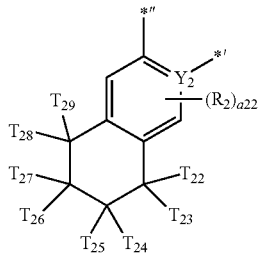
CY2-16 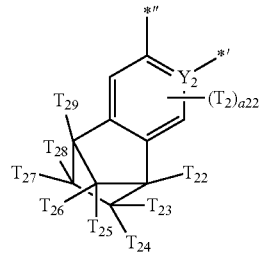
CY2-17 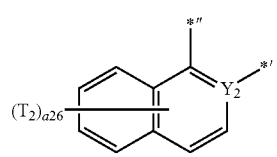
CY2-18 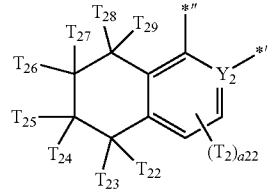
CY2-19 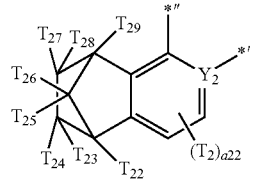
CY2-20 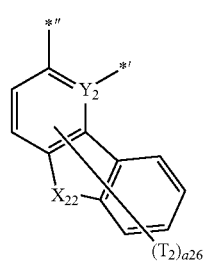
CY2-15
CY2-21 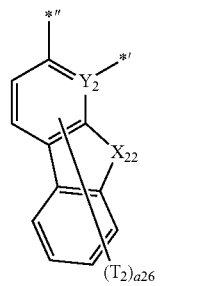

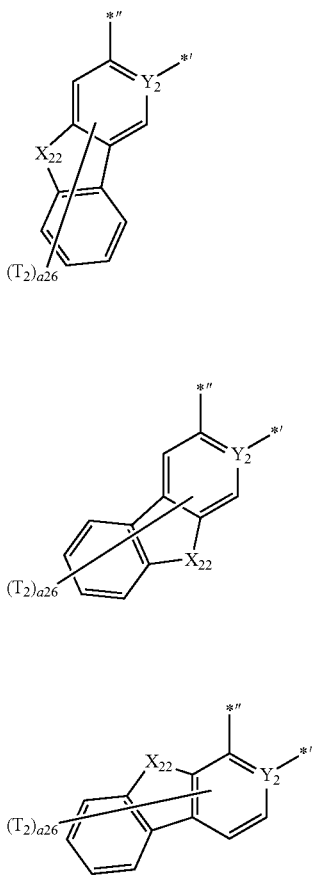

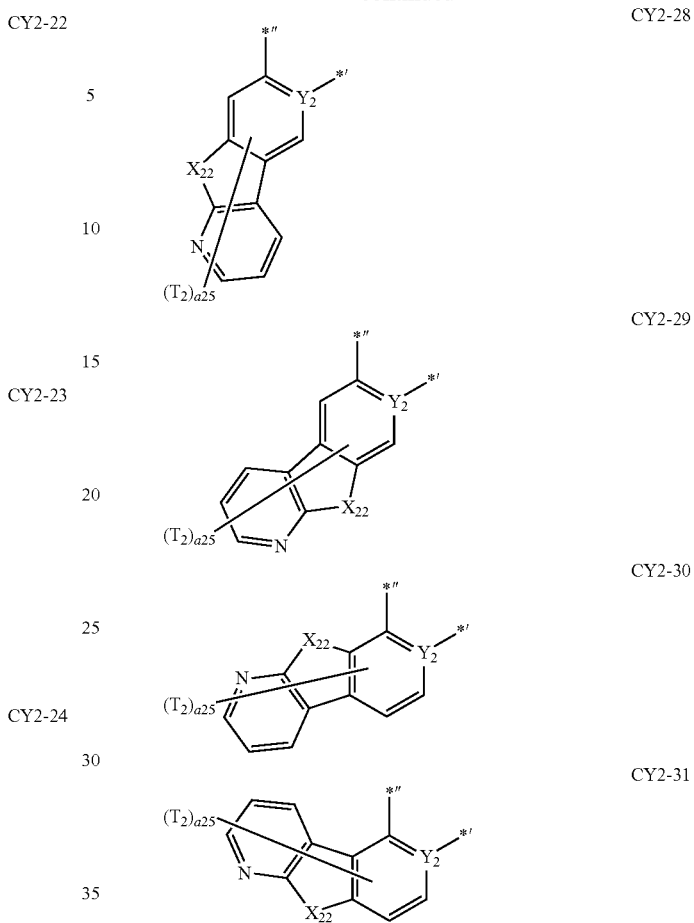

In Formulae CY2-1 to CY2-31,

Y$_2$ and T$_2$ will be understood with reference to the descriptions thereof in the present specification, X$_{22}$ may be C(T$_{28}$)(T$_{29}$), N(T$_{28}$), O, S, or Si(T$_{28}$)(T$_{29}$), T$_{22}$ to T$_{29}$ will be understood with reference to the description of T$_2$ in the present specification, a26 may be an integer of 0 to 6, a25 may be an integer of 0 to 5, a24 may be an integer of 0 to 4, a23 may be an integer of 0 to 3, a22 may be an integer of 0 to 2,

*″ indicates a binding site to ring CY$_1$ in Formula 1, and

*′ indicates a binding site to Ir in Formula 1.

In one or more embodiments, in Formula 1, the group represented by may be one of groups represented by Formulae CY2(1) to CY2(68).

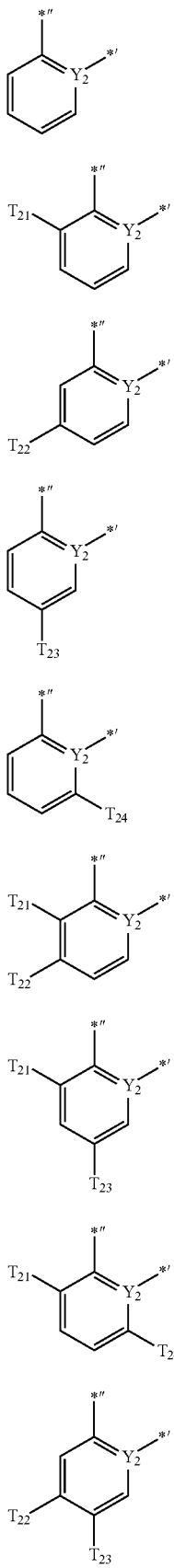
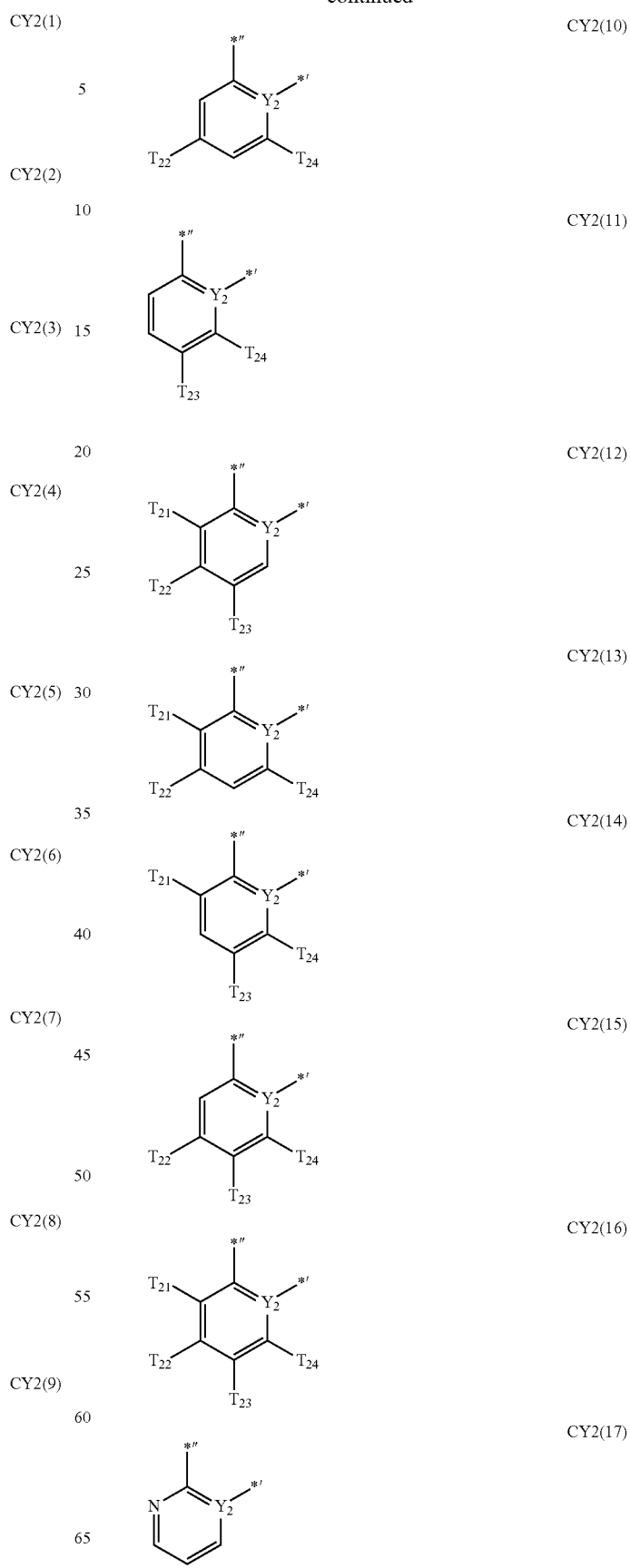

-continued
CY2(18)
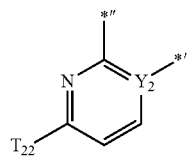
CY2(19)
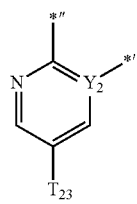
CY2(20)
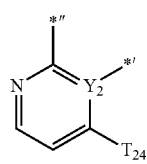
CY2(21)
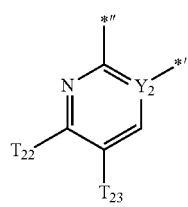
CY2(22)
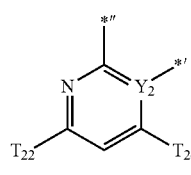
CY2(23)
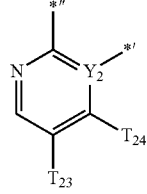
CY2(24)
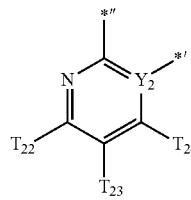
CY2(25)
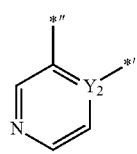
CY2(26)
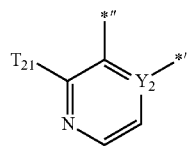
-continued
CY2(27)
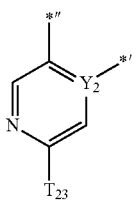
CY2(28)
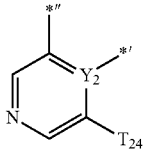
CY2(29)
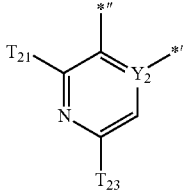
CY2(30)
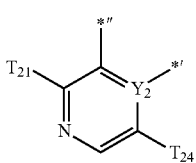
CY2(31)
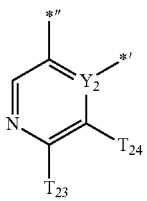
CY2(32)
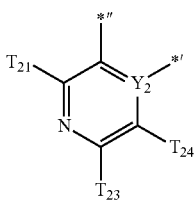
CY2(33)
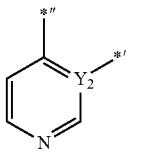
CY2(34)
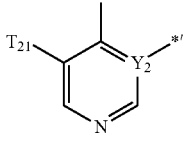

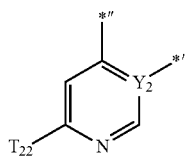 CY2(35)
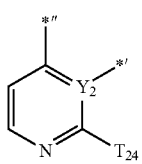 CY2(36)
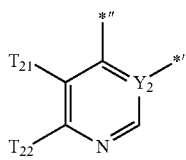 CY2(37)
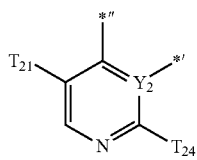 CY2(38)
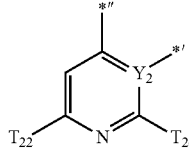 CY2(39)
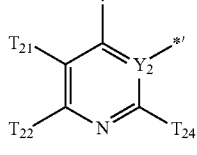 CY2(40)
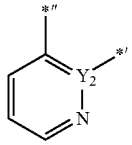 CY2(41)
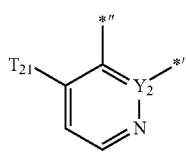 CY2(42)
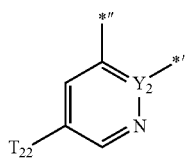 CY2(43)
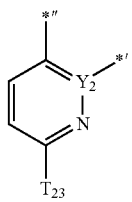 CY2(44)
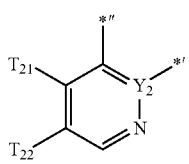 CY2(45)
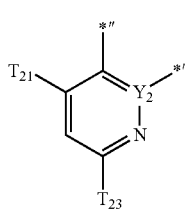 CY2(46)
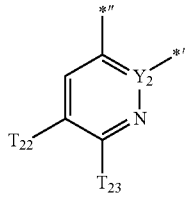 CY2(47)
CY2(48)
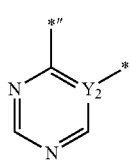 CY2(49)
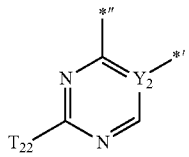 CY2(50)
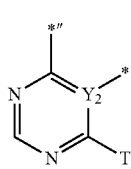 CY2(51)

CY2(52) 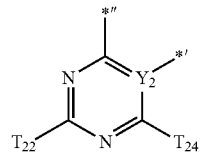
CY2(53) 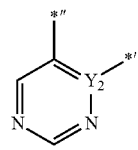
CY2(54) 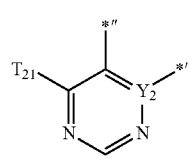
CY2(55) 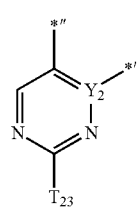
CY2(56) 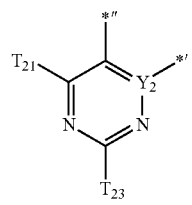
CY2(57) 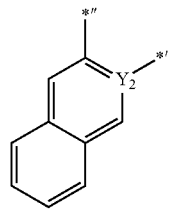
CY2(58) 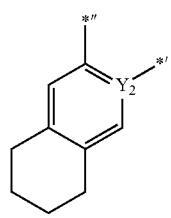
CY2(59) 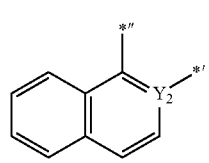
CY2(60) 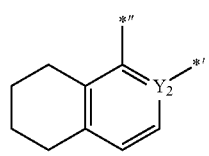
CY2(61) 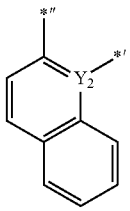
CY2(62) 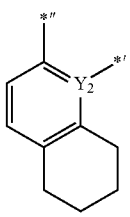
CY2(63) 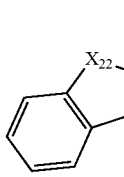
CY2(64) 
CY2(65) 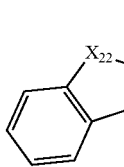
CY2(66) 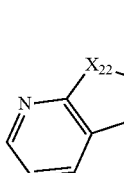
CY2(67) 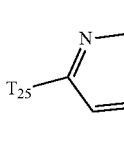
CY2(68) 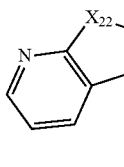

In Formulae CY2(1) to CY2(68), $Y_2$ Will be understood with reference to the description thereof provided in the present specification, $X_{22}$ may be $C(T_{28})(T_{29})$, $N(T_{28})$, O, S, or $Si(T_{28})(T_{29})$, $T_{21}$ to $T_{25}$, $T_{28}$, and $T_{29}$ Will be understood with reference to the description of $T_2$ in the present specification, provided that each of $T_{21}$ to $T_{24}$ are not hydrogen,

*'' indicates a binding site to ring $CY_1$ in Formula 1, and

*' indicates a binding site to Ir in Formula 1.

In one or more embodiments, in Formula 1, $T_2$ may be not hydrogen, and a2 may be 1, 2 or 3.

In one or more embodiments, in Formula 1, the group represented by

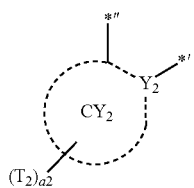

may be a group represented by Formula CY2(10).

For example, in Formula CY2(10), $T_{22}$ and $T_{24}$ may each independently be a $C_1$-$C_{20}$ alkyl group, a $C_3$-$C_{10}$ cycloalkyl group, a phenyl group, a biphenyl group, or a terphenyl group, each unsubstituted or substituted with deuterium, a $C_1$-$C_{20}$ alkyl group, a $C_3$-$C_{10}$ cycloalkyl group, a phenyl group, a biphenyl group, a terphenyl group, or any combination thereof.

In one or more embodiments, in Formula CY2(10), $T_{22}$ and $T_{24}$ may be identical to each other.

In one or more embodiments, in Formula CY2(10), $T_{22}$ and $T_{24}$ may be different from each other.

In one or more embodiments, in Formula CY2(10), the number of carbons in $T_{22}$ may be greater than the number of carbons in $T_{24}$.

In one or more embodiments, in Formula 1, a1 may be not 0, at least one of $T_1$(s) in number of a1 may be:

a fluoro group (—F); or a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof, and the organometallic compound represented by Formula 1 may further satisfy at least one of Condition A to Condition G:

Condition A

All the remaining $T_1$ (s) are hydrogen;

Condition B

At least one of the remaining $T_1$(s) in Formula 1 is a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;

Condition C

At least one of the remaining $T_1$(s) in Formula 1 is:

deuterium, or a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with —F, $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof;

Condition D

At least one of the remaining $T_1$(s) in Formula 1 is —$Si(Q_3)(Q_4)(Q_5)$;

Condition E

At least one of the remaining $T_1$(s) in Formula 1 is —$Ge(Q_3)(Q_4)(Q_5)$;

Condition F

In Formula 1, a2 is not 0, and at least one of $T_2$(s) in number of a2 is a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group; and Condition G In Formula 1, a2 is not 0, and at least one of $T_2$(s) in number of a2 is:

deuterium, or a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof.

In one or more embodiments, the organometallic compound represented by Formula 1 may satisfy at least one of Condition 1 to Condition 3:

Condition 1

In Formula 1, $A_1$ to $A_6$ are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group;

Condition 2

In Formula 1, at least one of $A_1$ to $A_6$ (for example, at least one of $A_1$ to $A_3$, and at least one of $A_4$ to $A_6$) are each independently a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group; and Condition 3

In Formula 1, $A_7$ is deuterium, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, the organometallic compound represented by Formula 1 may satisfy at least one of Condition 1 and Condition 2 described above.

In one or more embodiments, in Formula 1, a2 may be 2, and $T_2$ may be a substituted or unsubstituted $C_1$-$C_{60}$ alkyl group.

In one or more embodiments, the organometallic compound represented by Formula 1 may satisfy at least one of Condition 4 and Condition 5:

Condition 4

In Formula 1, two or more of $A_1$ to $A_3$ of the group represented by *—C($A_1$)($A_2$)($A_3$) are linked with C in the group represented by *—C($A_1$)($A_2$)($A_3$) to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$ so that the group represented by *—C($A_1$)($A_2$)($A_3$) is a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$; and Condition 5

In Formula 1, two or more of $A_4$ to $A_6$ of the group represented by *—C($A_4$)($A_5$)($A_6$) are linked with C in the group represented by *—C($A_4$)($A_5$)($A_6$) to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$ so that the group represented by *—C($A_4$)($A_5$)($A_6$) is a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$.

In one or more embodiments, in Formula 1, the group represented by *—C($A_1$)($A_2$)($A_3$) and the group represented by *—C($A_4$)($A_5$)($A_6$) may be identical to each other.

In one or more embodiments, in Formula 1, the group represented by *—C($A_1$)($A_2$)($A_3$) and the group represented by *—C($A_4$)($A_5$)($A_6$) may be different from each other.

In one or more embodiments, in Formula 1, the number of carbons in the group represented by *—C($A_1$)($A_2$)($A_3$) may be 4 or greater, 5 or greater, or 6 or greater.

In one or more embodiments, in Formula 1, the number of carbons in the group represented by *—C($A_4$)($A_5$)($A_6$) may be 4 or greater, 5 or greater, or 6 or greater.

In one or more embodiments, in Formula 1, the following case is excluded: 1) $A_7$ is hydrogen, and 2) both the group represented by *—C($A_1$)($A_2$)($A_3$) and the group represented by *—C($A_4$)($A_5$)($A_6$) are a methyl group.

In one or more embodiments, in Formula 1, the following case is excluded: 1) $A_7$ is hydrogen; and 2) all of $A_1$ to $A_6$ are a methyl group.

In one or more embodiments, in Formula 1, at least one deuterium may be included.

In one or more embodiments, in Formula 1, a2 may not be 0, and at least one of $T_2$(s) in number of a2 may include at least one deuterium.

In one or more embodiments, the organometallic compound represented by Formula 1 may emit red light or green light, for example, red light or green light having a maximum emission wavelength of about 500 nm or greater, for example, in the range of about 500 nm or greater and about 650 nm or less.

The organometallic compound represented by Formula 1 may be one of Compounds 1 to 90 below.

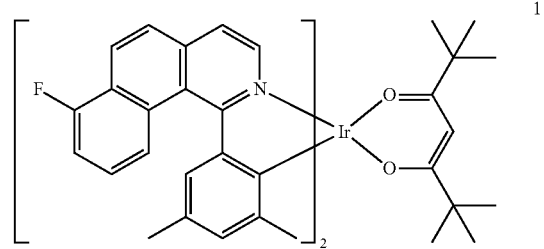

1

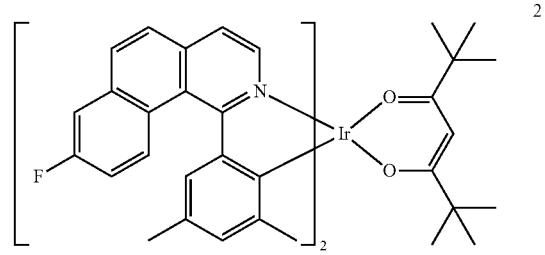

2

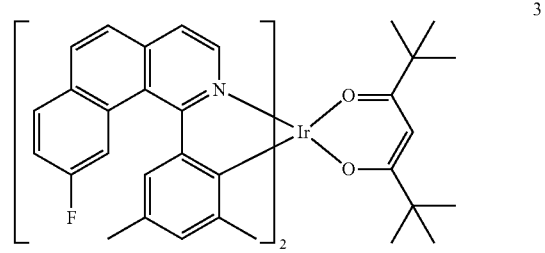

3

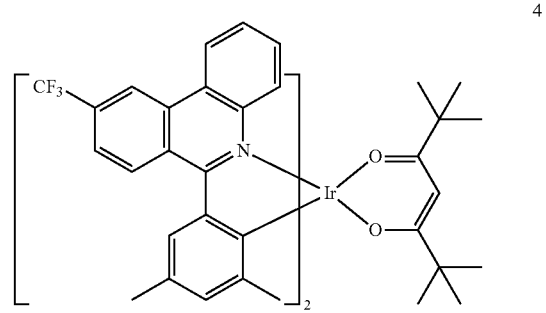

4

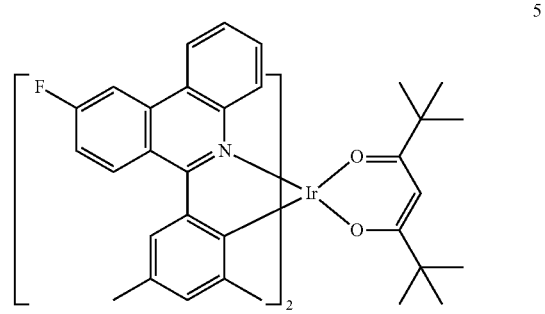

5

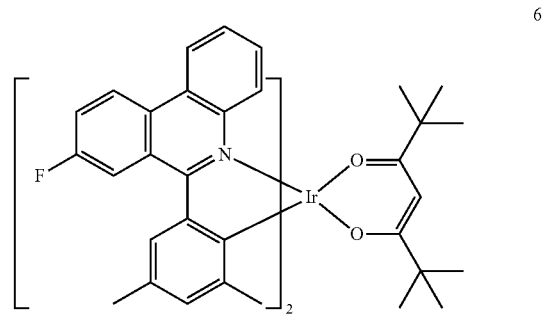

6

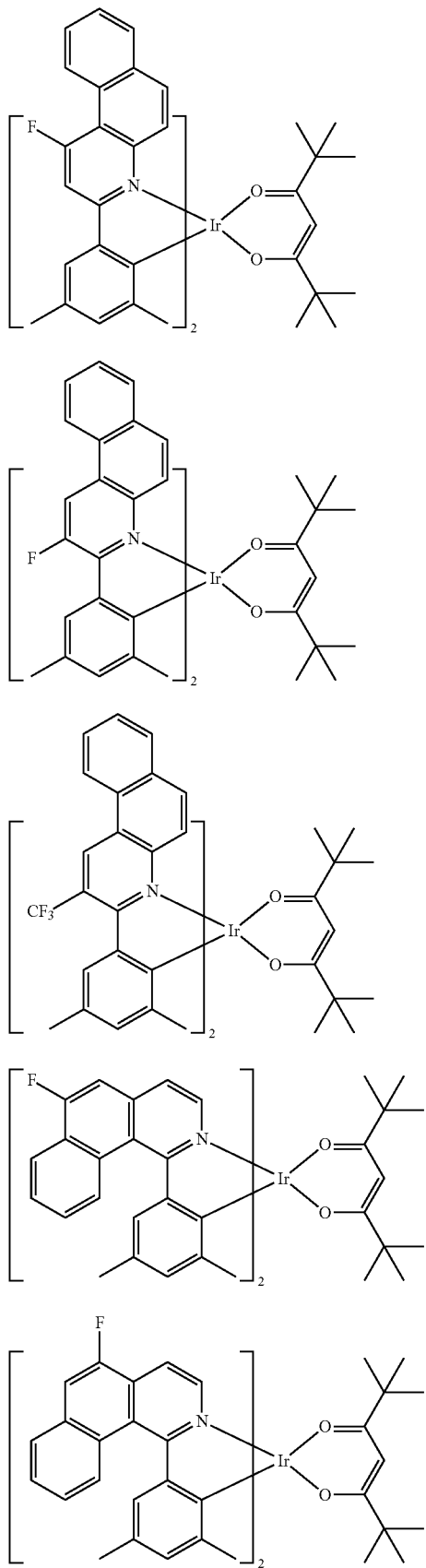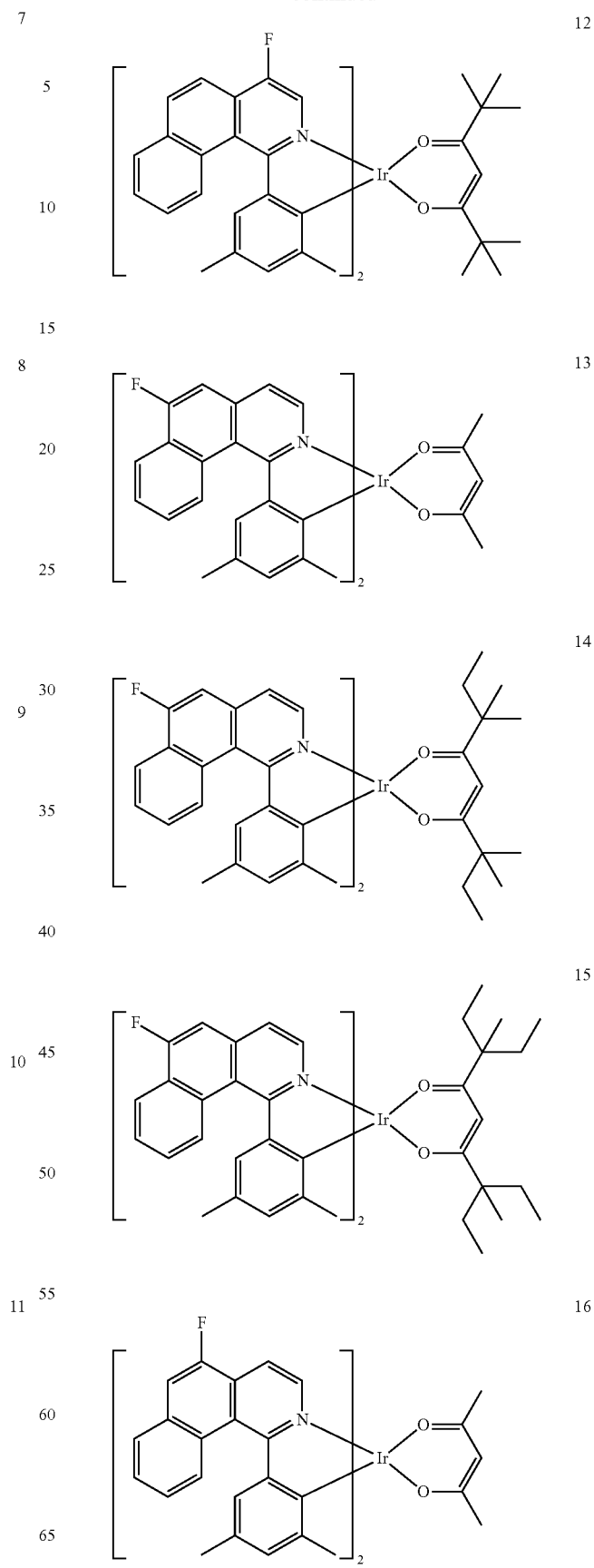

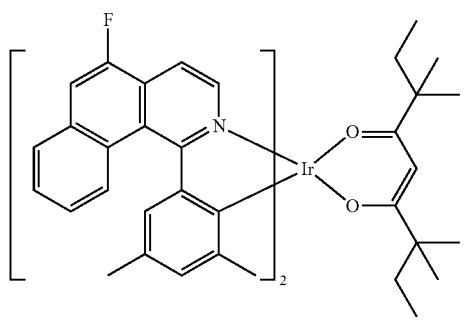
17
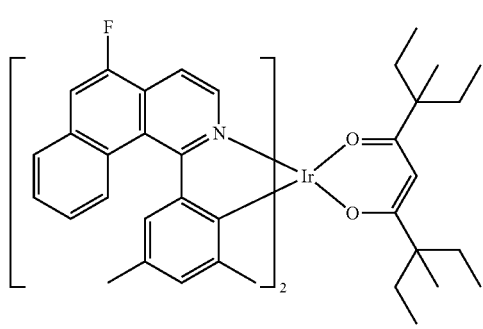
18
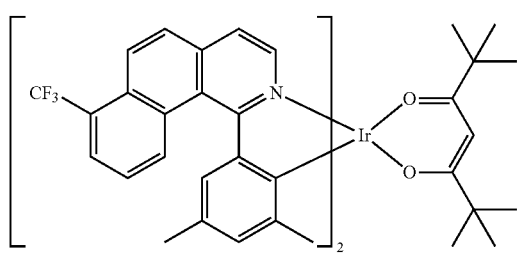
19
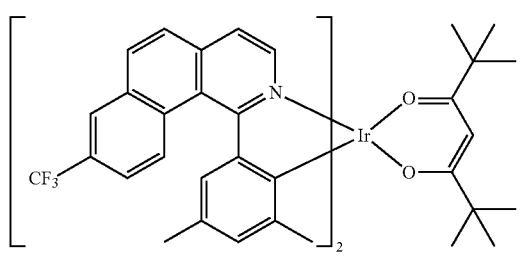
20
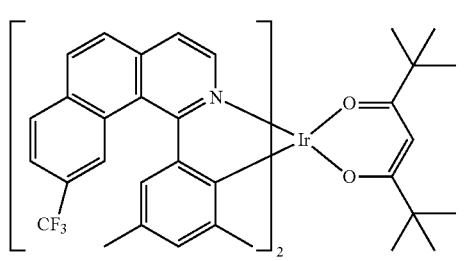
21
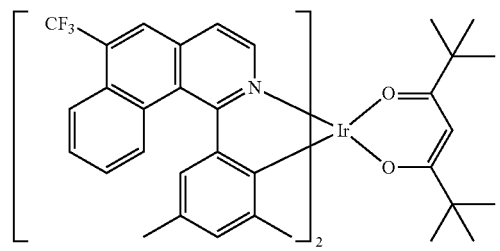
22
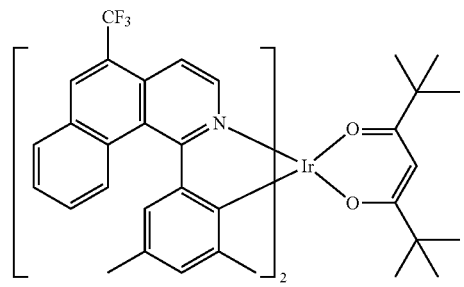
23
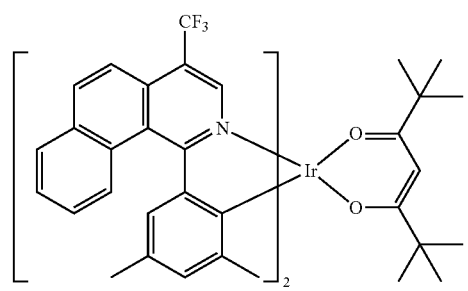
24
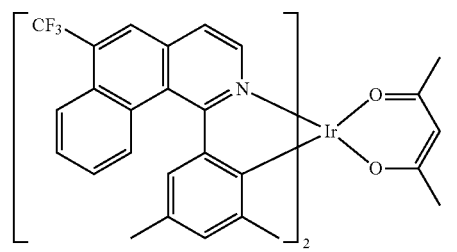
25
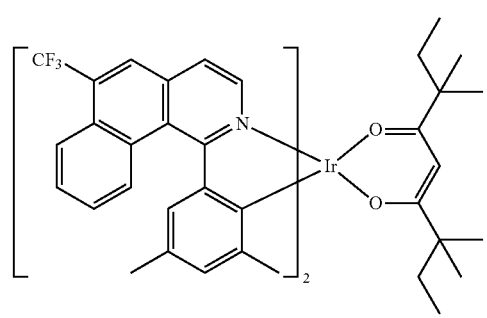
26

27
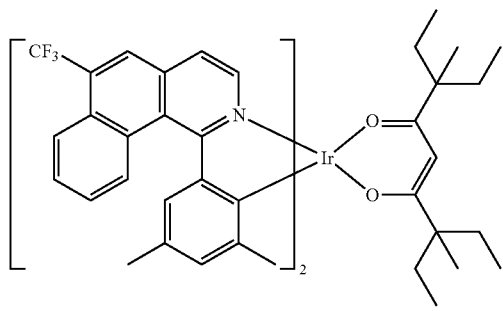
28
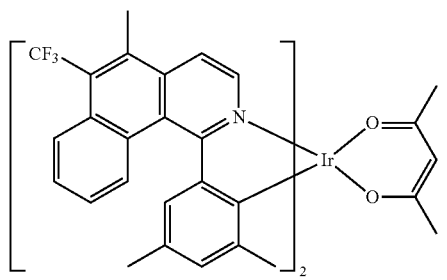
29
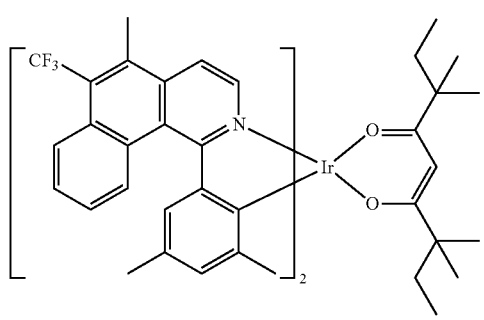
30
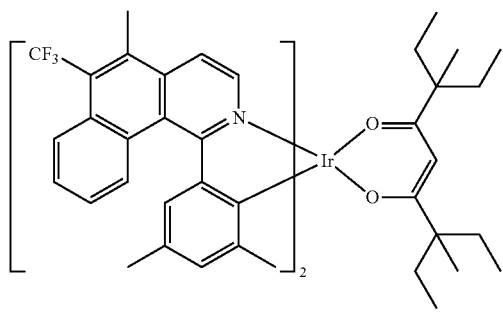
31
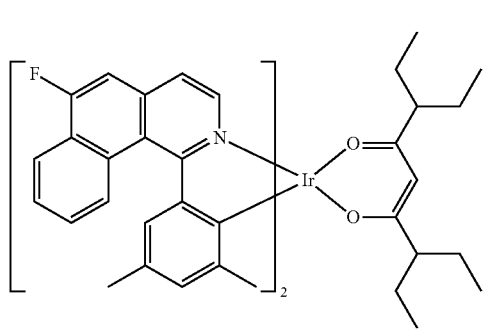
32
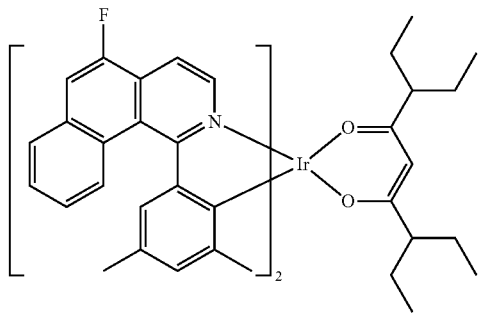
33
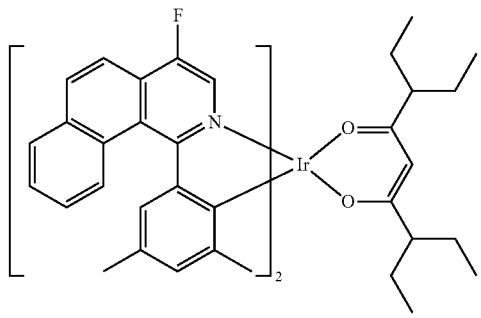
34
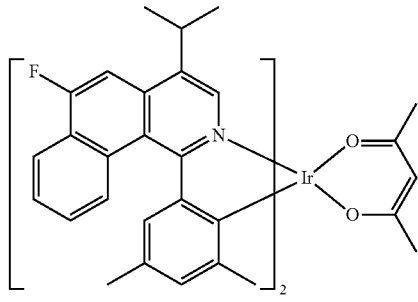
35
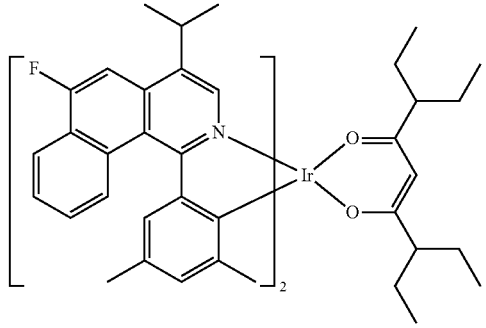
36
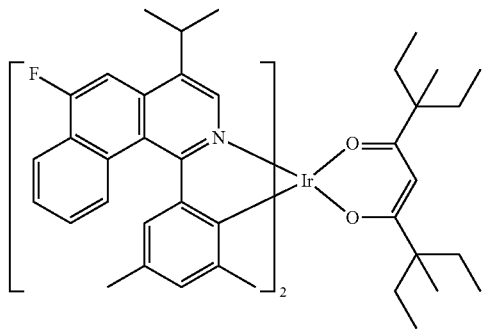

37
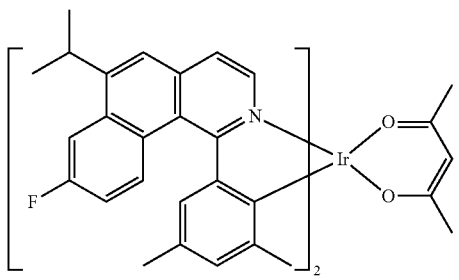
38
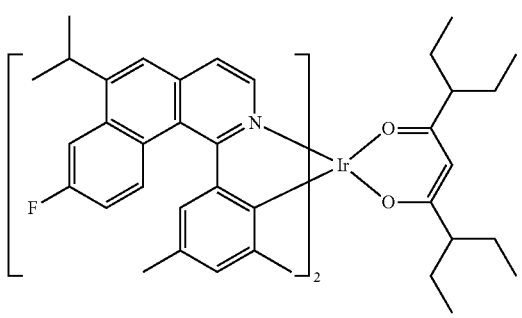
39
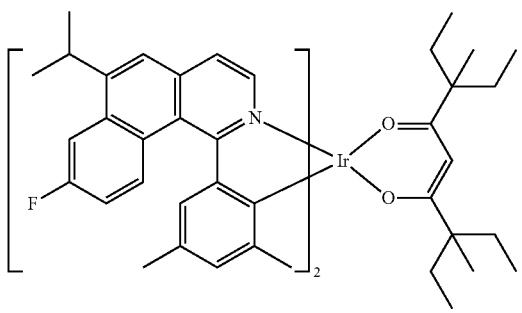
40
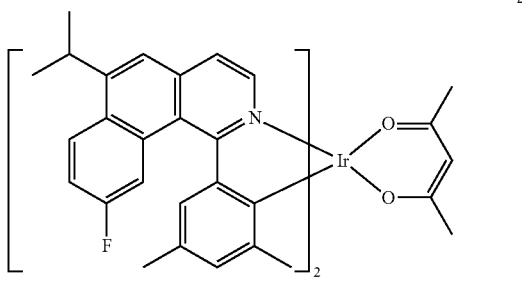
41
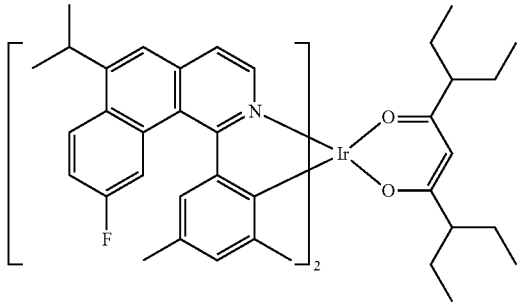
42
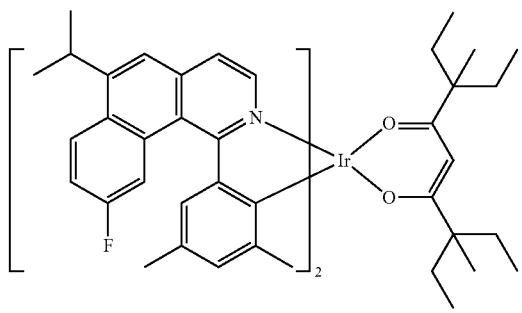
43
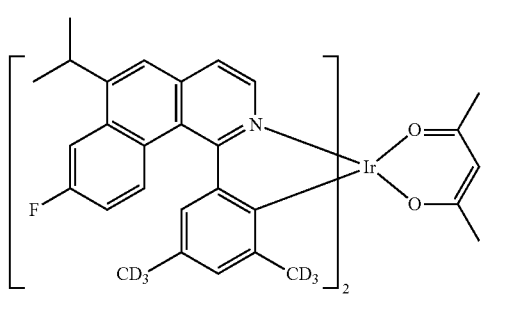
44
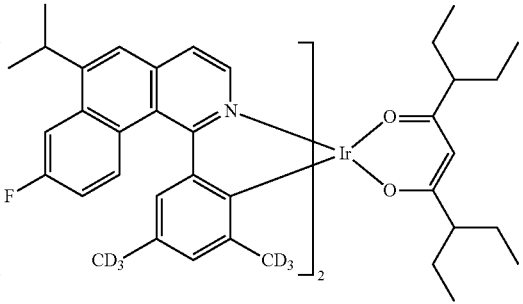
45
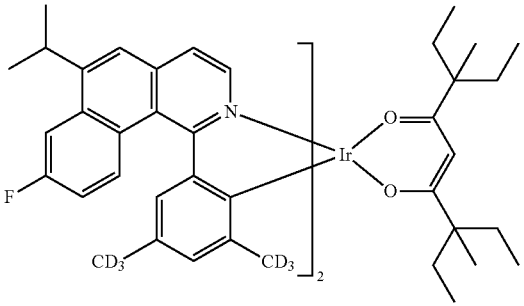
46
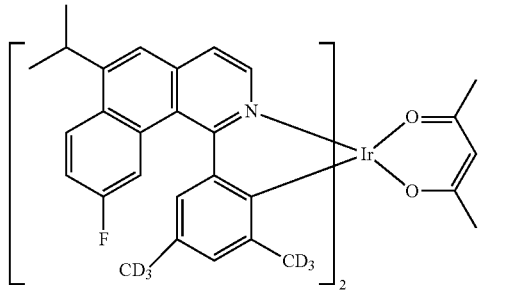

47
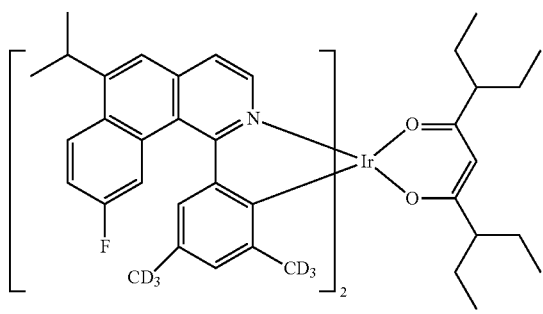
48
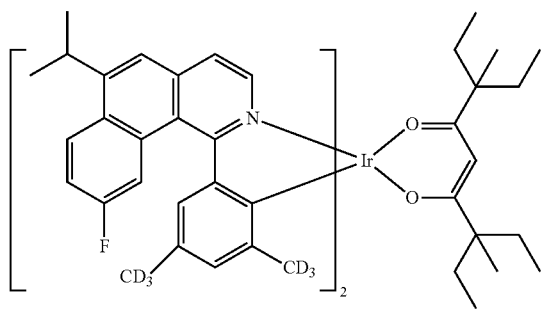
49
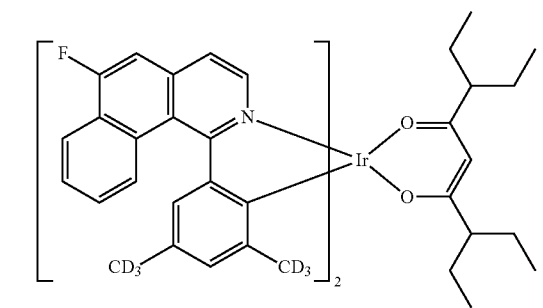
50
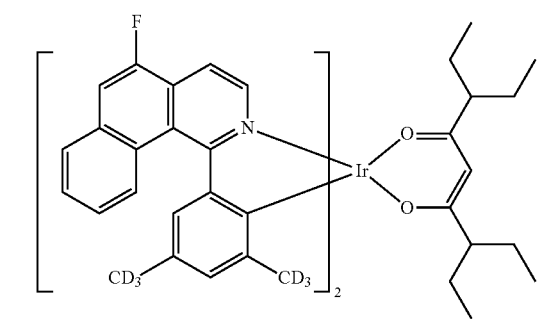
51
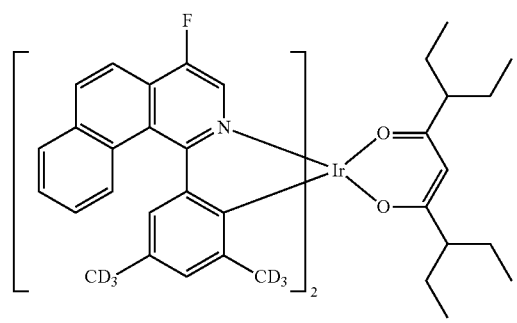
52
53
54
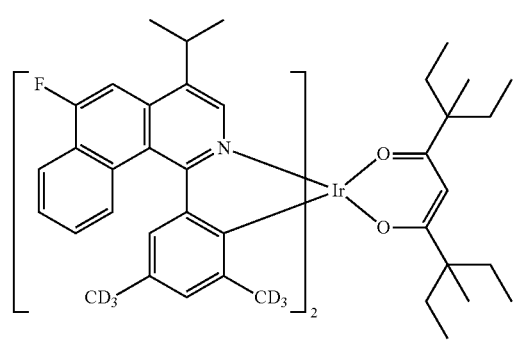

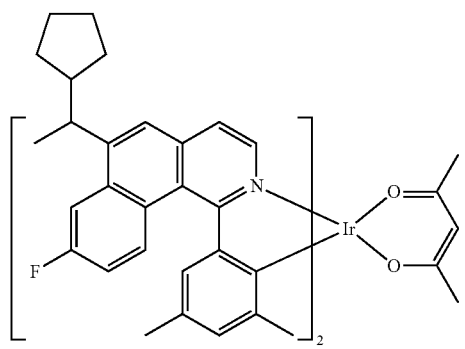
55
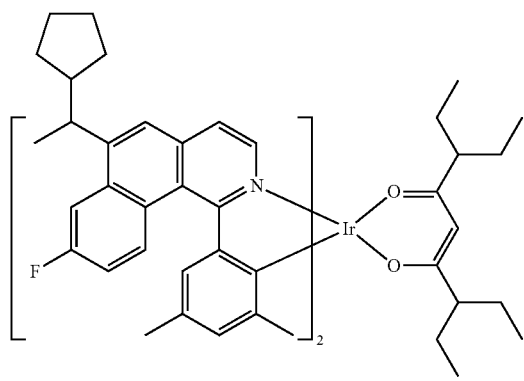
56
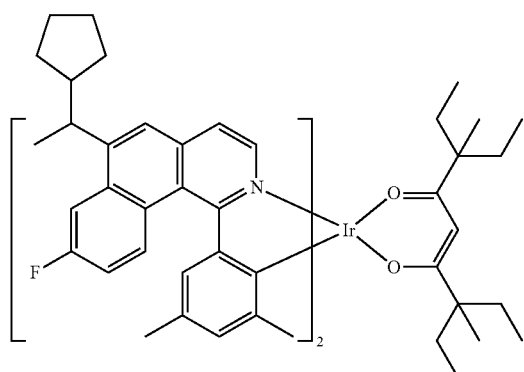
57
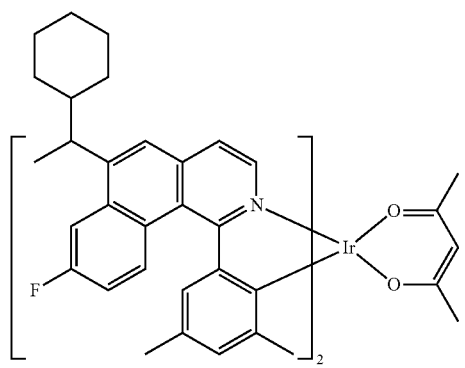
58
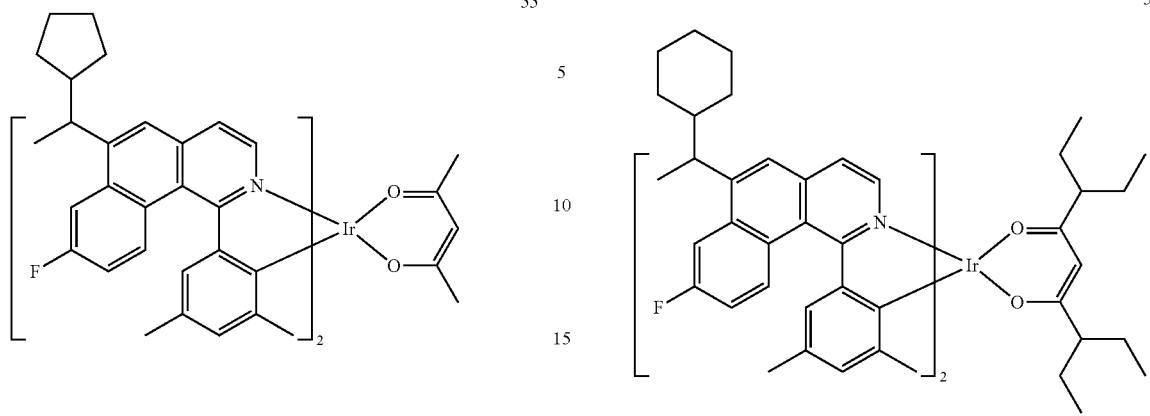
59
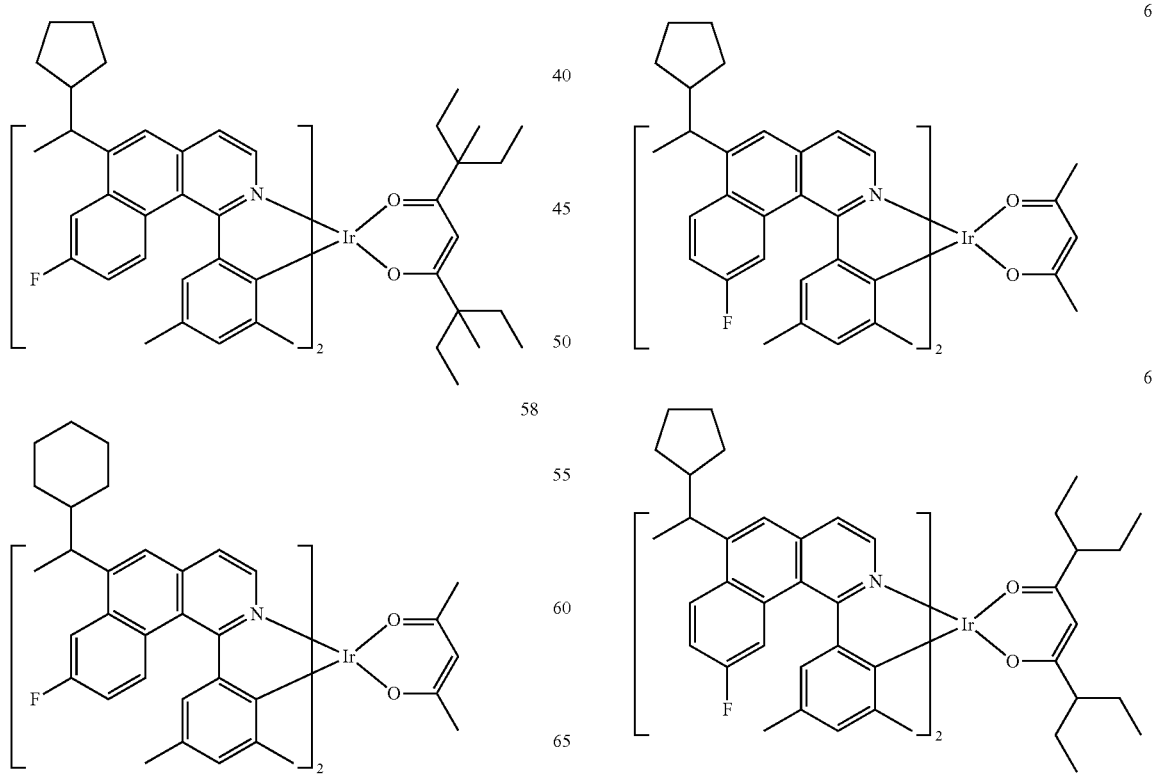

63
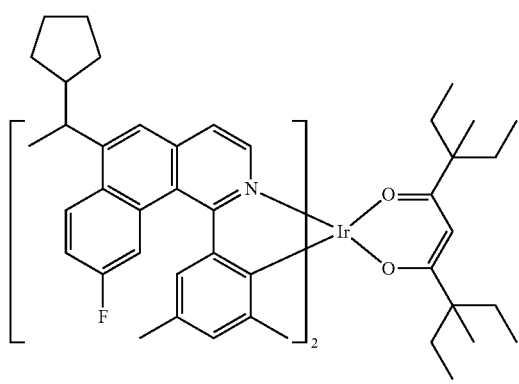
64
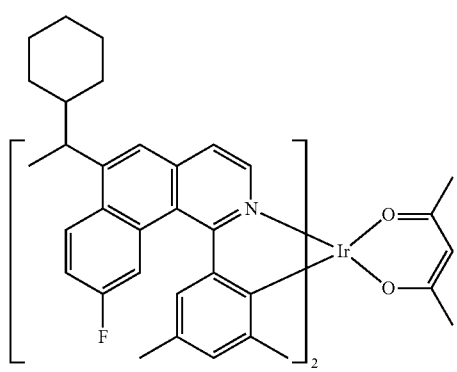
65
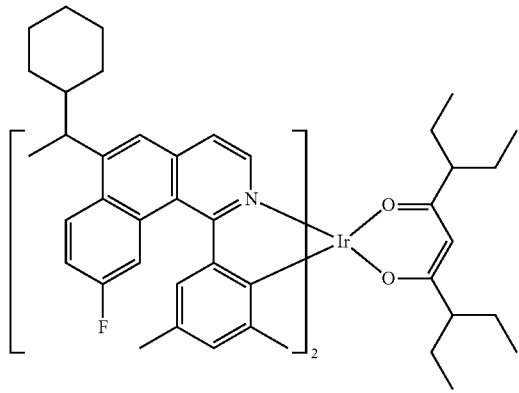
66
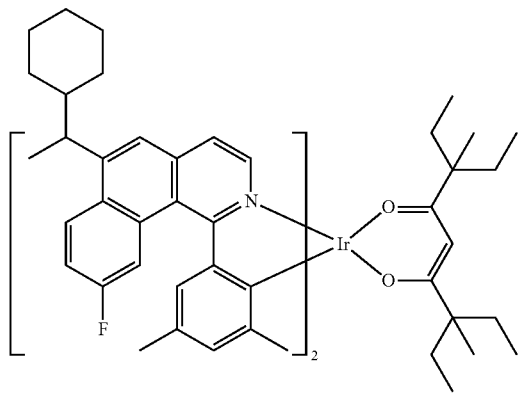
67
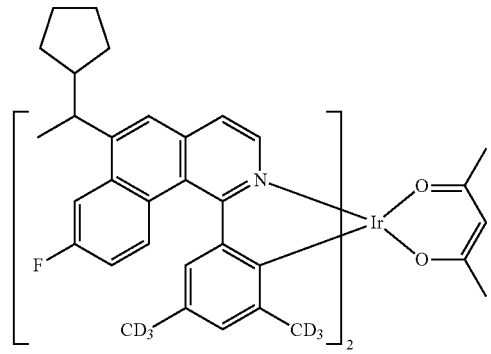
68
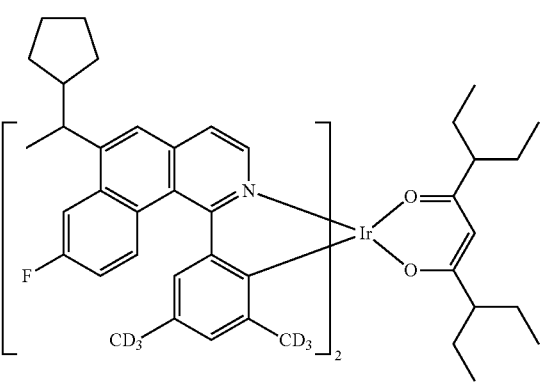
69
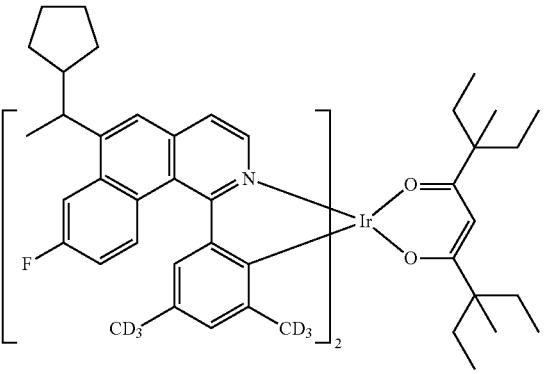
70
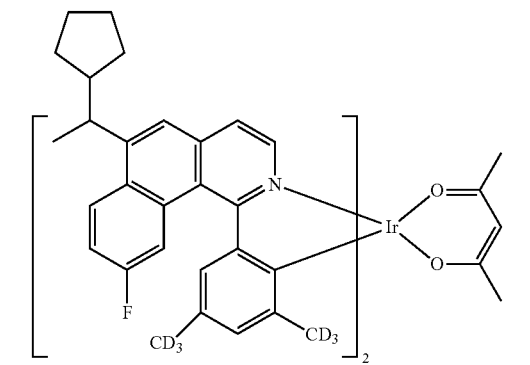

71
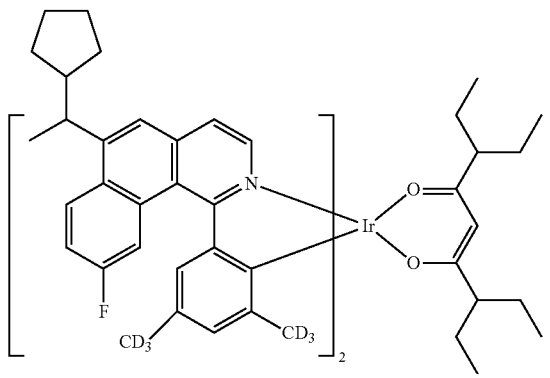
72
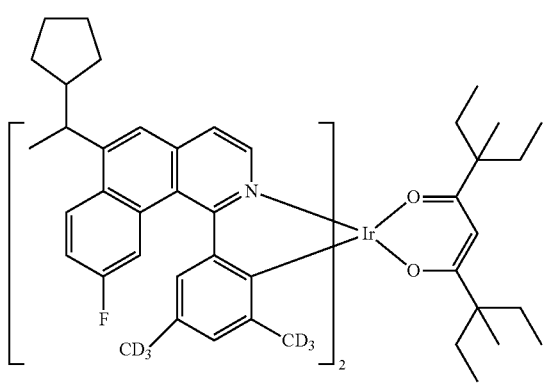
73
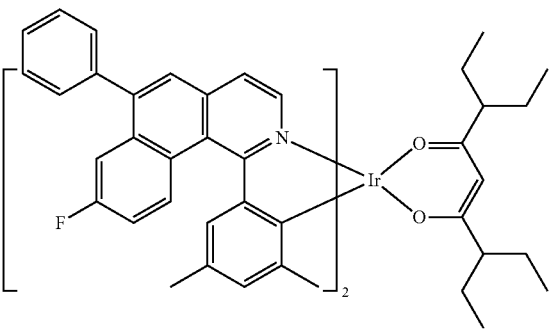
74
75
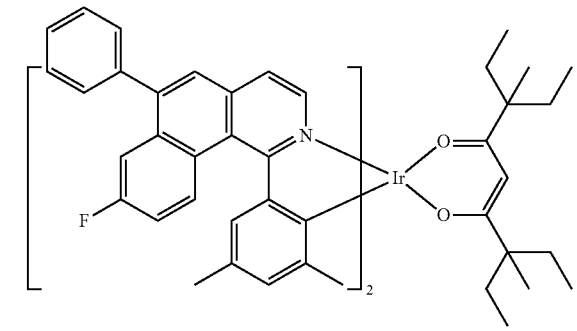
76
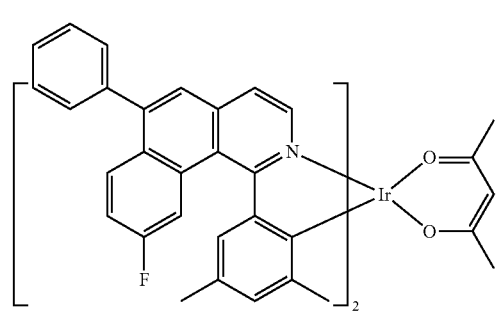
77
78
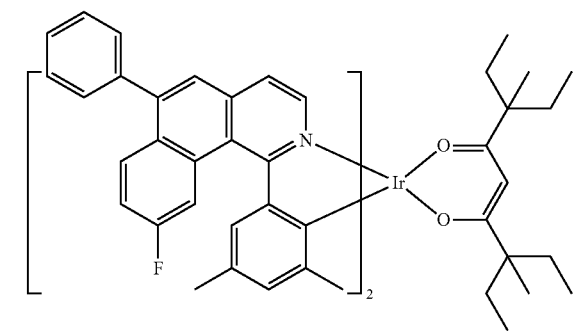

79
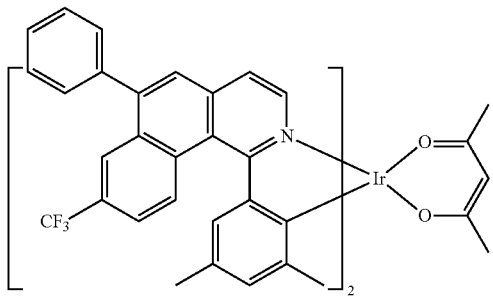
80
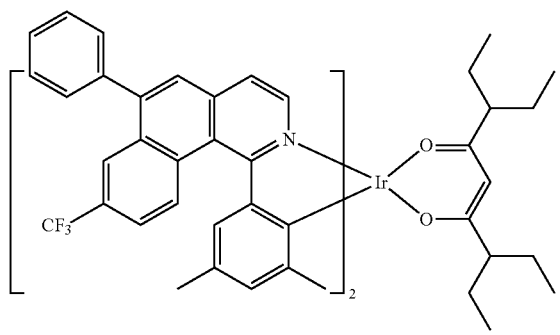
81
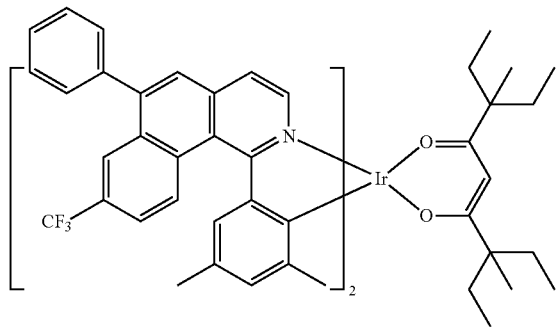
82
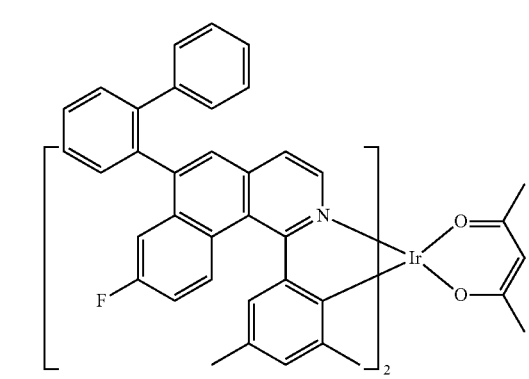
83
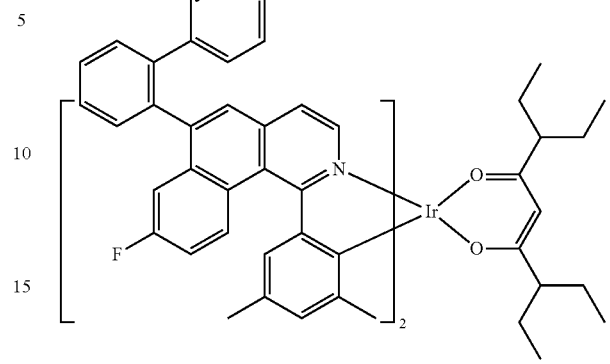
84
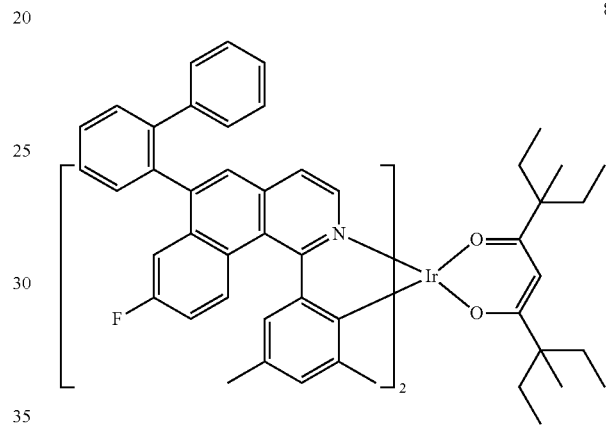
85
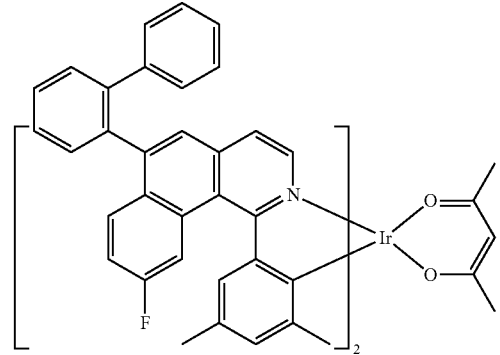
86
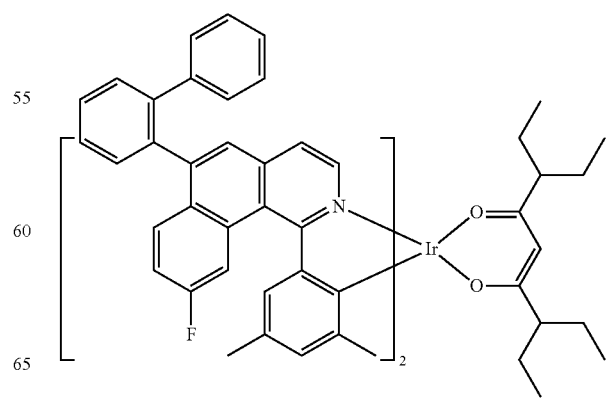

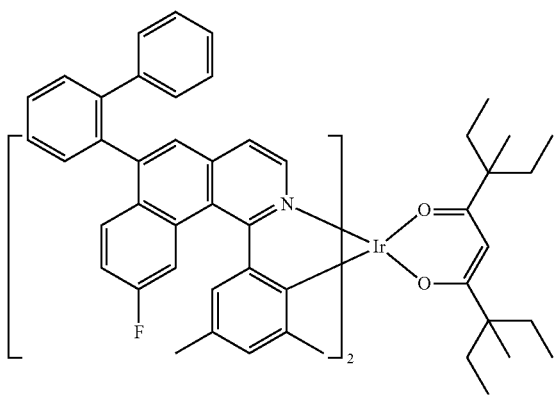

87

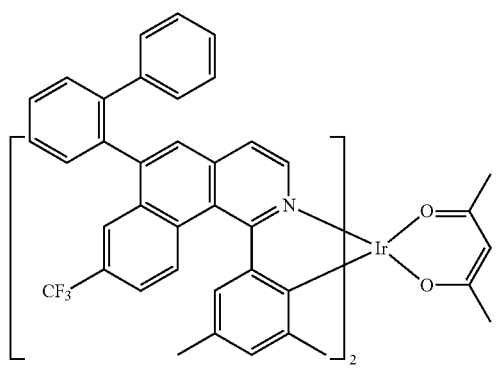

88

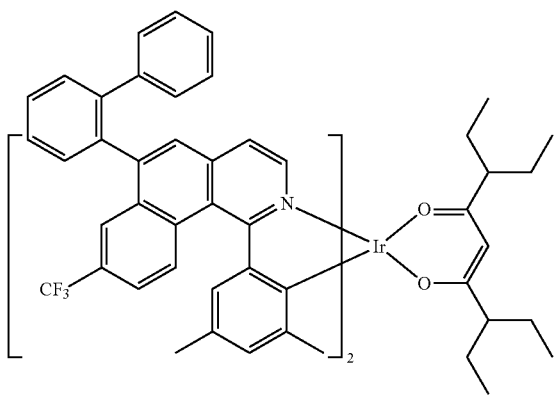

89

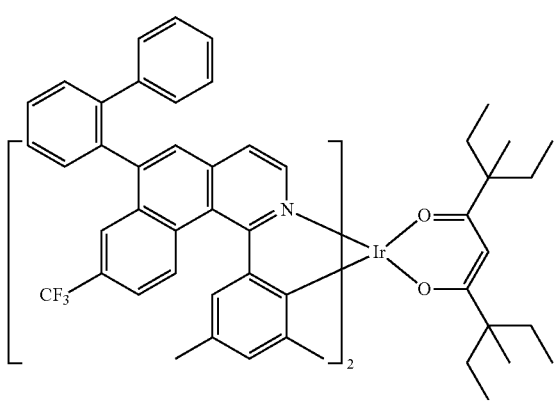

90

Since, in Formula 1, at least one of $T_1(s)$ in number of a1, at least one of $T_2(s)$ in number of a2, or any combination thereof includes at least one fluoro group (—F), an electronic device including the organometallic compound represented by Formula 1, for example, an organic light-emitting device, may have a high emission efficiency.

In one or more embodiments, the organometallic compound represented by Formula 1 may satisfy Condition 1 described above, and thus lead to reduced intermolecular interaction in the organometallic compound. Although not limited by a specific theory, α-protons may have chemical reactivity about $10^5$ times higher than β-protons to produce intermediates in various forms during compound synthesis and/or storage, thus causing side reactions. However, since $A_1$ to $A_6$ in Formula 1 are defined to satisfy Condition 1, carbons bound to $A_1$ to $A_6$ of Formula 1 may not include α-protons, and the organometallic compound, represented by Formula 1, satisfying Condition 1, may have a stable chemical structure in which side reactions before/after synthesis are minimized, and at the same time may have reduced intermolecular interaction during operation of an electronic device (for example, an organic light-emitting device) employing the organometallic compound.

In one or more embodiments, as the organometallic compound represented by Formula 1 satisfies at least one of Condition 2 to Condition 5, the organometallic compound represented by Formula 1 may have relatively large steric hindrance, thus reducing triplet-triplet annihilation. Accordingly, an electronic device, for example, an organic light-emitting device, using the organometallic compound represented by Formula 1 and satisfying at least one of Condition 2 to Condition 5 may have improved internal quantum luminescence efficiency.

In one or more embodiments, when the organometallic compound represented by Formula 1 satisfies at least one of Condition 1 to Condition 5, and/or when, Formula 1, a2 is 2 and $T_2$ is a substituted or unsubstituted $C_1$-$C_{60}$ alkyl group, due to enhanced interaction between Ligand 2 and Ligand 1 (see Formula 1' as below), the organometallic compound represented by Formula 1 may have improved rigidity. Thus, in the photoluminescent (PL) or electroluminescent (EL) spectrum of the organometallic compound represented by Formula 1, the full width at half maximum (FWHM) of the emission peak may be reduced, and the molecular vibrionic state of the organometallic compound represented by Formula 1 may be reduced, leading to reduction in non-radiative decay. Accordingly, an electronic device, for example, an organic light-emitting device, including the organometallic compound represented by Formula 1 may emit light of high color purity (for example, red light of high color purity), and at the same time have high emission efficiency and improved lifetime.

Formula 1'

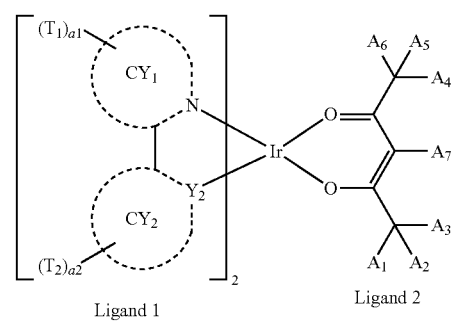

Ligand 1     Ligand 2

Accordingly, an electronic device, for example, an organic light-emitting device, using the organometallic compound represented by Formula 1, may have high emission efficiency and long lifetime.

A highest occupied molecular orbital (HOMO) energy level, a lowest unoccupied molecular orbital (LUMO) energy level, a singlet (Si) energy level, and a triplet ($T_1$) energy level of some compounds of the organometallic compounds represented by Formula 1 were evaluated by a density functional theory (DFT) of Gaussian program with molecular structure optimization based on B3LYP, and the results are shown in Table 1.

TABLE 1

| Compound No. | HOMO (eV) | LUMO (eV) | gap (eV) | $S_1$ (eV) | $T_1$ (eV) |
|---|---|---|---|---|---|
| 1 | −4.725 | −1.854 | 2.871 | 2.240 | 1.991 |
| 2 | −4.696 | −1.842 | 2.854 | 2.190 | 1.971 |
| 3 | −4.681 | −1.790 | 2.891 | 2.254 | 1.996 |
| 4 | −4.937 | −2.243 | 2.694 | 2.071 | 1.823 |
| 5 | −4.790 | −1.939 | 2.851 | 2.209 | 1.943 |
| 6 | −4.748 | −1.998 | 2.750 | 2.127 | 1.859 |
| 7 | −4.781 | −1.766 | 3.015 | 2.384 | 2.181 |
| 8 | −4.769 | −1.947 | 2.822 | 2.188 | 1.960 |
| 9 | −4.870 | −2.085 | 2.785 | 2.142 | 1.950 |
| 10 | −4.678 | −1.786 | 2.892 | 2.222 | 1.996 |
| 11 | −4.716 | −1.844 | 2.872 | 2.188 | 1.960 |
| 12 | −4.675 | −1.805 | 2.870 | 2.204 | 1.979 |
| 19 | −4.812 | 1.993 | 2.819 | 2.161 | 1.947 |
| 20 | −4.828 | −2.005 | 2.823 | 2.157 | 1.938 |
| 21 | −4.727 | −1.974 | 2.753 | 2.104 | 1.916 |
| 22 | −4.865 | −2.129 | 2.736 | 2.127 | 1.913 |
| 23 | −4.790 | −2.041 | 2.749 | 2.106 | 1.909 |
| 24 | −4.870 | −2.118 | 2.752 | 2.077 | 1.866 |

Referring to Table 1, it is confirmed that the organometallic compound represented by Formula 1 have electric characteristics that are suitable for use in an electronic device, for example, as a dopant of an organic light-emitting device.

Methods of synthesizing the organometallic compound represented by Formula 1 can be understood by a person of ordinary skill in the art with reference to the synthesis examples described below.

Accordingly, the organometallic compound represented by Formula 1 is suitable for use in an organic layer of an organic light-emitting device, for example, as a dopant in an emission layer of the organic layer. Therefore, another aspect of the present disclosure provides an organic light-emitting device including: a first electrode; a second electrode; and an organic layer disposed between the first electrode and the second electrode and including an emission layer, the organic layer including at least one organometallic compound represented by Formula 1.

The organic light-emitting device may have, due to the inclusion of an organic layer including the above-described organometallic compound represented by Formula 1, an excellent driving voltage, excellent external quantum efficiency, an excellent roll-off ratio, a relatively small FWHM of the emission peak in the EL spectrum, and improved lifetime characteristics.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, red light or green light, for example, red light or green light having a maximum emission wavelength of about 500 nm or greater, for example, 500 nm or greater and 650 nm or less.

In one or more embodiments, the emission layer may emit red light.

The expression "(an organic layer) includes at least one organometallic compound represented by Formula 1" as used herein may be construed as that the organic layer includes one organometallic compound belonging to the category of Formula 1, or that the organic layer includes two or more different organometallic compounds belonging to the category of Formula 1.

For example, the organic layer may include, as the organometallic compound, only Compound 1. In this regard, Compound 1 may be only in the emission layer of the organic light-emitting device. In one or more embodiments, the organic layer may include, as the organometallic compound, Compound 1 and Compound 2. In this regard, Compound 1 and Compound 2 may be in the same layer (For example, both Compound 1 and Compound 2 may be in the emission layer).

The first electrode may be an anode, which is a hole injection electrode, and the second electrode may be a cathode, which is an electron injection electrode. In other embodiments, the first electrode may be a cathode, which is an electron injection electrode, and the second electrode may be an anode, which is a hole injection electrode.

For example, in the organic light-emitting device, the first electrode may be an anode, the second electrode may be a cathode, the organic layer may further include a hole transport region between the first electrode and the emission layer and an electron transport region between the emission layer and the second electrode, the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" as used herein refers to a single layer and/or a plurality of layers disposed between the first electrode and the second electrode of an organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described with reference to FIGURE. The organic light-emitting device 10 may have a structure in which a first electrode 11, an organic layer 15, and a second electrode 19 which are sequentially stacked.

A substrate may be additionally disposed under the first electrode 11 or above the second electrode 19. For use as the substrate, any substrate that is used in general organic light-emitting devices may be used. The substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may include a material(s) with a high work function to facilitate hole injection. The first electrode 11 may be a reflective electrode, a semi-reflective electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate)(PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

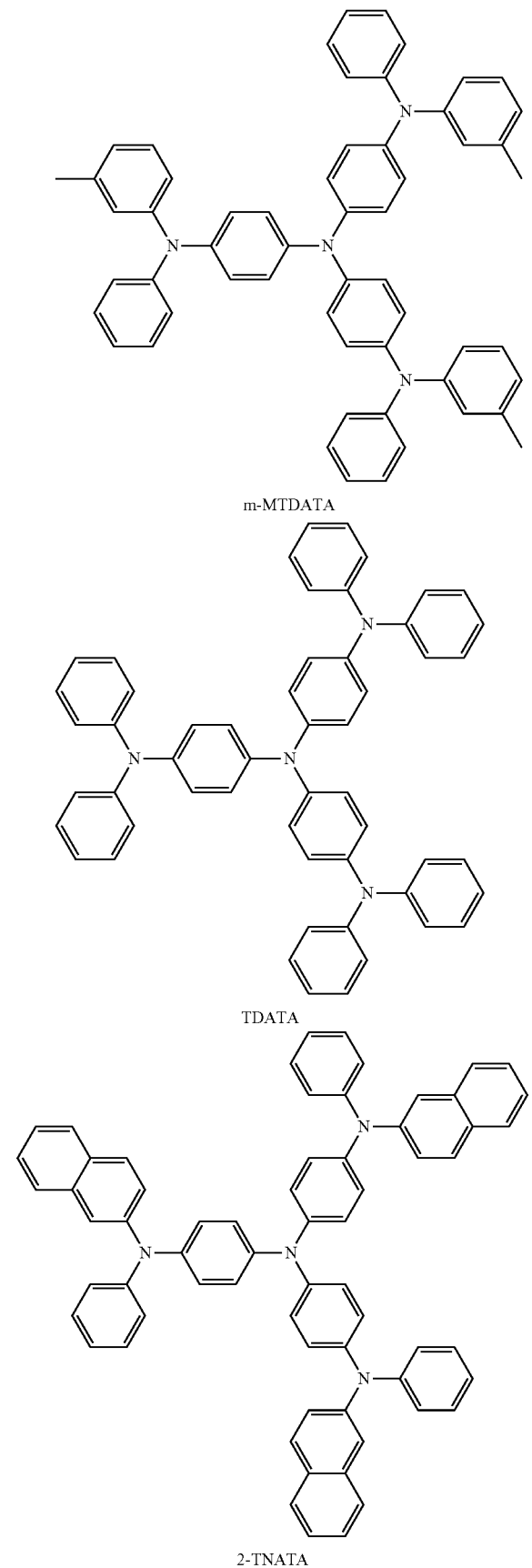

m-MTDATA

TDATA

2-TNATA

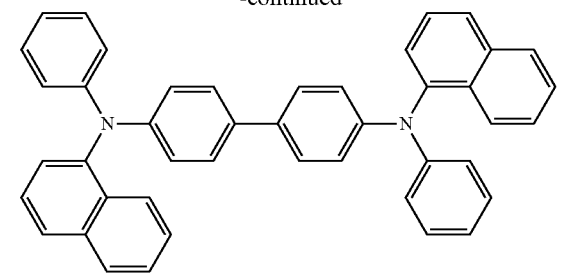

NPB

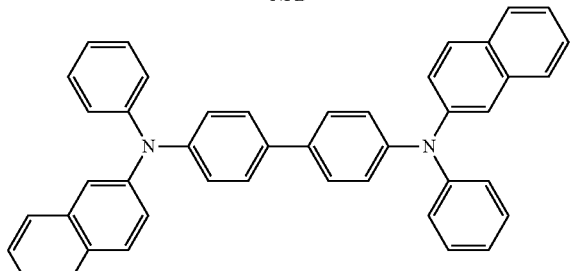

β-NPB

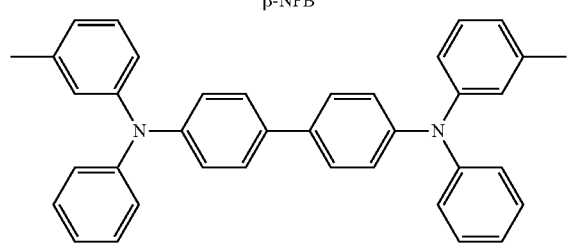

TPD

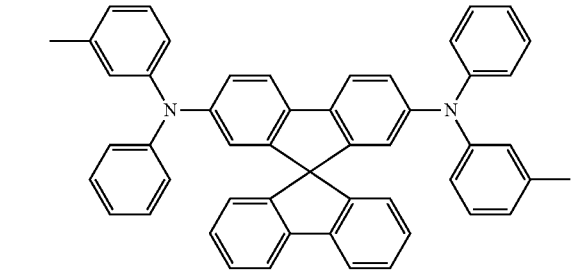

Spiro-TPD

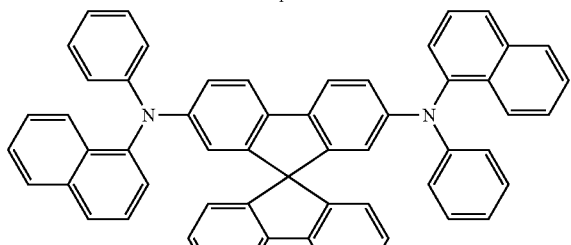

Spiro-NPB

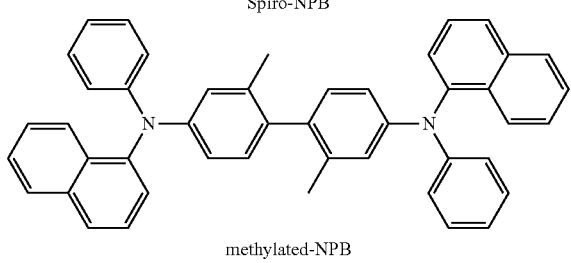

methylated-NPB

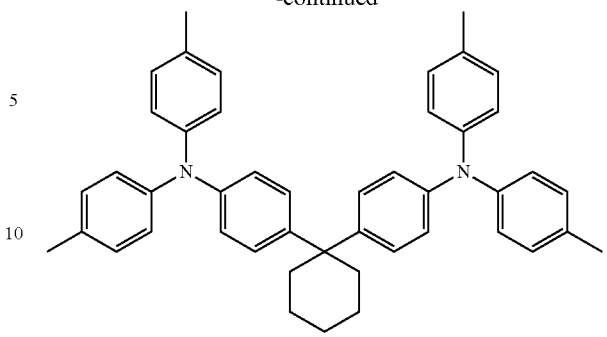

TAPC

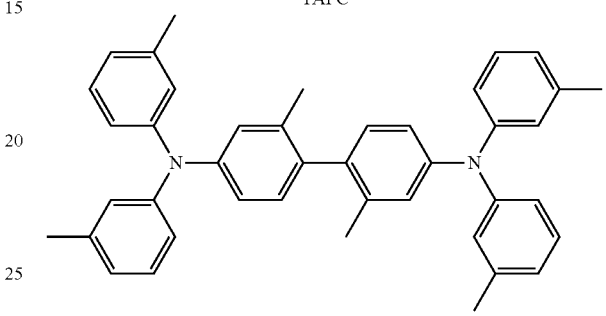

HMTPD

Formula 201

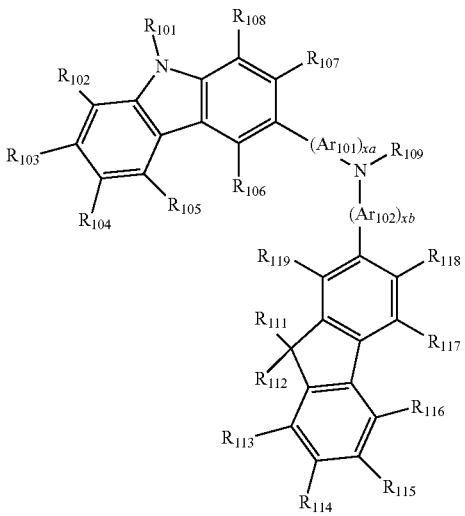

Formula 202

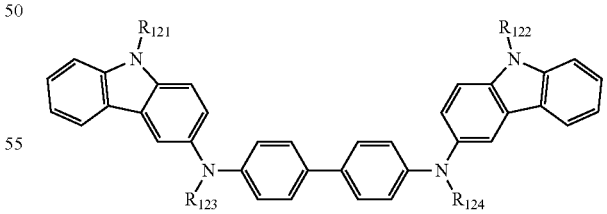

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

The designations xa and xb in Formula 201 may each independently be an integer from 0 to 5, or may be 0, 1 or 2. For example, xa may be 1 and xb may be 0. However, embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A.

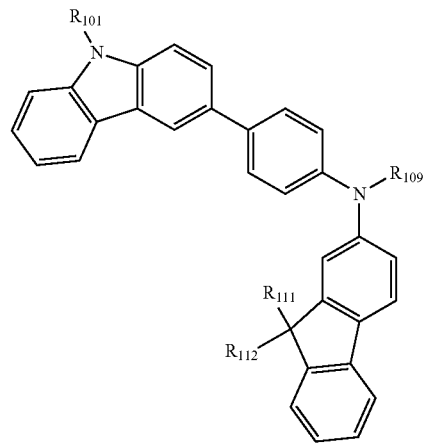

Formula 201A

Detailed descriptions of $R_{101}$, $R_{111}$, $R_{112}$, and $R_{109}$ in Formula 201A are the same as described above.

For example, the hole transport region may include one of Compounds HT1 to HT21 or any combination thereof.

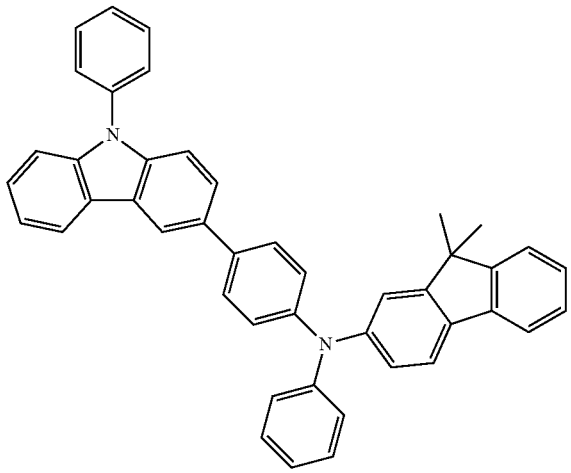

HT1

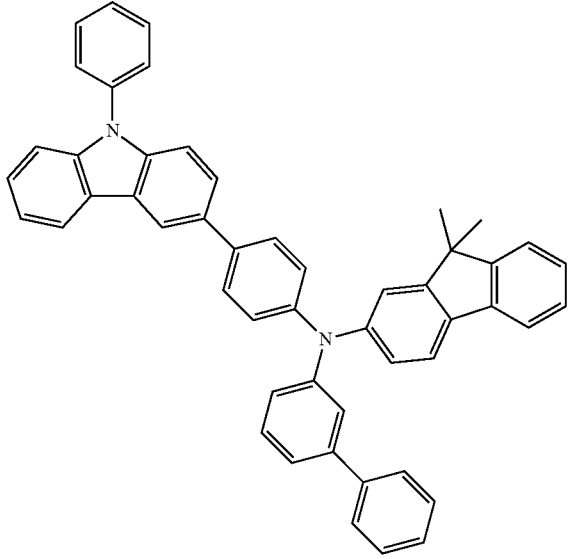

HT2

HT3
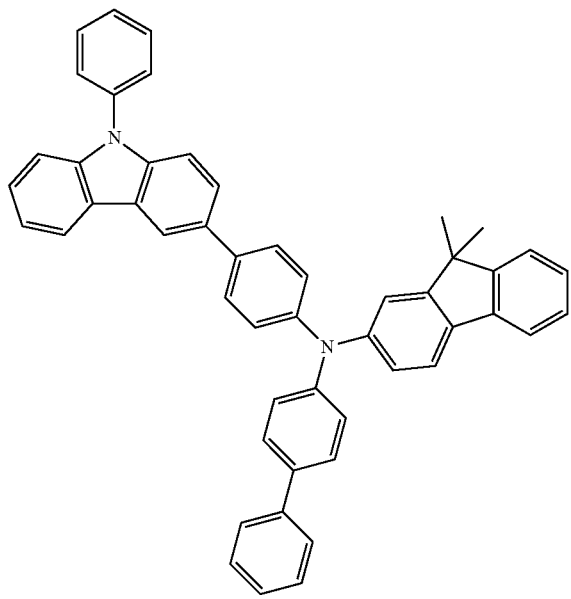
HT4
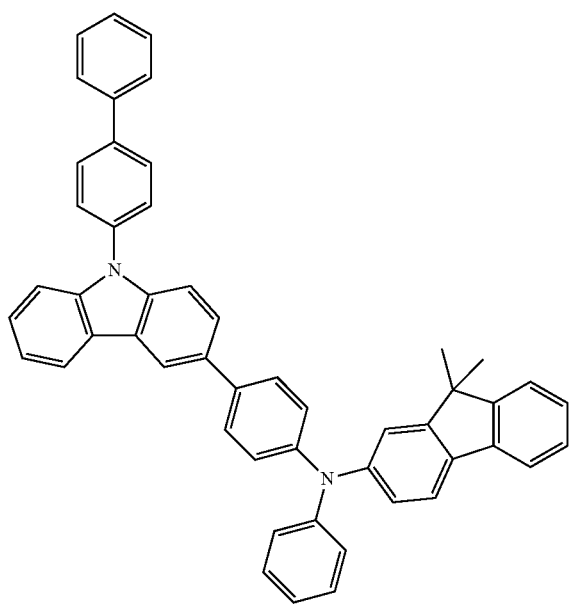
HT5
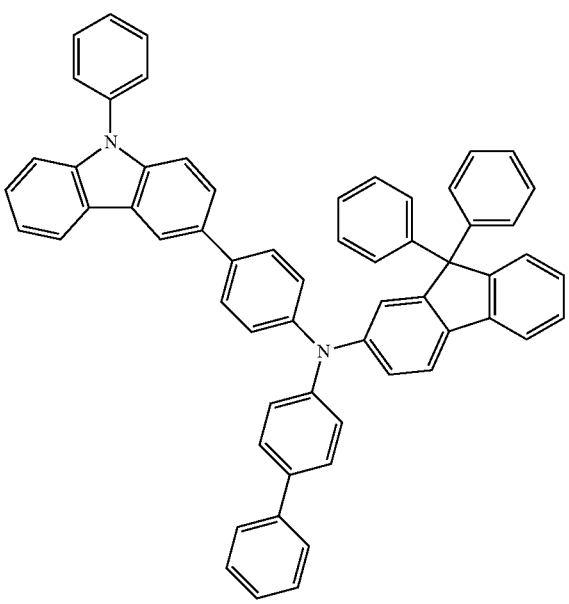
HT6
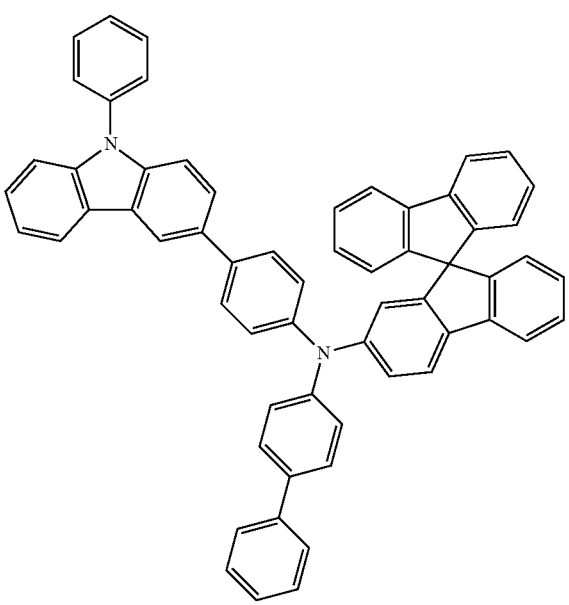

HT7
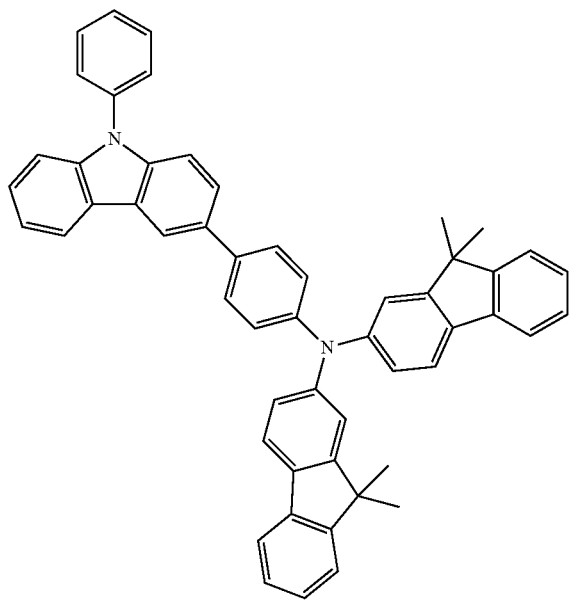
HT10
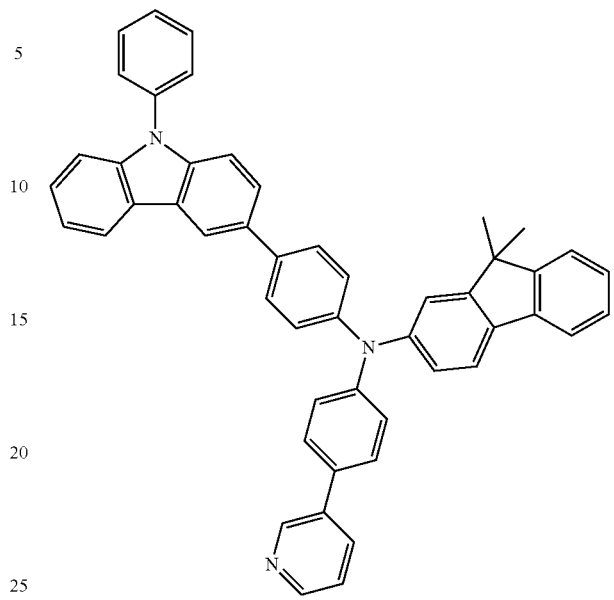
HT8
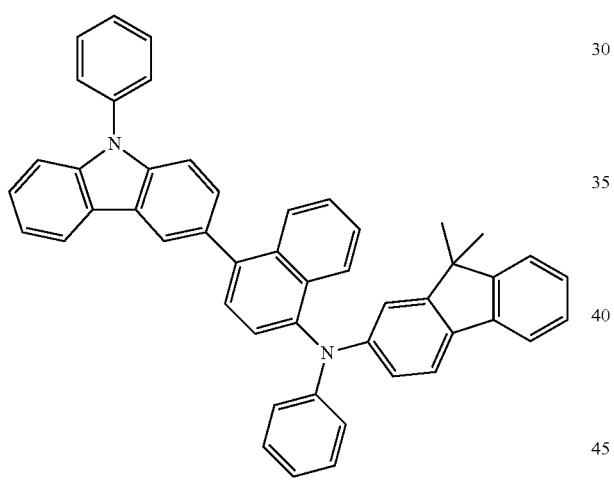
HT9
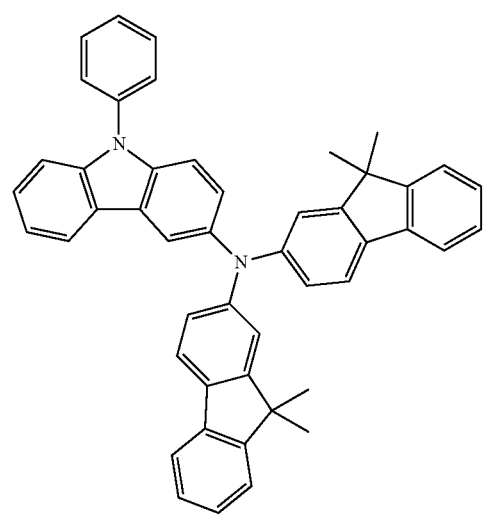
HT11
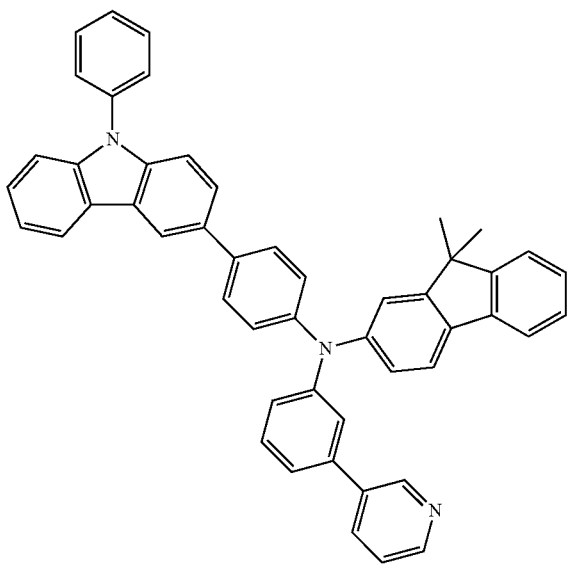

HT12
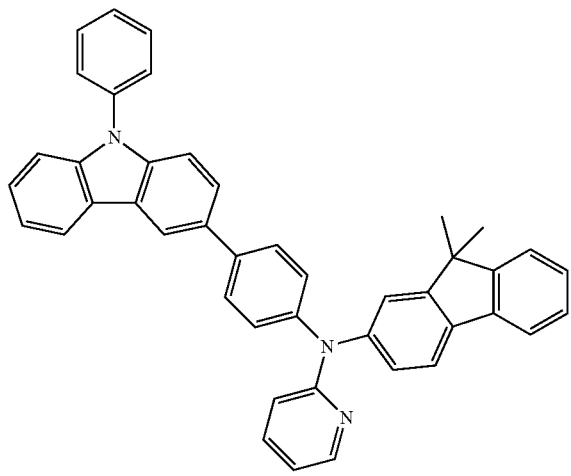
HT13
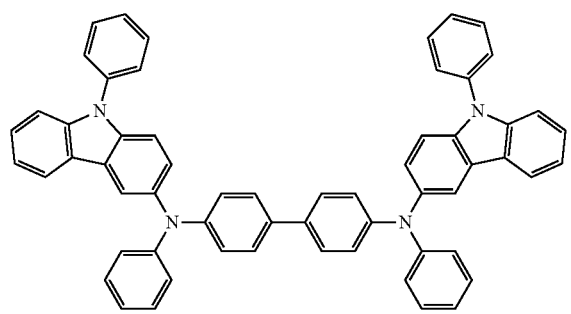
HT14
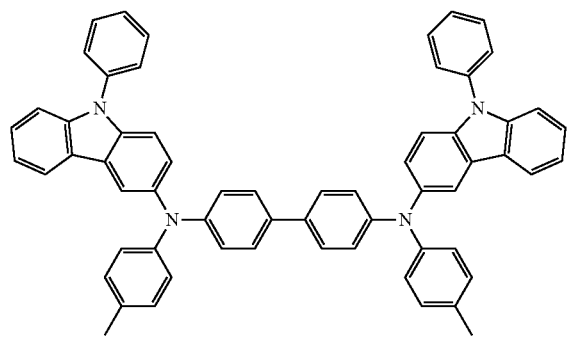
HT15
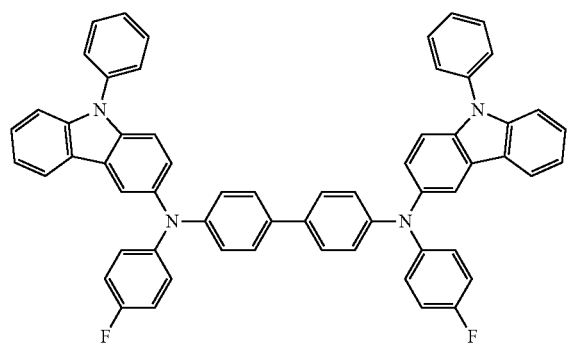
HT16
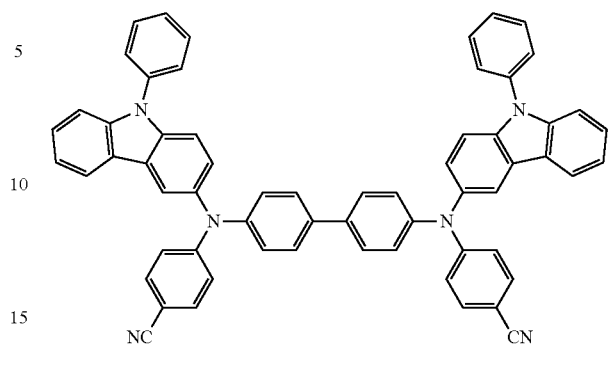
HT17
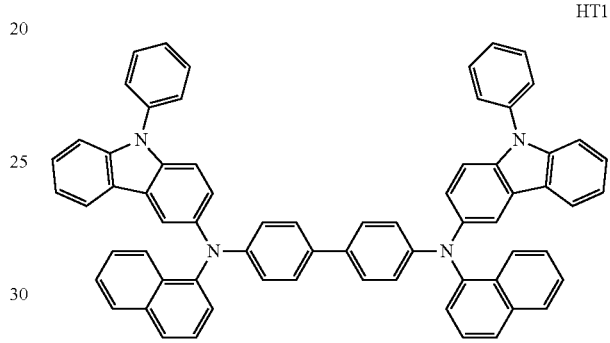
HT18
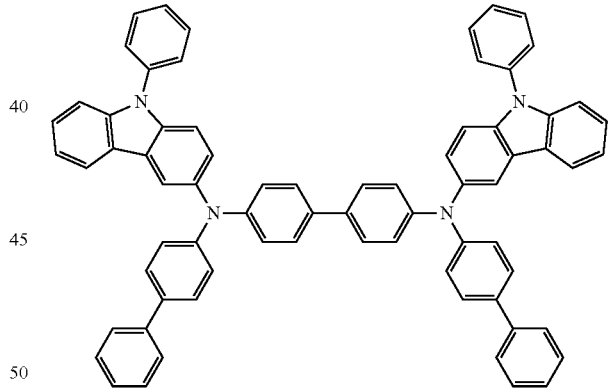
HT19
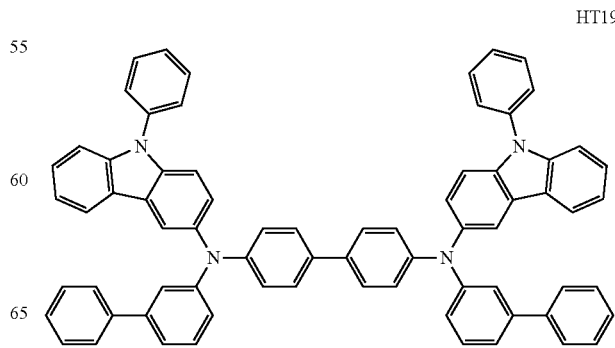

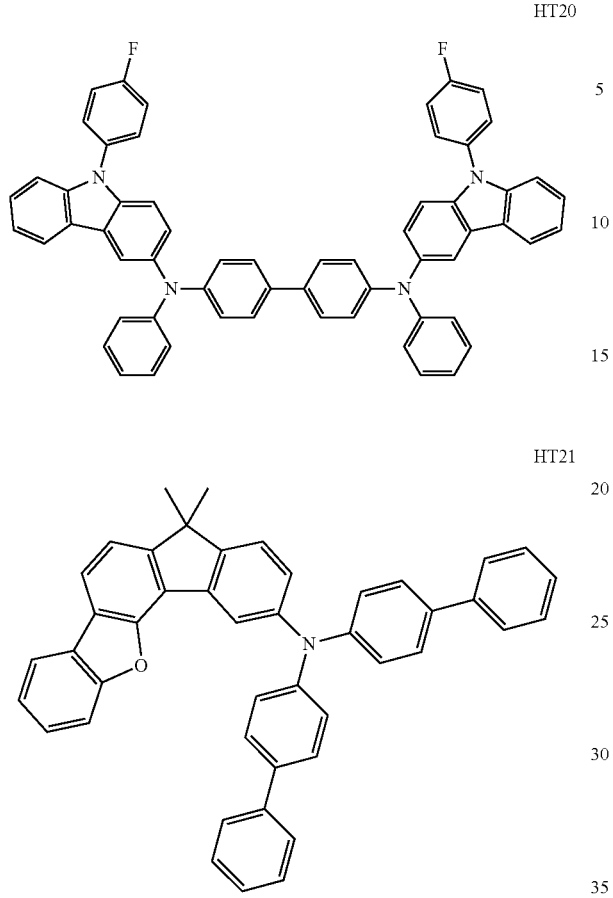

A thickness of the hole transport region may be from about 100 Å to about 10,000 Å, for example, about 100 Å to about 1,000 Å. When the hole transport region includes a hole injection layer, a hole transport layer, an electron blocking layer, or any combination thereof, a thickness of the hole injection layer may be in a range of about 100 Å to about 10000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to the above-described materials, a charge-generation material for the improvement of conductive properties. The charge-generation material may be homogeneously or non-homogeneously dispersed in the hole transport region The charge-generation material may be, for example, a p-dopant. The p-dopant may be a quinone derivative, a metal oxide, a cyano group-containing compound, or any combination thereof. For example, the p-dopant may be a quinone derivative, such as tetracyanoquinonedimethane (TCNQ), 2,3,5,6-tetrafluoro-tetracyano-1,4-benzoquinonedimethane (F4-TCNQ), or F6-TCNNQ; a metal oxide, such as a tungsten oxide or a molybdenum oxide; or a cyano group-containing compound, such as Compound HT-D1; or any combination thereof.

The hole transport region may further include a buffer layer.

The buffer layer may compensate for an optical resonance distance according to a wavelength of light emitted from the emission layer, and thus increase efficiency.

Meanwhile, when the hole transport region includes an electron blocking layer, a material for the electron blocking layer may be materials for the hole transport region described above, materials for a host which will be described later, or any combination thereof. For example, when the hole transport region includes an electron blocking layer, a material for the electron blocking layer may be mCP, which will be explained later, Compound H21, or any combination thereof.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include a host and a dopant, and the dopant may include the organometallic compound represented by Formula 1 described herein.

The host may include TPBi, TBADN, ADN (also referred to as "DNA"), CBP, CDBP, TCP, mCP, Compounds H50, Compound H51, Compound H52, or any combination thereof.

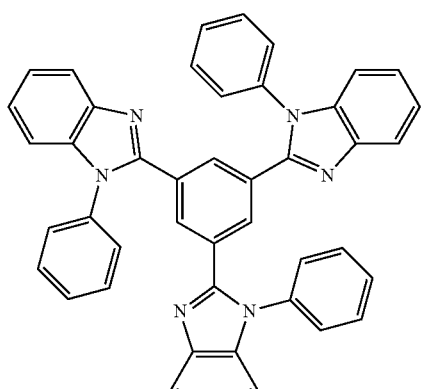
TPBi
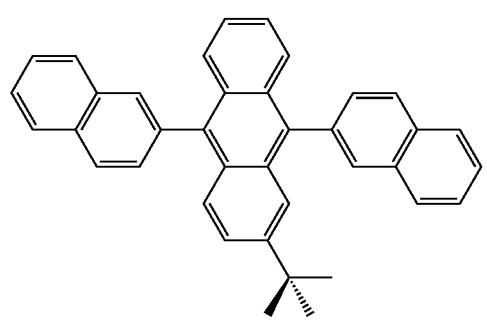
TBADN
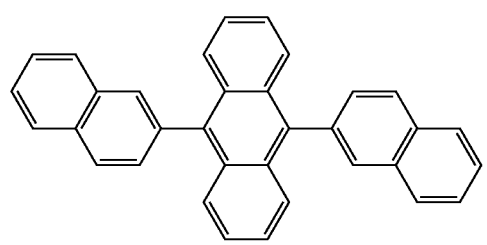
ADN
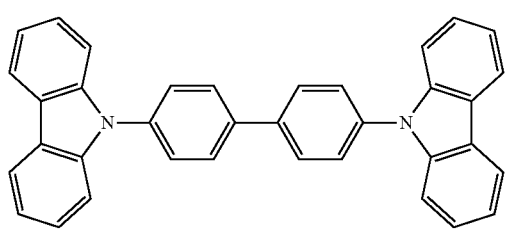
CBP
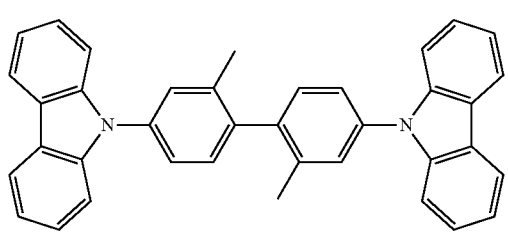
CDBP
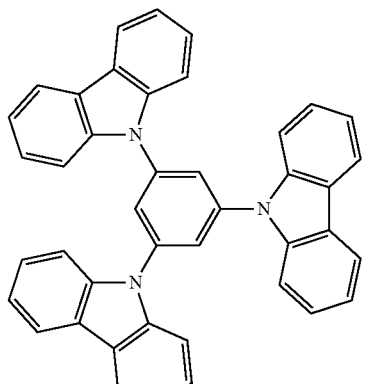
TCP
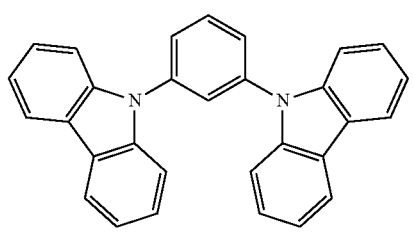
mCP
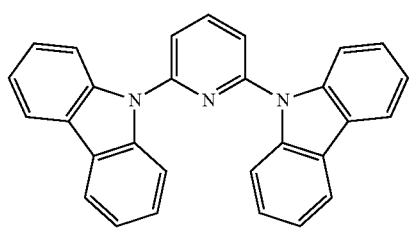
H50
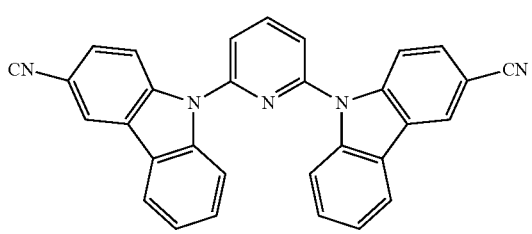
H51

-continued

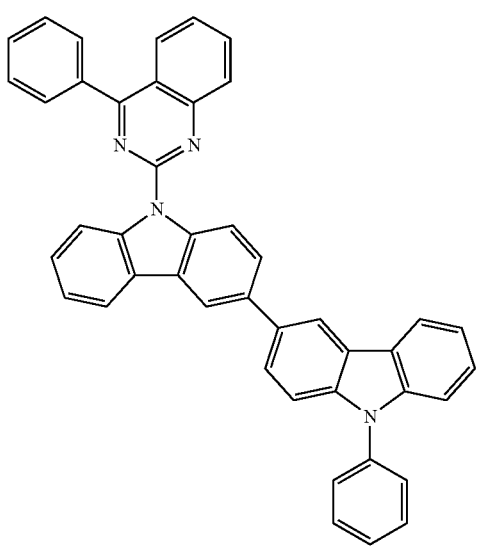
H52

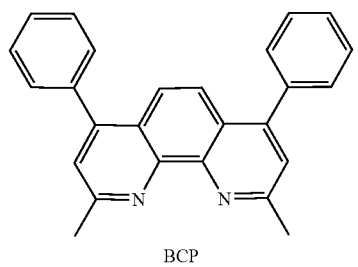
BCP

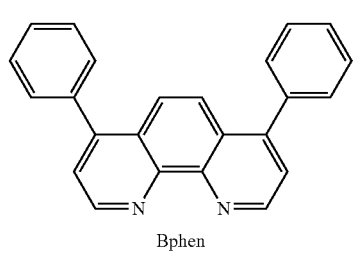
Bphen

When the organic light-emitting device is a full-color organic light-emitting device, the emission layer may be patterned into a red emission layer, a green emission layer, and/or a blue emission layer. In one or more embodiments, due to having a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof.

In one or more embodiment, the hole blocking layer may include the host, materials for an electron transport layer and an electron injection layer, which will be described later, or any combination thereof.

A thickness of the hole blocking layer may be from about 20 Å to about 1,000 Å, for example, about 30 Å to about 600 Å. When the thickness of the hole blocking layer is within these ranges, the hole blocking layer may have excellent hole blocking characteristics without a substantial increase in driving voltage.

The electron transport layer may include BCP, Bphen, TPBi, Alq$_3$, BAlq, TAZ, NTAZ, or any combination thereof.

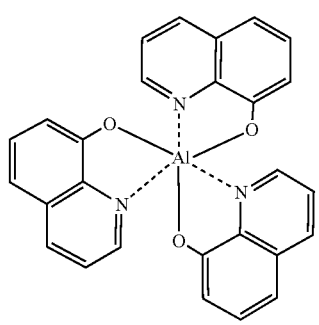
Alq$_3$

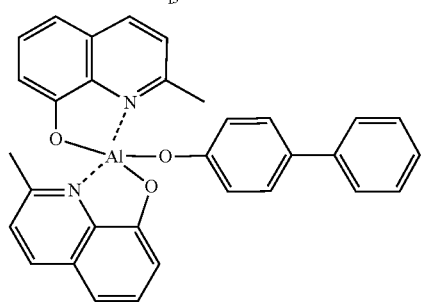
BAlq

-continued
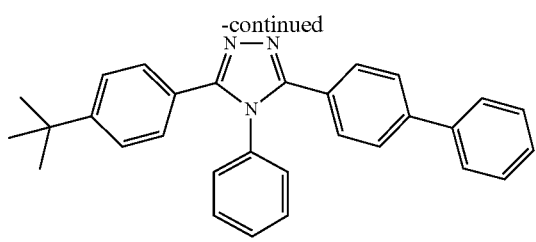
TAZ
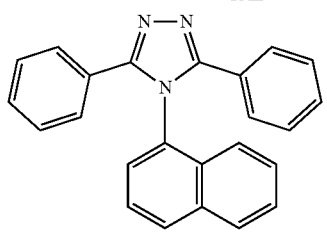
NTAZ
In one or more embodiments, the electron transport layer may include one of Compounds ET1 to ET25, or any combination thereof.
ET1
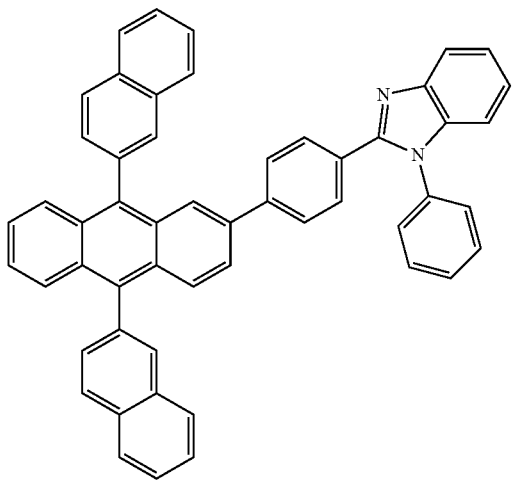
ET2
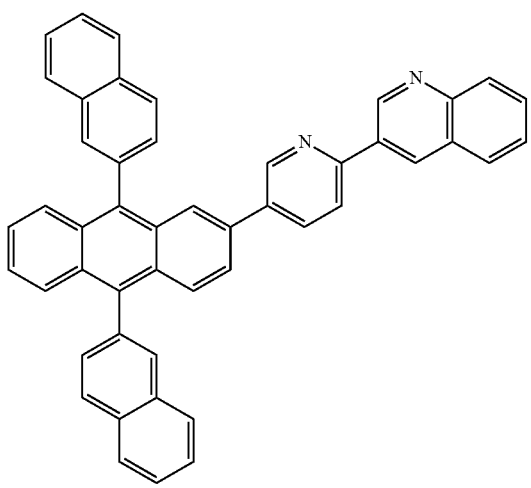
-continued
ET3
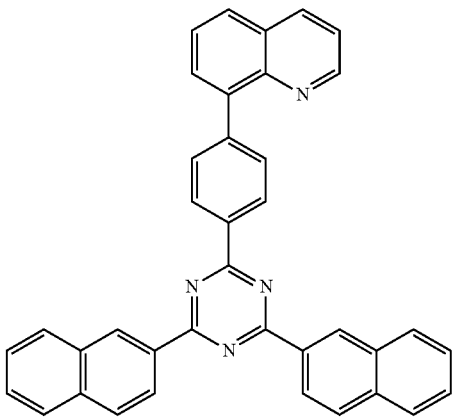
ET4
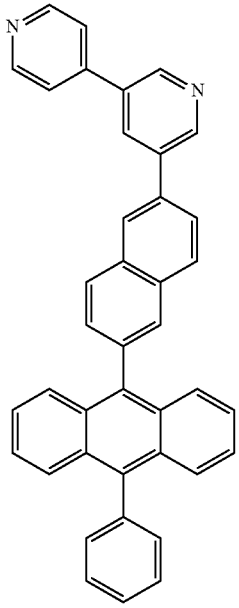
ET5
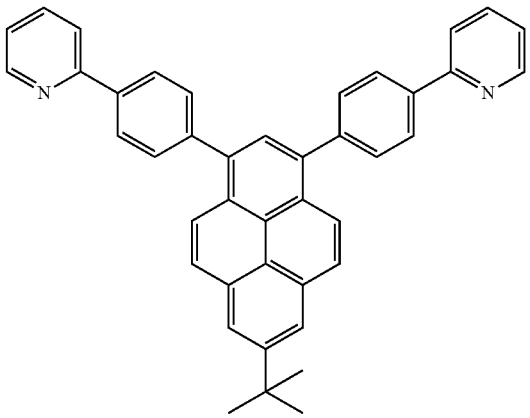

145
-continued
ET6
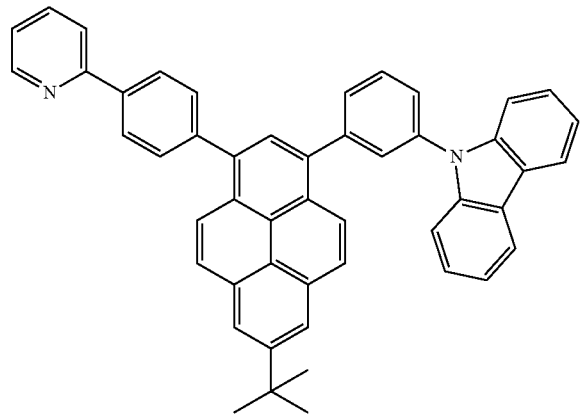
ET7
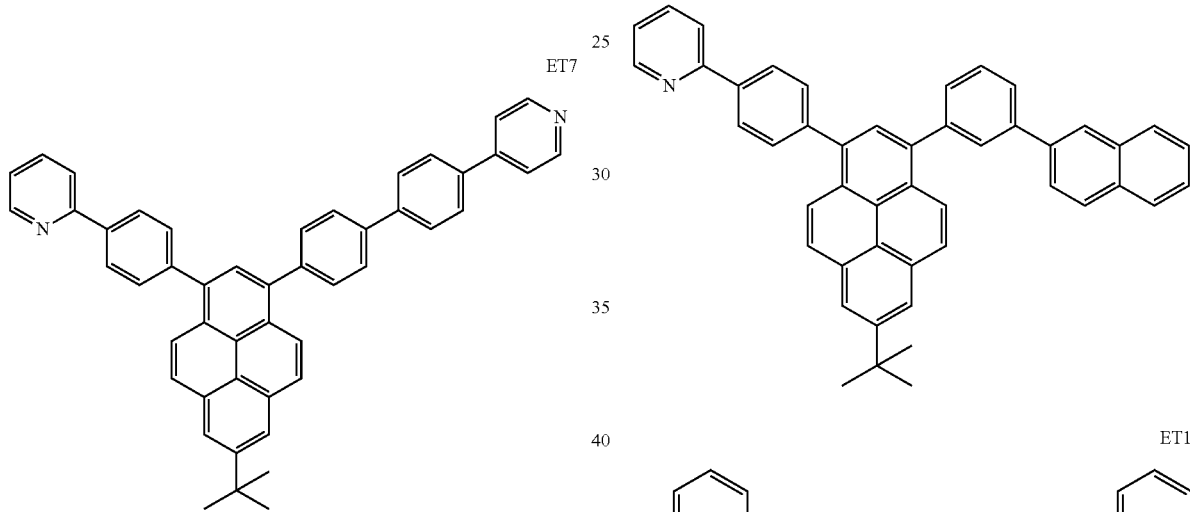
ET8
146
-continued
ET9
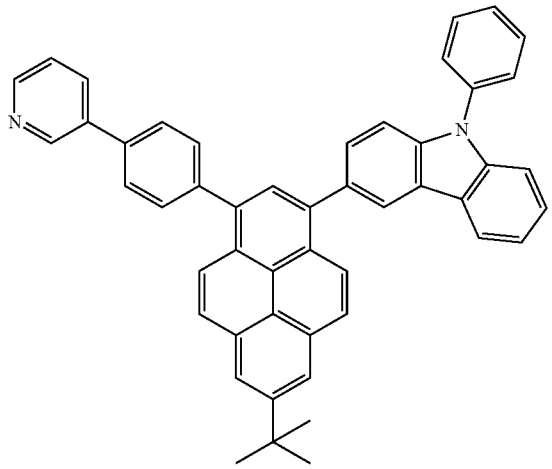
ET10
ET11
ET12
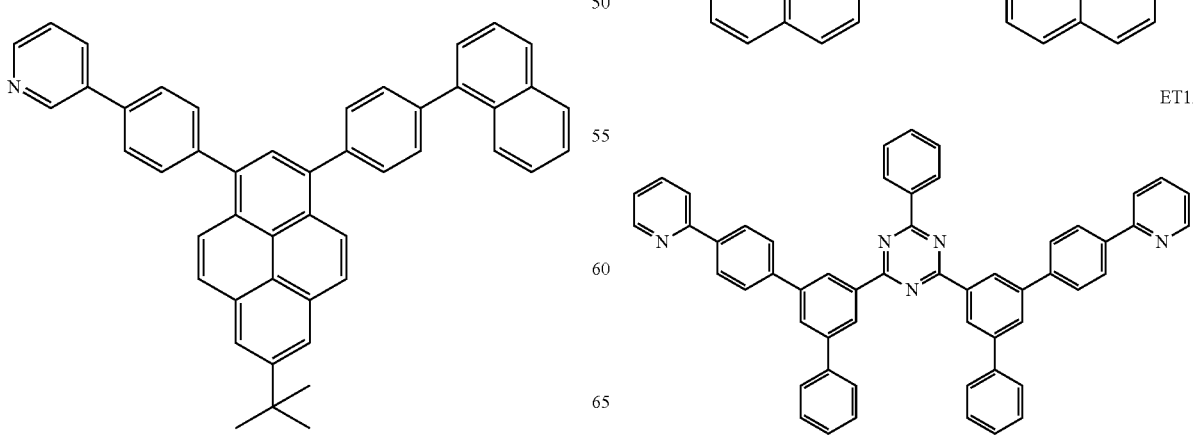

ET13
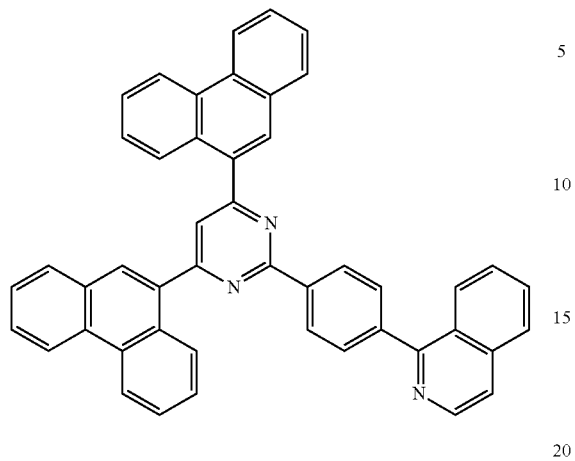
ET16
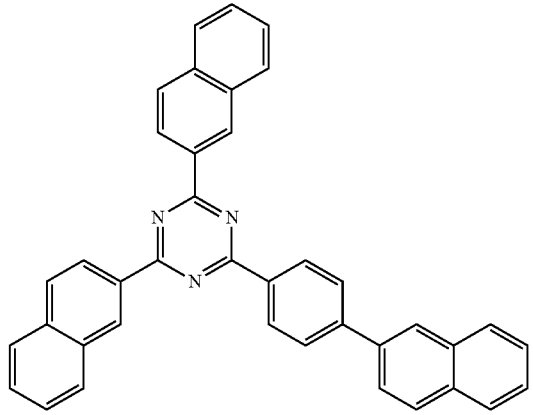
ET14
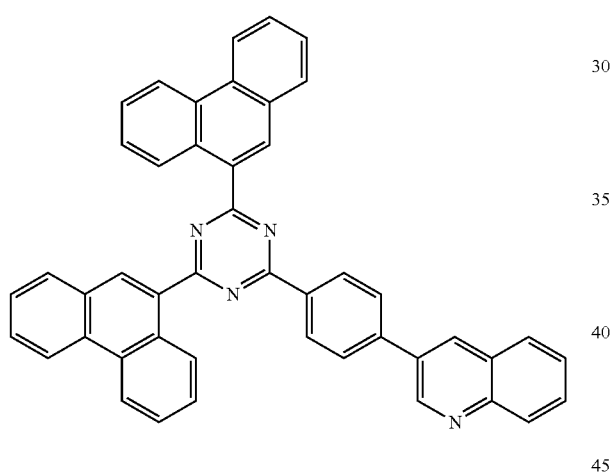
ET17
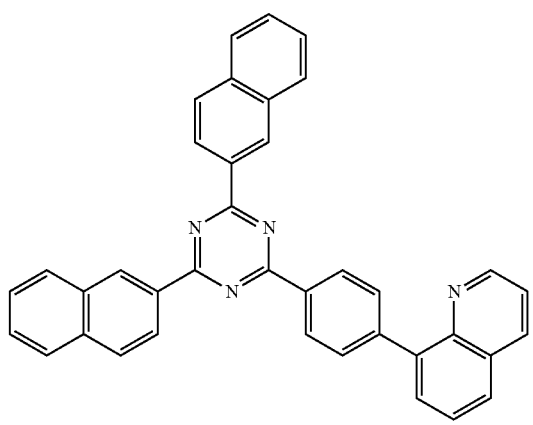
ET15
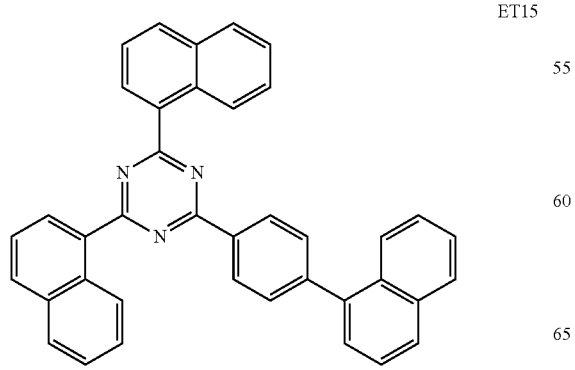
ET18
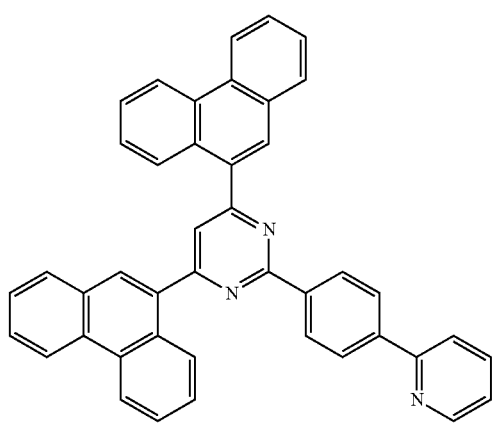

ET19
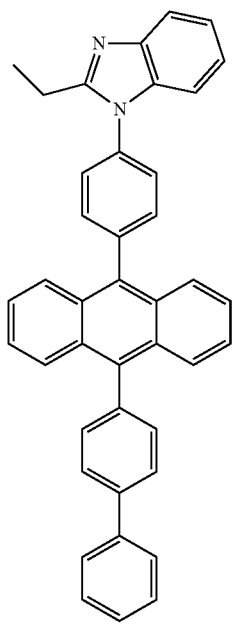
ET20
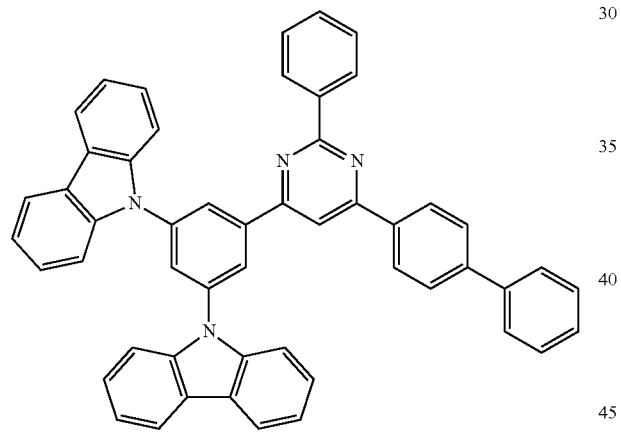
ET21
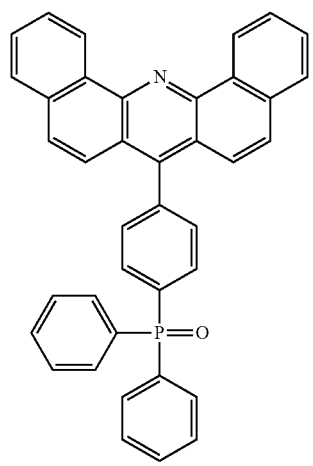
ET22
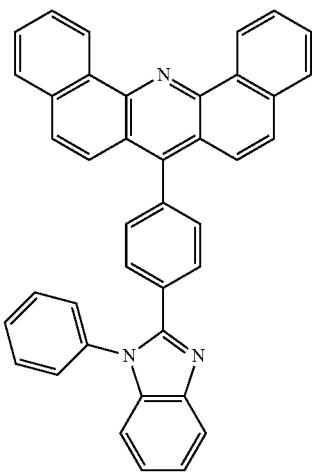
ET23
ET24

ET25

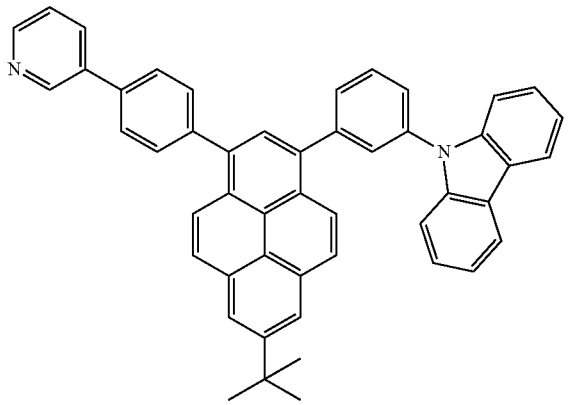

A thickness of the electron transport layer may be from about 100 Å to about 1,000 Å, for example, about 150 Å to about 500 Å. When the thickness of the electron transport layer is within the above-described ranges, the electron transport layer may have satisfactory electron transport characteristics without a substantial increase in driving voltage.

The electron transport layer may further include, in addition to the materials described above, a metal-containing material.

The metal-containing material may include a Li complex. The Li complex may include, for example, Compound ET-D1 (LiQ), Compound ET-D2, or any combination thereof:

ET-D1

ET-D2

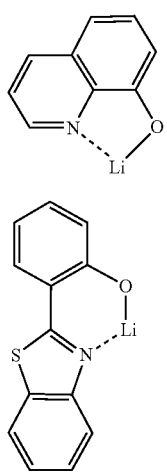

The electron transport region may include an electron injection layer that facilitates flow of electrons from the second electrode 19.

The electron injection layer may include LiF, NaCl, CsF, $Li_2O$, BaO, or any combination thereof.

A thickness of the electron injection layer may be from about 1 Å to about 100 Å, for example, about 3 Å to about 90 Å. When a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may be a metal, an alloy, an electrically conductive compound, or any combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described with reference to FIGURE. However, embodiments are not limited thereto In one or more embodiments, the organic light-emitting device may be included in an electronic apparatus. Accordingly, another aspect provides an electronic apparatus including the organic light-emitting device. For example, the electronic apparatus may be a display, an illuminator, or a sensor.

Another aspect of the present disclosure provides a diagnostic composition including at least one organometallic compounds represented by Formula 1.

The organometallic compound represented by Formula 1 provides high luminescent efficiency. Accordingly, a diagnostic composition including the organometallic compound may have high diagnostic efficiency.

The diagnostic composition may have various applications, for example, in a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Non-limiting examples of the $C_1$-$C_{60}$ alkyl group, the $C_1$-$C_{20}$ alkyl group and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. For example, the group represented by Formula 9-33, as described above, which is a branched $C_6$ alkyl group, may be a tert-butyl group substituted with two methyl groups.

The term "$C_1$-$C_{60}$ alkoxy group" used herein refers to a monovalent group represented by —$OA_{101}$ (wherein $A_{101}$ is a $C_1$-$C_{60}$ alkyl group). Non-limiting examples of the $C_1$-$C_{60}$ alkoxy group, the $C_1$-$C_{20}$ alkoxy group, or the $C_1$-$C_{10}$ alkoxy group may include a methoxy group, an ethoxy group, a propoxy group, a butoxy group, and a pentoxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group.

The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Non-limiting examples of the $C_3$-$C_{10}$ cycloalkyl group include a cyclopropyl group, a cyclobutyl group, a cyclopentyl group, a cyclohexyl group, a cycloheptyl group, a cyclooctyl group, an adamantyl group, a bicyclo[1.1.1] pentyl group, a bicyclo[2.1.1]hexyl group, a bicyclo[2.2.1] heptyl group(a norbornyl group), and a bicyclo[2.2.2]octyl group.

The term "$C_1$-$C_{10}$ heterocycloalkyl group" as used herein refers to a monovalent monocyclic group having 1 to 10 carbon atoms and including, as a ring-forming atom, at least one of N, O, P, Si, and S. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group herein may include a silolanyl group, a silinanyl group, a tetrahydrofuranyl group, a tetrahydro-2H-pyranyl group, a tetrahydrothiophenyl group.

The term "$C_3$-$C_{10}$ cycloalkenyl group" as used herein refers to a monovalent monocyclic group having 3 to 10 carbon atoms and at least one carbon-carbon double bond in the ring thereof but no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group having 1 to 10 carbon atoms and including, as a ring-forming atom, at least one of N, O, P, Si, S, or any combination thereof, and at least one double bond in the ring thereof. Non-limiting examples of the $C_2$-$C_{10}$ heterocycloalkenyl group include a 2,3-dihydrofuranyl group and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having 1 to 60 carbon atoms and including, as a ring-forming atom, at least one of N, O, P, Si, Se, Ge, B, S, or any combination thereof.

The term "$C_1$-$C_{60}$ heteroarylene group" as used herein refers to a divalent group having a heterocyclic aromatic system having 1 to 60 carbon atoms and including, as a ring-forming atom, at least one N, O, P, Si, Se, Ge, B, S, or any combination thereof. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" used herein indicates —$OA_{102}$ (wherein $A_{102}$ is a $C_6$-$C_{60}$ aryl group as described above), the term "$C_6$-$C_{60}$ arylthio group" used herein indicates —$SA_{103}$ (wherein $A_{103}$ is a $C_6$-$C_{60}$ aryl group as described above), and the term "$C_1$-$C_{60}$ alkylthio group" used herein indicates —$SA_{104}$ (wherein $A_{104}$ indicates a $C_1$-$C_{60}$ alkyl group as described above).

The term "monovalent non-aromatic condensed polycyclic group" as used herein refers to a monovalent group (for example, having 8 to 60 carbon atoms) having two or more rings condensed to each other, and only carbon atoms as ring-forming atoms, and in which the whole molecular structure has no aromaticity. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, and including as ring-forming atoms, in addition to carbon atoms, at least one heteroatom selected from N, O, P, Si, Se, Ge, B, S, or any combination thereof and in which the whole molecular structure has no aromaticity. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group. The term "$C_5$-$C_{30}$ carbocyclic group (unsubstituted or substituted with at least one $R_{1a}$)" may include, for example, an adamantane group, a norbornene group, a bicyclo[1.1.1]pentane group, a bicyclo[2.1.1]hexane group, a bicyclo[2.2.1]heptane group(norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a silole group, and a fluorene group (which are each unsubstituted or substituted with at least one $R_{1a}$).

The term "$C_1$-$C_{30}$ heterocyclic group" as used herein refers to a saturated or unsaturated cyclic group having, as ring-forming atoms, in addition to 1 to 30 carbon atoms, at least N, O, P, Si, Se, Ge, B, S, or any combination thereof. The $C_1$-$C_{30}$ heterocyclic group may be a monocyclic group or a polycyclic group. The "$C_1$-$C_{30}$ heterocyclic group (unsubstituted or substituted with at least one $R_{1a}$)" may be, for example, a thiophene group, a furan group, a pyrrole group, a silole group, a borole group, a phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazol group, a benzopyrazole group, a benzimidazole group, a benzoxazole group, a benzothiazole group, a benzoxadiazole group, a benzothiadiazol group, a 5,6,7,8-tetrahydroisoquinoline group, or a 5,6,7,8-tetrahydroquinoline group, (which are each unsubstituted or substituted with at least one $R_{1a}$).

The terms "fluorinated $C_1$-$C_{60}$ alkyl group (or a fluorinated $C_1$-$C_{20}$ alkyl group, etc.)," "fluorinated $C_3$-$C_{10}$ cycloalkyl group," "fluorinated $C_1$-$C_{10}$ heterocycloalkyl group," and "fluorinated phenyl group" as used herein, refer to, respectively a $C_1$-$C_{60}$ alkyl group, a $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The term "fluorinated $C_1$-$C_{60}$ alkyl group (or fluorinated $C_1$-$C_{20}$ alkyl group, etc.)," "fluorinated $C_3$-$C_{10}$ cycloalkyl group", "fluorinated $C_1$-$C_{10}$ heterocycloalkyl group", or "fluorinated phenyl group" may be, i) a fully fluorinated $C_1$-$C_{60}$ alkyl group (or a fully fluorinated $C_1$-$C_{20}$ alkyl group, etc.), a fully fluorinated $C_3$-$C_{10}$ cycloalkyl group, a fully fluorinated $C_1$-$C_{10}$ heterocycloalkyl group, a fully fluorinated phenyl group, all the hydrogens in each group substituted with fluoro groups, or ii) a partially fluorinated $C_1$-$C_{60}$ alkyl group (or partially fluorinated $C_1$-$C_{20}$ alkyl group, etc.), a partially fluorinated $C_3$-$C_{10}$ cycloalkyl group, a partially fluorinated $C_1$-$C_{10}$ heterocycloalkyl group, or partially fluorinated phenyl group, all the hydrogens in each group partially, i.e., not fully, substituted with fluoro groups.

The terms "deuterated $C_1$-$C_{60}$ alkyl group (or deuterated $C_1$-$C_{20}$ alkyl group, etc.)", "deuterated $C_3$-$C_{10}$ cycloalkyl group", "deuterated $C_1$-$C_{10}$ heterocycloalkyl group," and "deuterated phenyl group" as used herein may refer to, respectively, a $C_1$-$C_{60}$ alkyl group (or a $C_1$-$C_{20}$ alkyl group, etc.), a $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. An example of the "deuterated $C_3$-$C_{10}$ cycloalkyl group" may be the group represented by Formula 10-501 as described above. The terms "deuterated $C_1$-$C_{60}$ alkyl group (or deuterated $C_1$-$C_{20}$ alkyl group, etc.)," "deuterated $C_3$-$C_{10}$ cycloalkyl group", "deuterated $C_1$-$C_{10}$ heterocycloalkyl group", or "deuterated phenyl group" may be i) a fully deuterated $C_1$-$C_{60}$ alkyl group (or fully a deuterated $C_1$-$C_{20}$ alkyl group, etc.), a fully deuterated $C_3$-$C_{10}$ cycloalkyl group, a fully deuterated $C_1$-$C_{10}$ heterocycloalkyl group, or a fully deuterated phenyl group, all the hydrogens in each group substituted with deuterium, or ii) a partially deuterated $C_1$-$C_{60}$ alkyl group (or partially deuterated $C_1$-$C_{20}$ alkyl group, etc.), a partially deuterated $C_3$-$C_{10}$ cycloalkyl group, a partially deuterated $C_1$-$C_{10}$ heterocycloalkyl group, or a partially deuterated phenyl group, all the hydrogens in each group partially, not fully, substituted with deuterium.

The term "($C_1$-$C_{20}$ alkyl) 'X' group" used herein refers to an 'X' group substituted with at least one $C_1$-$C_{20}$ alkyl group. For example, the term "($C_1$-$C_{20}$ alkyl)$C_3$-$C_{10}$ cycloalkyl group" as used herein indicates a $C_3$-$C_{10}$ cycloalkyl group substituted with at least one $C_1$-$C_{20}$ alkyl group, and the term "($C_1$-$C_{20}$ alkyl)phenyl group" indicates a phenyl group substituted with at least one $C_1$-$C_{20}$ alkyl group. For example, the ($C_1$ alkyl)phenyl group may be a toluyl group.

As used herein, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group may refer to hetero rings having the same backbone as an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group, respectively, at least one of the carbons forming the ring of each group substituted with nitrogen.

A substituent(s) of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group or $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof.

As used herein, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, compounds and organic light-emitting devices according to embodiments will now be described in detail with reference to synthesis examples and examples. However, these examples are only for illustrative purposes and are not intended to limit the scope of the one or more embodiments of the present disclosure. The wording "B was used instead of A" used in describing synthesis examples means that the amount of A used was identical to the amount of B used, in terms of a molar equivalent.

EXAMPLES

Synthesis Example 1 (Compound 2)

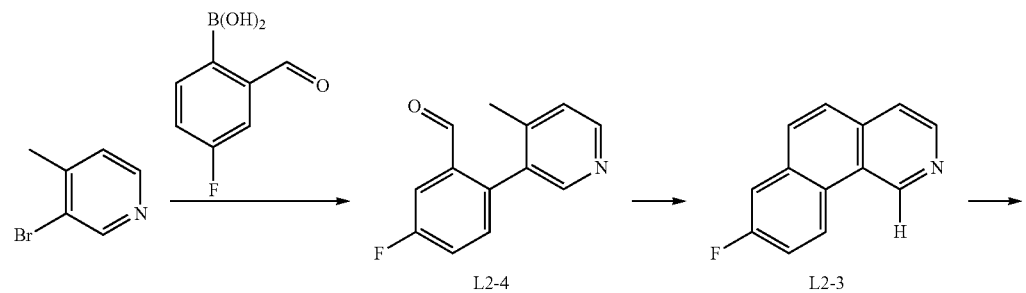

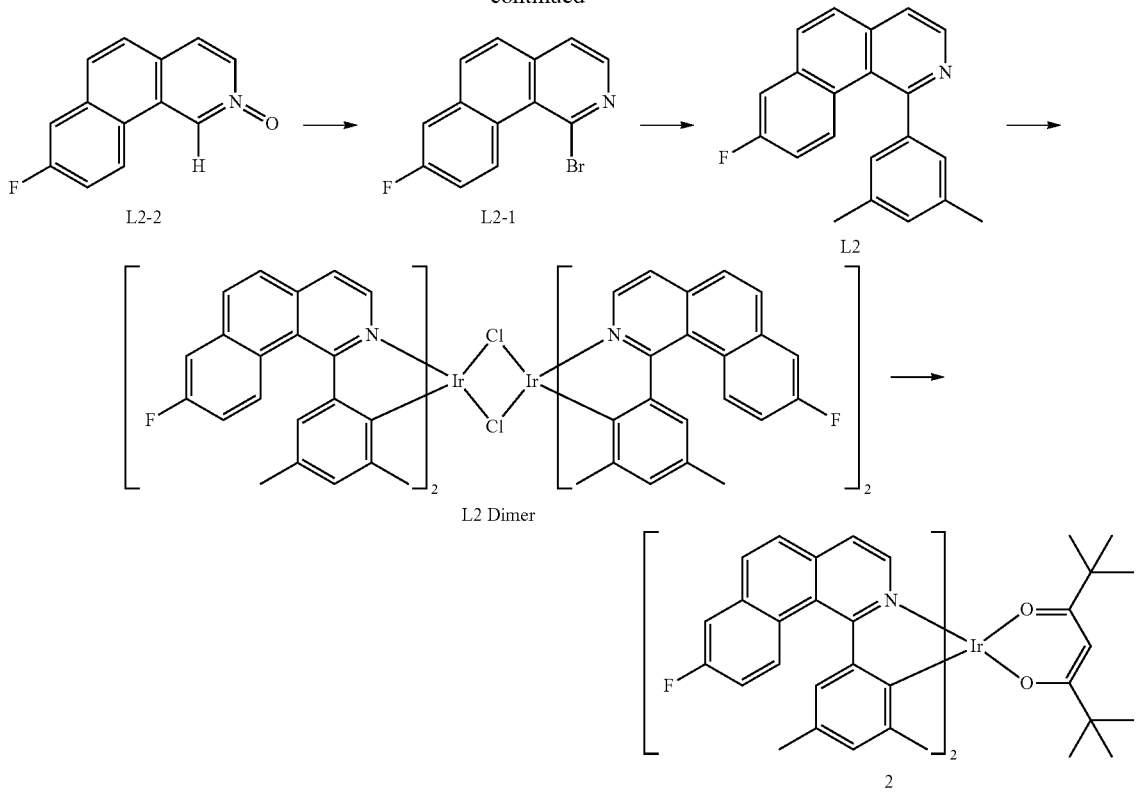

Synthesis of Compound L2-4

5 g (29.1 mmol) of 3-bromo-4-methylpyridine was mixed with 60 mL of acetonitrile and 15 mL of water, and then 1.43 g (2.04 mmol) of $PdCl_2(PPh_3)_2$, 4.88 g (29.1 mmol) of (4-fluoro-2-formylphenyl)boronic acid, and 10.04 g (72.8 mmol) of $K_2CO_3$ were added thereto and heated under reflux at 80° C. for 18 hours. After the reaction was completed, the reaction mixture was concentrated under reduced pressure and then extracted with dichloromethane and water to obtain an organic phase. The obtained organic phase was dried with magnesium sulfate, distilled under reduced pressure, and then purified by liquid chromatography to obtain 5.13 g of Compound L2-4 (Yield: 82%).

HRMS(MALDI) calcd for $C_{13}H_{10}FNO$: m/z 215.0746, Found: 215.0747

Synthesis of Compound L2-3

5.13 g (23.8 mmol) of Compound L2-4 was mixed with 70 mL of dimethylformamide (DMF). After a solution of 3.49 g (47.6 mmol) of t-BuOK dissolved in 10 mL of DMF was slowly dropwise added to the mixture and then stirred at room temperature for 24 h. After the reaction was completed, the reaction mixture was concentrated under reduced pressure and then extracted with dichloromethane and water to obtain an organic phase. The obtained organic phase was dried with magnesium sulfate, distilled under reduced pressure, and then purified by liquid chromatography to obtain 3.57 g of Compound L2-3 (Yield: 76%).

HRMS(MALDI) calcd for $C_{13}H_8FN$: m/z 197.0641, Found: 197.0642

Synthesis of Compound L2-2

After 3.57 g (18.1 mmol) of Compound L2-3 was dissolved in 60 mL of $CH_2Cl_2$, meta-cholorperoxybenzoic acid (mCPBA) was slowly dropwise added at 0° C. thereto and then stirred for 24 h. After the reaction was completed, the reaction mixture was extracted with 6N KOH to obtain an organic phase. The obtained organic phase was dried using magnesium sulfate, distilled under reduced pressure, and then purified by liquid chromatography to obtain 3.67 g of Compound L2-2 (Yield: 95%).

Synthesis of Compound L2-1

After 3.67 g (17.2 mmol) of Compound L2-2 was mixed with 80 mL of $CH_2Cl_2$, 5.68 g (19.8 mmol) of $POBr_3$ was slowly dropwise added at 0° C. thereto, and then 0.3 mL of DMF was added thereto and stirred at room temperature for 24 h. After the reaction was completed, the reaction mixture was extracted with saturated sodium bicarbonate to obtain an organic phase. The obtained organic phase was dried using magnesium sulfate, distilled under reduced pressure, and then purified by liquid chromatography to obtain 3.23 g of Compound L2-1 (Yield: 68%).

HRMS(MALDI) calcd for $C_{13}H7BrFN$: m/z 274.9746, Found: 274.9747

Synthesis of Compound L2

After 3.23 g (11.7 mmol) of Compound L2-1 was mixed with 45 mL of THF and 15 mL of water, 1.93 g (12.9 mmol) of 3,5-dimethylphenylboronic acid, 1.23 g (0.82 mmol) of $Pd(PPh_3)_4$, and 4.04 g (29.3 mmol) of $K_2CO_3$ were added thereto and then heated under reflux at 75° C. for 24 h. After the reaction was completed, the reaction mixture was extracted with ethyl acetate and water to obtain an organic phase. The obtained organic phase was dried using magnesium sulfate, distilled under reduced pressure, and then purified by liquid chromatography to obtain 2.61 g of Compound L2 (Yield: 74%).

HRMS(MALDI) calcd for $C_{21}H_{16}FN$: m/z 301.1267, Found: 301.1268.

Synthesis of Compound L2 Dimer 2.00 g (6.6 mmol) of Compound L2 and 1.11 g (3.1 mmol) of iridium chloride were mixed with 40 mL of ethoxyethanol and 15 mL of distilled water, and then heated under reflux for 24 hours. After the reaction was completed, the temperature was lowered to room temperature to obtain a solid product. This solid product was filtered and then washed sufficiently with water, methanol, and then hexane. The obtained solid was dried in a vacuum oven to obtain 2.4 g of Compound L2 Dimer.

Synthesis of Compound 2

2.4 g (1.45 mmol) of Compound L2 Dimer, 1.33 g (7.25 mmol) of 2,2,6,6-tetramethylheptane-3,5-dione, and 0.76 g (7.25 mmol) of $Na_2CO_3$ were mixed with 40 mL of ethoxyethanol, and then stirred at 90° C. for 24 hours to allow reaction. After the reaction was completed, the temperature was lowered to room temperature to obtain a solid product. The solid product produced by lowering the temperature to room temperature was filtered and then purified by liquid chromatography to obtain 1.56 g of Compound 2 (Yield: 55%).

HRMS(MALDI) calcd for $C_{53}H_{49}F_2FIrN_2O_2$: m/Z 976.3391, Found: 976.3393.

Synthesis Example 2 (Compound 10)

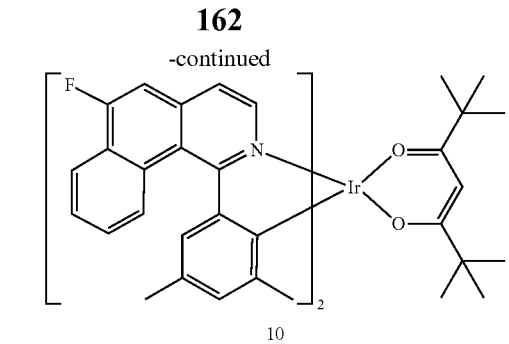

10

Synthesis of Compound L10

1.50 g of Compound L10 (Yield: 76%) was obtained in the same manner as in the synthesis method of Compound L2 of Synthesis Example 1, except that Compound L10-1 (1-bromo-6-fluorobenzo[h]isoquinoline) was used instead of Compound L2-1.

HRMS(MALDI) calcd for $C_{21}H_{16}FN$: m/z 301.3644, Found: 301.3646 Synthesis of Compound L10 Dimer 1.82 g of Compound L10 Dimer was obtained in the same manner as in the synthesis method of Compound L2 Dimer of Synthesis Example 1, except that Compound L10 was used instead of Compound L2.

Synthesis of Compound 10

1.10 g of Compound 10 (Yield: 52.0%) was obtained in the same manner as in the synthesis method of Compound 2 of Synthesis Example 1, except that Compound L10 Dimer was used instead of Compound L2 Dimer.

HRMS(MALDI) calcd for $C_{53}H_{49}F_2IrN_2O_2$: m/Z 976.2008, Found: 976.2009.

Synthesis Example 3 (Compound 11)

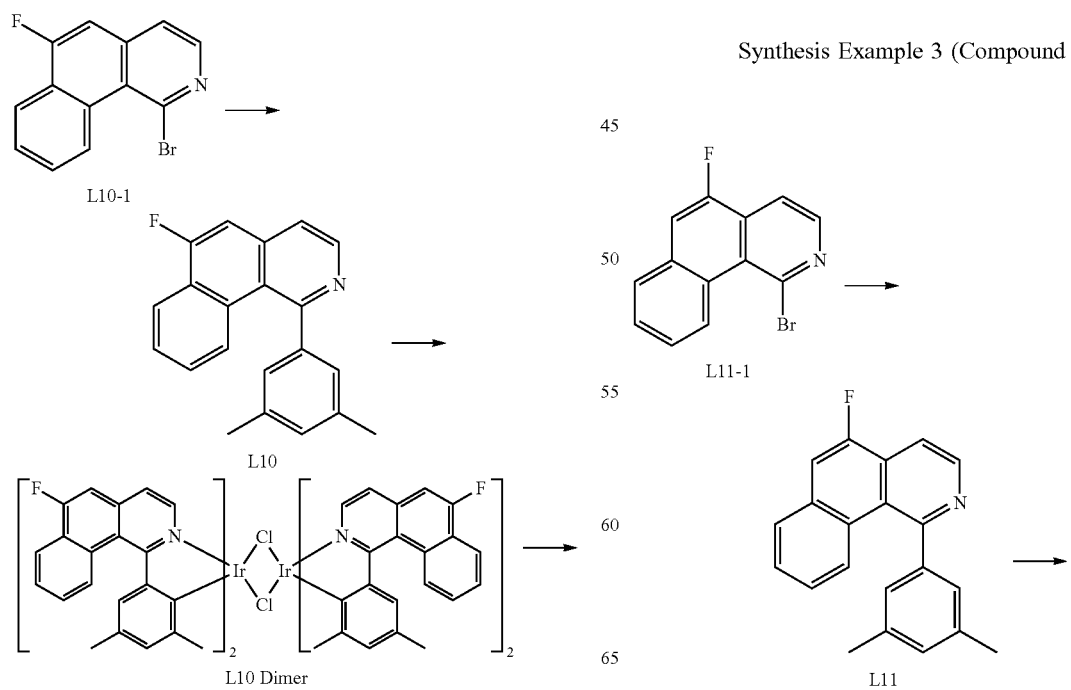

-continued

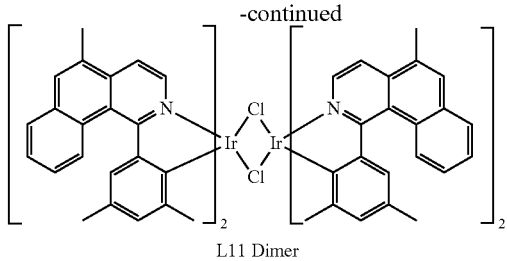

L11 Dimer

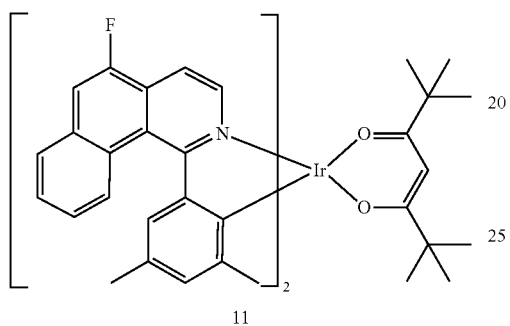

11

Synthesis of Compound L11

1.42 g of Compound L11 (Yield: 77%) was obtained in the same manner as in the synthesis method of Compound L2 of Synthesis Example 1, except that Compound L11-1 (1-bromo-7-fluorobenzo[h]isoquinoline) was used instead of Compound L2-1.

HRMS(MALDI) calcd for $C_{21}H_{16}FN$: m/z 301.3644, Found: 301.3645.

Synthesis of Compound L11 Dimer 1.70 g of Compound 11 Dimer was obtained in the same manner as in the synthesis method of Compound L2 Dimer of Synthesis Example 1, except that Compound L11 was used instead of Compound L2.

Synthesis of Compound 11

0.98 g of Compound 11 (Yield: 49.0%) was obtained in the same manner as in the synthesis method of Compound 2 of Synthesis Example 1, except that Compound L11 Dimer was used instead of Compound L2 Dimer.

HRMS(MALDI) calcd for $C_{53}H_{49}F_2IrN_2O_2$: m/Z 976.2008, Found: 976.2008.

Synthesis Example 4 (Compound 22)

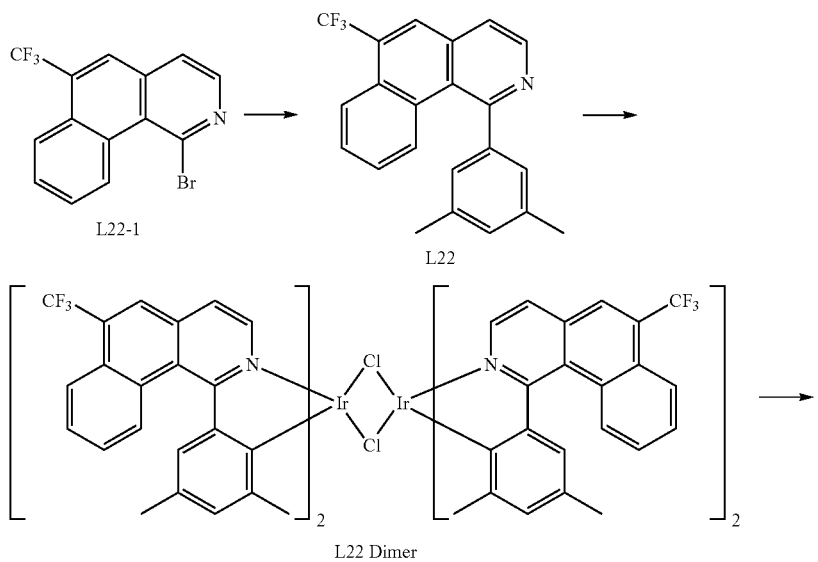

L22-1    L22

L22 Dimer

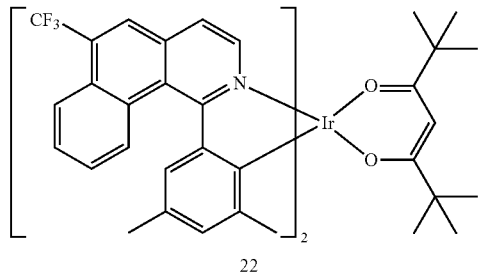

22

Synthesis of Compound L22

1.65 g of Compound L22 (Yield: 64.0%) was obtained in the same manner as in the synthesis method of Compound L2 of Synthesis Example 1, except that Compound L22-1 was used instead of Compound L2-1.

HRMS(MALDI) calcd for $C_{22}H_{16}F_3N$: m/Z 351.3722, Found: 351.3724.

Synthesis of Compound L22 Dimer 1.62 g of Compound L22 Dimer was obtained in the same manner as in the synthesis method of Compound L2 Dimer of Synthesis Example 1, except that Compound L22 was used instead of Compound L2.

Synthesis of Compound 22

0.71 g of Compound 22 (Yield: 40%) was obtained in the same manner as in the synthesis method of Compound 2 of Synthesis Example 1, except that Compound L22 Dimer was used instead of Compound L2 Dimer.

HRMS(MALDI) calcd for $C_{55}H_{49}F_6IrN_2O_2$: m/Z 1076.2164, Found: 1076.2166.

Synthesis Example 5 (Compound 41)

Synthesis of Compound L41

2.10 g of Compound L41 (Yield: 78%) was obtained in the same manner as in the synthesis method of Compound L2 of Synthesis Example 1, except that Compound L41-1 was used instead of Compound L2-1.

HRMS(MALDI) calcd for $C_{24}H_{22}FN$: m/z 343.4454, Found: 343.445.

Synthesis of Compound L41 Dimer 2.2 g of Compound L41 Dimer was obtained in the same manner as in the synthesis method of Compound L2 Dimer of Synthesis Example 1, except that Compound L41 was used instead of Compound L2.

Synthesis of Compound 41

1.44 g of Compound 41 (Yield: 55.0%) was obtained in the same manner as in the synthesis method of Compound 2 of Synthesis Example 1, except that Compound L41 Dimer and 3,7-diethylnonane-4,6-dione were used instead of Compound L2 Dimer and 2,2,6,6-tetramethylheptane-3,5-dione, respectively.

HRMS(MALDI) calcd for $C_{61}H_{65}F_2IrN_2O_2$: m/Z 1088.4168, Found: 1088.4169.

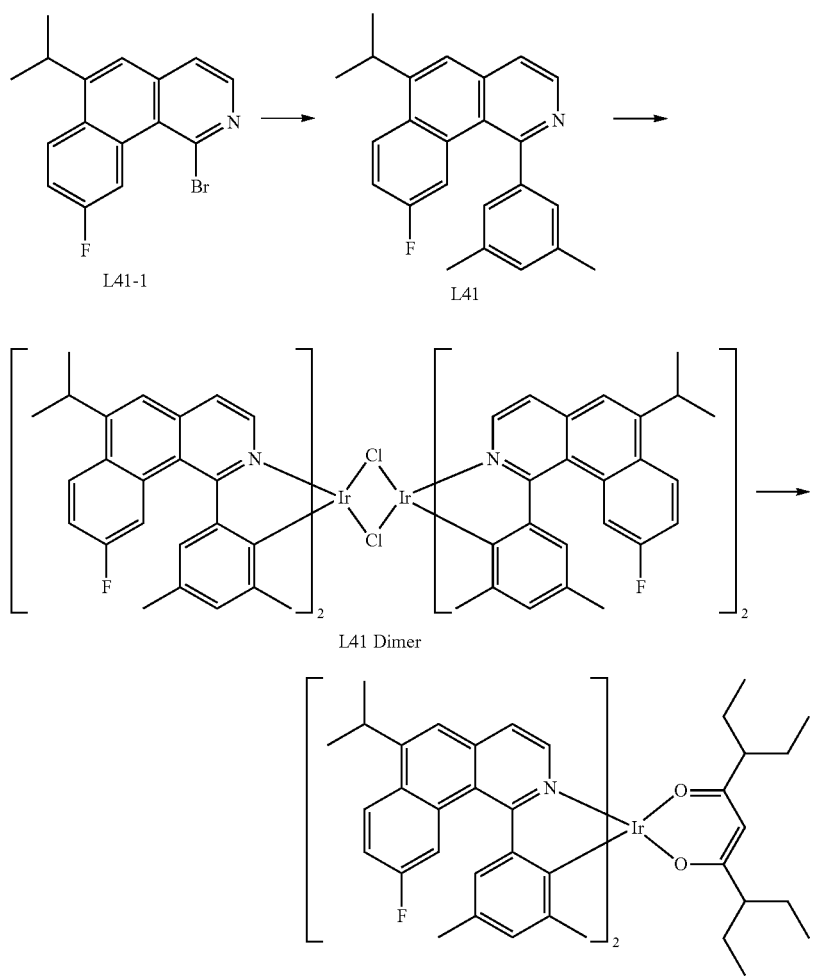

Synthesis Example 6 (Compound 42)
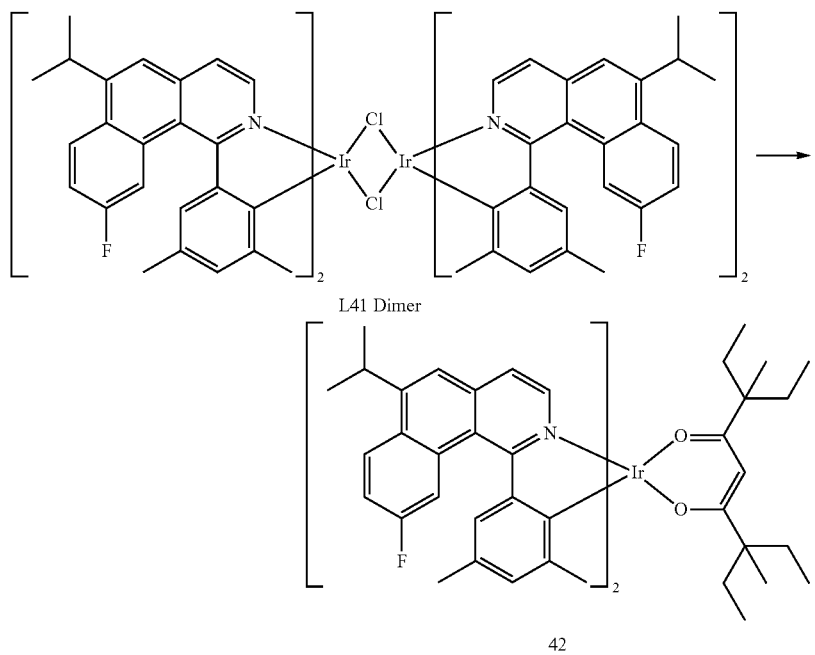
1.58 g of Compound 42 (Yield: 52.0%) was obtained in the same manner as in the synthesis method of Compound 2 of Synthesis Example 1, except that Compound L41 Dimer and 3,7-diethyl-3,7-dimethylnonane-4,6-dione were used instead of Compound L2 Dimer and 2,2,6,6-tetramethylheptane-3,5-dione, respectively.
HRMS(MALDI) calcd for $C_{63}H_{69}F_2IrN_2O_2$: m/Z 1116.4708, Found: 1116.4709.
Synthesis Example 7 (Compound 56)
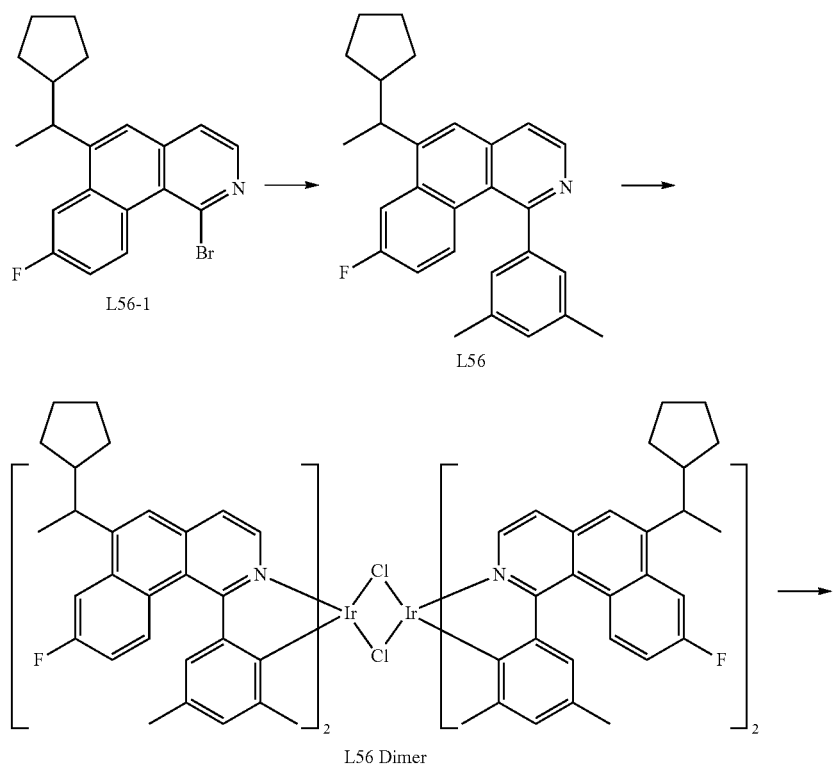

-continued

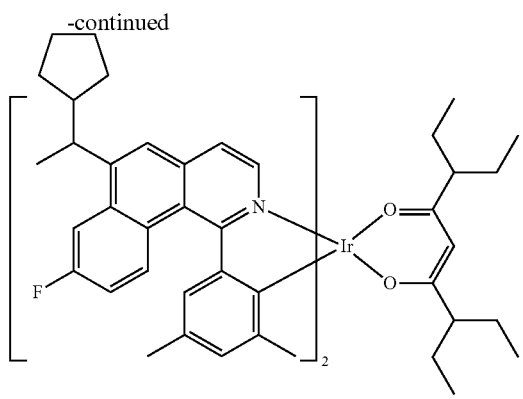

56

Synthesis of Compound L56

1.65 g of Compound L56 (Yield: 68.0%) was obtained in the same manner as in the synthesis method of Compound L2 of Synthesis Example 1, except that Compound L56-1 was used instead of Compound L2-1.

HRMS(MALDI) calcd for $C_{28}H_{28}FN$: m/z 397.5374, Found: 397.5375.

Synthesis of Compound L56 Dimer 1.70 g of Compound L56 Dimer was obtained in the same manner as in the synthesis method of Compound L2 Dimer of Synthesis Example 1, except that Compound L56 was used instead of Compound L2.

Synthesis of Compound 56

0.78 g of Compound 56 (Yield: 39.0%) was obtained in the same manner as in the synthesis method of Compound 2 of Synthesis Example 1, except that Compound L56 Dimer and 3,7-diethylnonane-4,6-dione were used instead of Compound L2 Dimer and 2,2,6,6-tetramethylheptane-3,5-dione, respectively.

HRMS(MALDI) calcd for $C_{69}H_{77}F_2IrN_2O_2$: m/z 1196.6008, Found: 1196.6009.

Synthesis Example 8 (Compound 57)

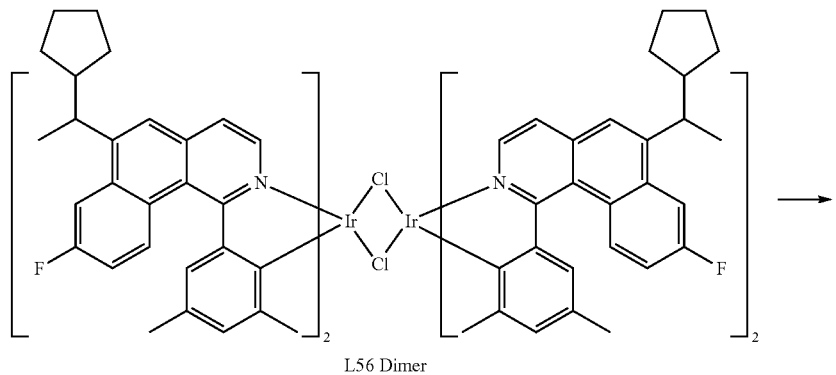

L56 Dimer

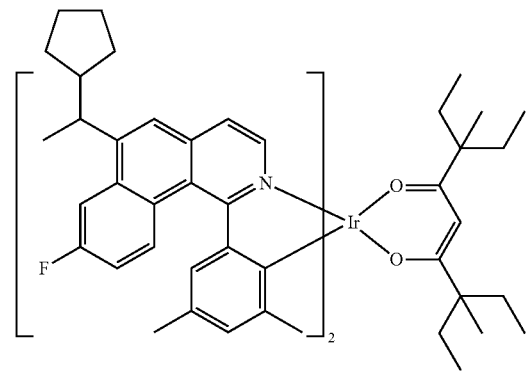

57

1.00 g of Compound 57 (Yield: 42.0%) was obtained in the same manner as in the synthesis method of Compound 2 of Synthesis Example 1, except that Compound L56 Dimer and 3,7-diethyl-3,7-dimethylnonane-4,6-dione were used instead of Compound L2 Dimer and 2,2,6,6-tetramethylheptane-3,5-dione, respectively.

HRMS(MALDI) calcd for $C_{71}H_{81}F_2IrN_2O_2$: m/z 1224.6548, Found: 1224.6550.

Evaluation Example 1: Evaluation of Phospholuminescence Quantum Yield (PLQY)

Compound $H_{52}$ and Compound 2 in a weight ratio of 98:2 were co-deposited under a vacuum of $10^{-7}$ torr to manufacture a film having a thickness of 40 nm.

The photoluminescence quantum yield (PLQY) in film of Compound 2 was evaluated using a Hamamatsu Photonics absolute PL quantum yield measurement system equipped with a xenon light source, a monochromator, a photonic multichannel analyzer), and integrating spheres with PLQY measurement software (Hamamatsu Photonics, Ltd., Shizuoka, Japan). The same evaluation was repeated using Compounds 10, 11, 22, 41, 42, 56 and 57. The results are shown in Table 2.

Table 2

| Compound No. | PLQY |
|---|---|
| 2 | 0.946 |
| 10 | 0.931 |
| 11 | 0.935 |
| 22 | 0.942 |
| 41 | 0.9652 |
| 42 | 0.9680 |
| 56 | 0.9752 |
| 57 | 0.9785 |

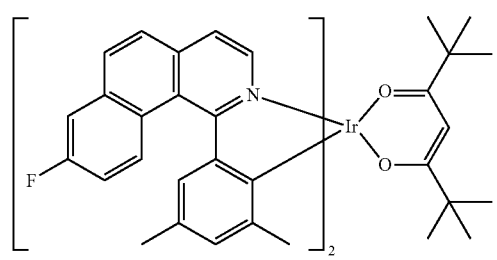

2

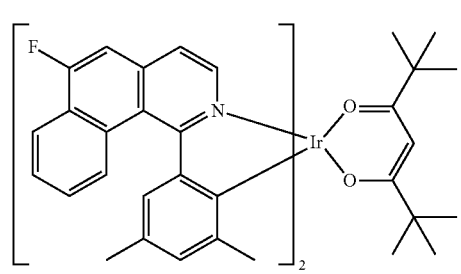

10

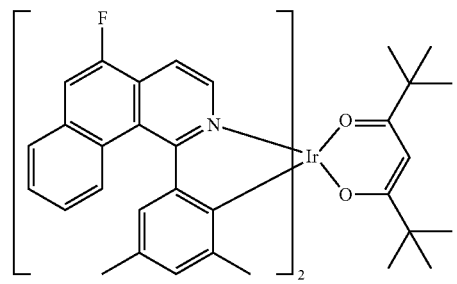

11

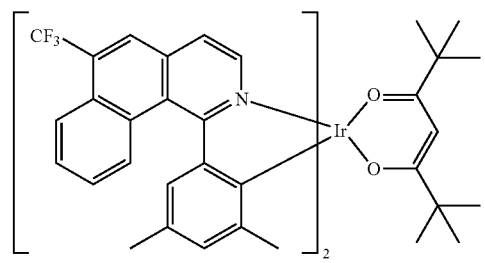

22

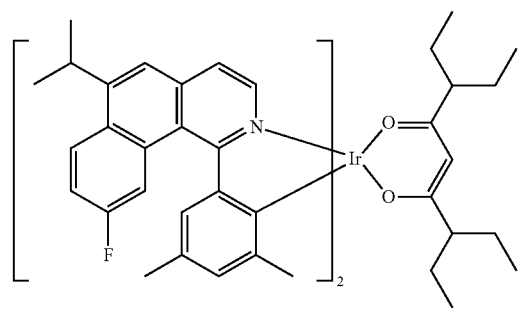

41

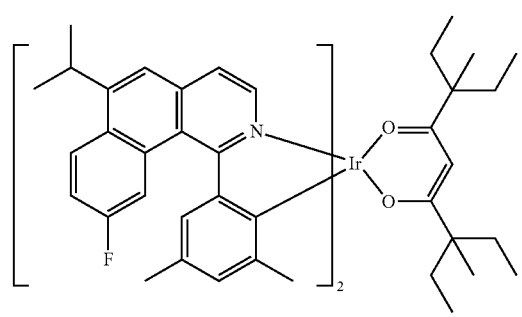

42

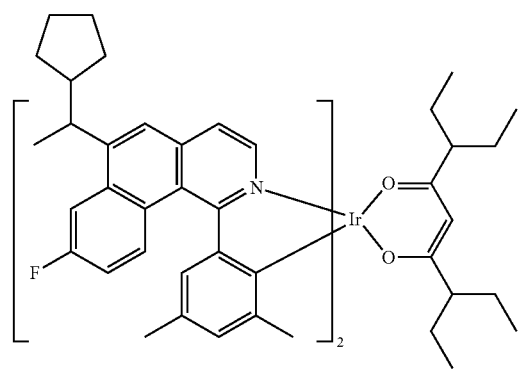

56

-continued

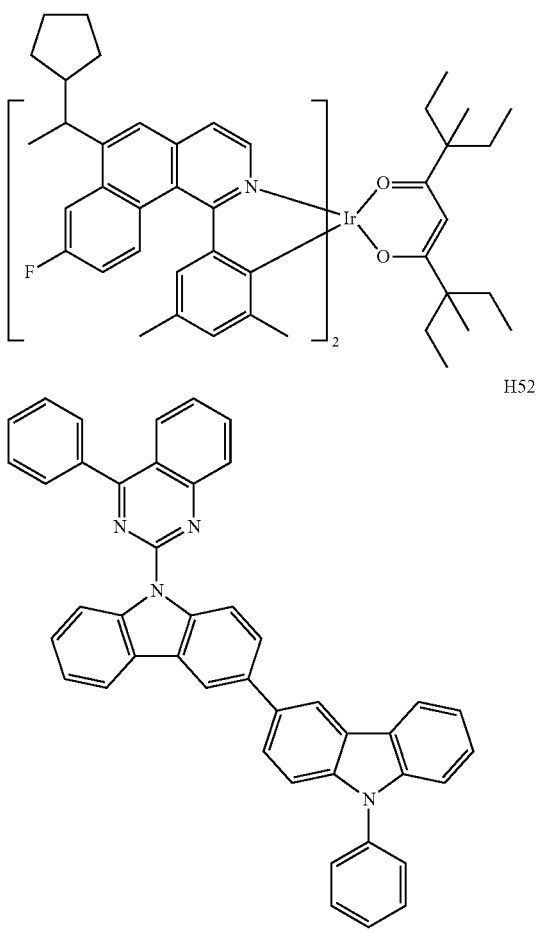

H52

Example 1

A glass substrate with a 1500 Å-thick ITO pattern thereon as an anode was cut to a size of 50 mm×50 mm×0.5 mm, ultrasonicated using isopropyl alcohol and pure water for 5 minutes each, and then irradiated with ultraviolet light for 30 minutes and exposed to ozone for cleaning. Then, the resultant glass substrate was loaded onto a vacuum deposition apparatus.

Compound HT3 and F6-TCNNQ were co-deposited under vacuum in a weight ratio of 98:2 on the ITO anode to form a hole injection layer having a thickness of 100 Å, Compound HT3 was vacuum-deposited on the hole injection layer to form a hole transport layer having a thickness of 1,350 Å, and then Compound HT21 was vacuum-deposited on the hole transport layer to form an electron blocking layer having a thickness of 300 Å.

Subsequently, Compound H52 (host) and Compound 2 (dopant) were co-deposited in a weight ratio of 98:2 on the electron blocking layer to form an emission layer having a thickness of 400 Å.

Then, Compound ET3 and ET-D1 were co-deposited in a volume ratio of 50:50 on the emission layer to form an electron transport layer having a thickness of 350 Å, ET-D1 was vacuum-deposited on the electron transport layer to form an electron injection layer having a thickness of 10 Å, and Al was vacuum-deposited on the electron injection layer to form a cathode having a thickness of 1,000 Å, thereby manufacturing an organic light-emitting device having a structure of ITO (1500 Å)/HT3+F6-TCNNQ (2 wt %)(100 Å)/HT3 (1350 Å)/HT21 (300 Å)/H52+Compound 2(2 wt %)(400 Å) /ET3+ET-D1 (50%)(350 Å)/ET-D1 (10 Å)/Al (1000 Å).

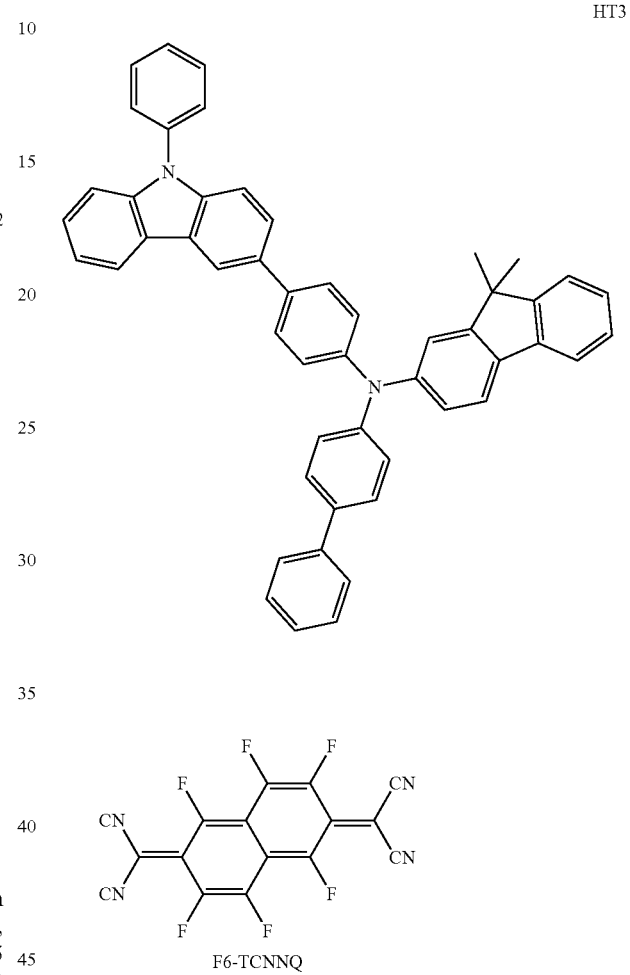

HT3

F6-TCNNQ

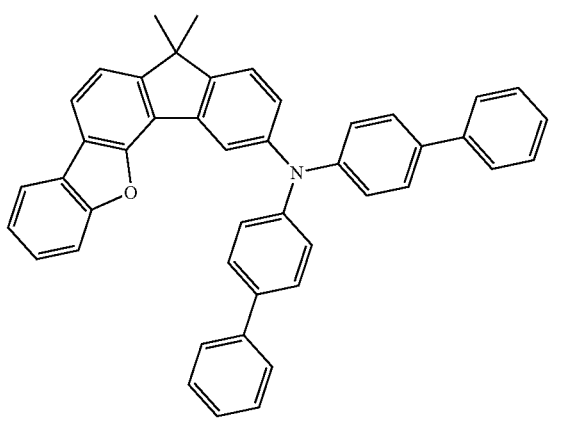

HT21

H52

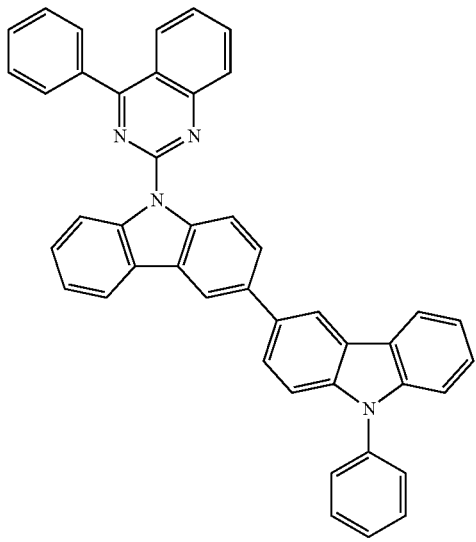

ET3

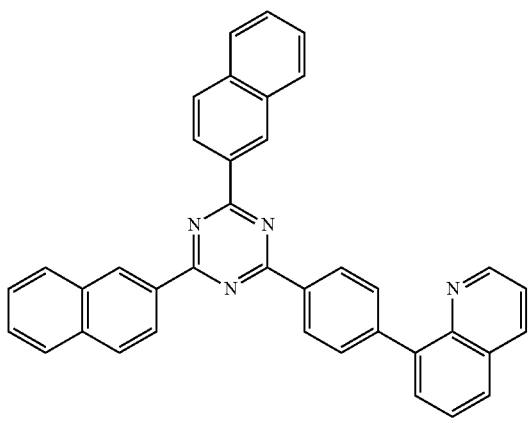

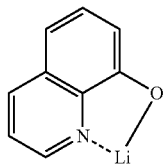

ET-D1

Examples 2 to 8 and Comparative Examples A to F

Organic light-emitting devices were manufactured in the same manner as in Example 1, except that Compounds shown in Table 3 were used, respectively, instead of Compound 2, as a dopant in forming an emission layer.

Evaluation Example 2: Characteristics Evaluation of Organic Light-Emitting Devices The driving voltage, current density, external quantum efficiency (EQE), roll-off ratio, the full width at half maximum (FWHM) of the emission peak in EL spectra, color coordinate, and lifetime ($LT_{97}$) of each of were evaluated using the organic light-emitting devices manufactured in Examples 1 to 8 and Comparative Examples A to F. The results are shown in Table 3. This evaluation was performed using a current-voltage meter (Keithley 2400) and a luminescence meter (Minolta Cs-1,000A), and the lifetime ($LT_{97}$)(at 3500 nit) was evaluated as the time (hr) it took until the luminance was reduced to 97% with respect to 100% of the initial luminance and represented as a relative value (%) in Table 3. The roll-off ratio was calculated using Equation 1.

$$\text{Roll-off ratio} = \{1 - (\text{efficiency(at 3500 nit)}/\text{maximum luminescence efficiency})\} \times 100\% \quad \text{Equation 1}$$

TABLE 3

| | Dopant Compound No. | Driving voltage (V) | Current density (mA/cm²) | Max EQE (%) | Roll-Off ratio (%) | FWHM (nm) | Emission color | Color coordinate (CIE) | $LT_{97}$ (Relative value, %) |
|---|---|---|---|---|---|---|---|---|---|
| Example 1 | 2 | 4.3 | 10 | 26 | 10 | 48 | Red | 0.67, 0.31 | 120 |
| Example 2 | 10 | 4.2 | 10 | 27 | 9 | 50 | Red | 0.68, 0.34 | 120 |
| Example 3 | 11 | 4.0 | 10 | 28 | 8 | 49 | Red | 0.68, 0.33 | 125 |
| Example 4 | 22 | 4.4 | 10 | 26 | 9 | 51 | Red | 0.68, 0.30 | 115 |
| Example 5 | 41 | 4.2 | 10 | 29 | 8 | 51 | Red | 0.68, 0.33 | 120 |
| Example 6 | 42 | 4.3 | 10 | 29 | 9 | 52 | Red | 0.68, 0.32 | 125 |
| Example 7 | 56 | 4.3 | 10 | 30 | 7 | 50 | Red | 0.69, 0.33 | 125 |
| Example 8 | 57 | 4.4 | 10 | 30 | 8 | 51 | Red | 0.69, 0.34 | 125 |
| Comparative Example A | A | 4.5 | 10 | 23 | 10 | 58 | Red | 0.68, 0.32 | 95 |
| Comparative Example B | B | 4.4 | 10 | 25 | 9 | 55 | Red | 0.68, 0.31 | 100 |
| Comparative Example C | C | 5.2 | 10 | 22 | 12 | 58 | Red | 0.69, 0.30 | 95 |
| Comparative Example D | D | 4.7 | 10 | 22 | 17 | 78 | Red | 0.69, 0.33 | 80 |
| Comparative Example E | E | 5.42 | 10 | 23.4 | 24 | 60 | Red | 0.69, 0.29 | 90 |
| Comparative Example F | F | 5.50 | 10 | 24.1 | 19 | 60 | Red | 0.69, 0.29 | 90 |

TABLE 3-continued

| Dopant Compound No. | Driving voltage (V) | Current density (mA/cm²) | Max EQE (%) | Roll-Off ratio (%) | FWHM (nm) | Emission color | Color coordinate (CIE) | LT₉₇ (Relative value, %) |
|---|---|---|---|---|---|---|---|---|
| 2 | | | | | | | | |
| 10 | | | | | | | | |
| 11 | | | | | | | | |
| 22 | | | | | | | | |
| 41 | | | | | | | | |
| 42 | | | | | | | | |

TABLE 3-continued
| Dopant Compound No. | Driving voltage (V) | Current density (mA/cm²) | Max EQE (%) | Roll-Off ratio (%) | FWHM (nm) | Emission color | Color coordinate (CIE) | LT₉₇ (Relative value, %) |
|---|---|---|---|---|---|---|---|---|
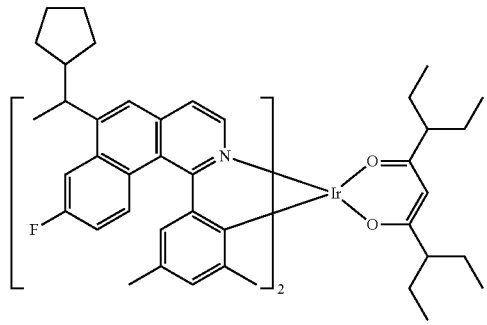
56
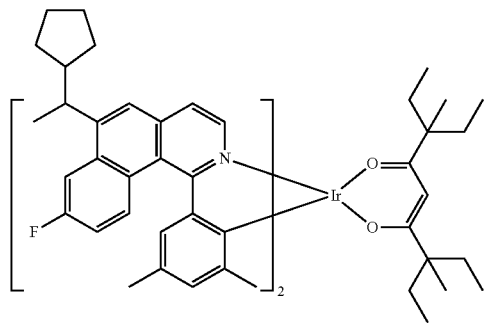
57
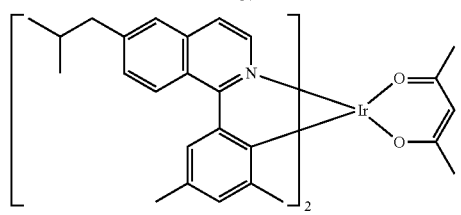
A
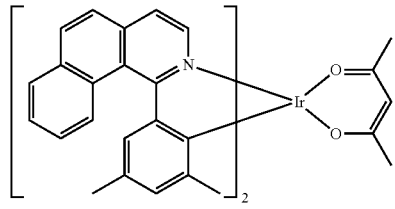
B
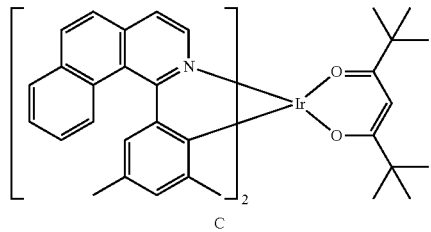
C TABLE 3-continued

| Dopant Compound No. | Driving voltage (V) | Current density (mA/cm²) | Max EQE (%) | Roll-Off ratio (%) | FWHM (nm) | Emission color | Color coordinate (CIE) | LT₉₇ (Relative value, %) |
|---|---|---|---|---|---|---|---|---|

[Structures D, E, F shown]

Referring to Table 3, the organic light-emitting devices of Examples 1 to 8 were found to emit red light of high color purity, and have improved driving voltage, improved EQE, improved roll-off ratio, relatively small FWHM, and improved lifetime characteristics, as compared with the organic light-emitting devices of Comparative Examples A to F.

According to the one or more embodiments, the organometallic compound represented by Formula 1 has excellent electronic characteristics and stability, and thus an electronic device, for example, an organic light-emitting device, including the organometallic compound may have improved driving voltage, improved external quantum efficiency, improved roll-off ratio, relatively small FWHM, and improved lifetime characteristics. Accordingly, a high-quality organic light-emitting device or electronic apparatus may be implemented using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the disclosure as defined by the following claims.

What is claimed is:

1. An organometallic compound represented by Formula 1,

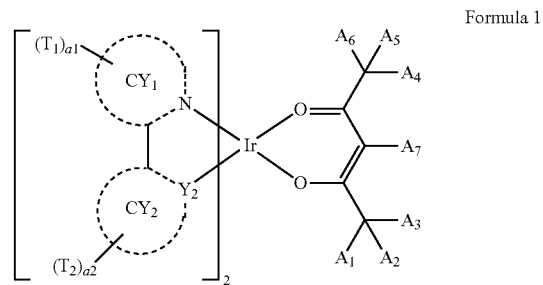

Formula 1 wherein, in Formula 1,
$Y_2$ is C or N,
a group represented by

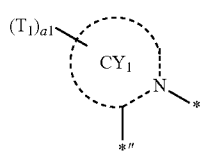

in Formula 1 is one of groups represented by Formulae CY1(1)-1 to CY1(1)-64, CY1(6)-2 to CY1(6)-8, and CY1(6)-10 to CY1(6)-16:

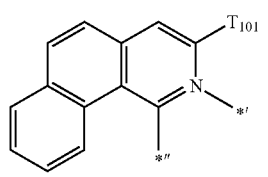
CY1(1)-1
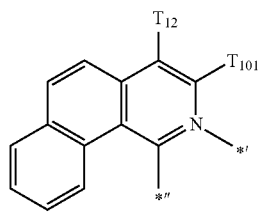
CY1(1)-2
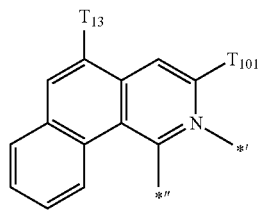
CY1(1)-3
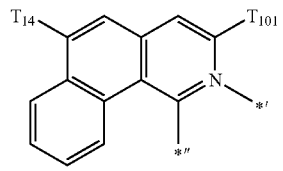
CY1(1)-4
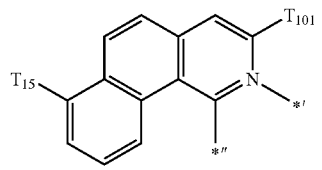
CY1(1)-5
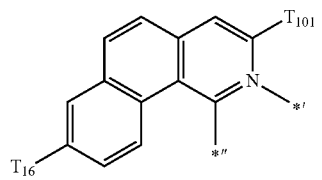
CY1(1)-6
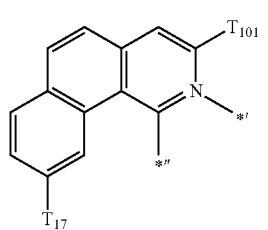
CY1(1)-7
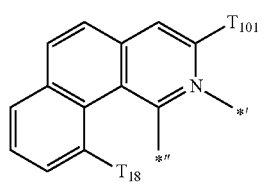
CY1(1)-8
-continued
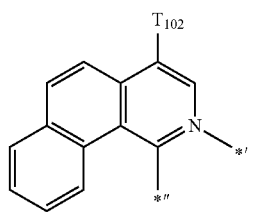
CY1(1)-9
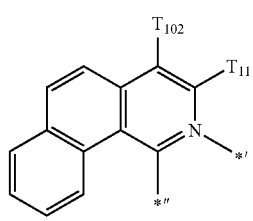
CY1(1)-10
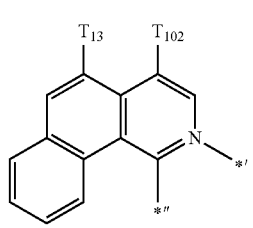
CY1(1)-11
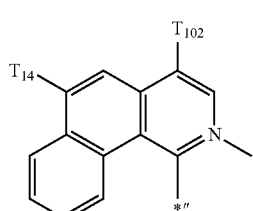
CY1(1)-12
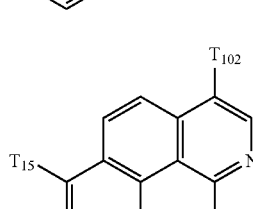
CY1(1)-13
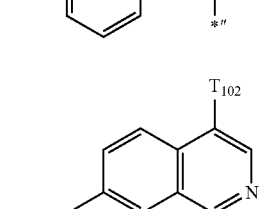
CY1(1)-14
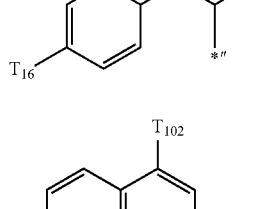
CY1(1)-15
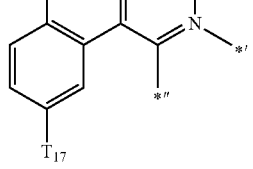

-continued
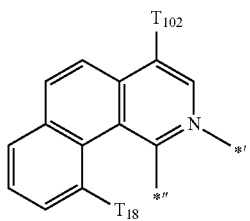
CY1(1)-16
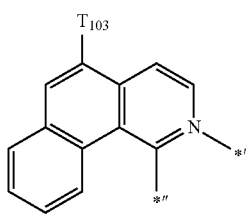
CY1(1)-17
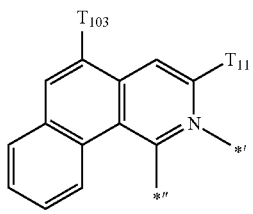
CY1(1)-18
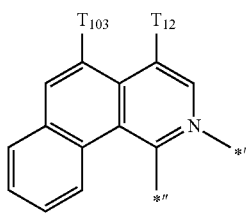
CY1(1)-19
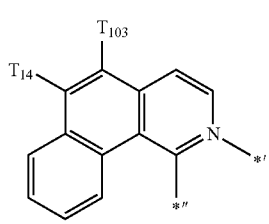
CY1(1)-20
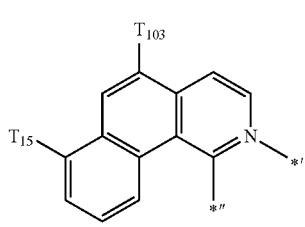
CY1(1)-21
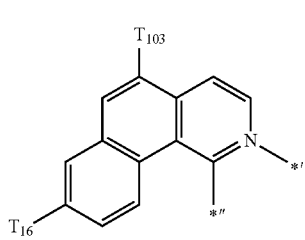
CY1(1)-22
-continued
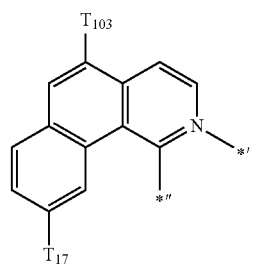
CY1(1)-23
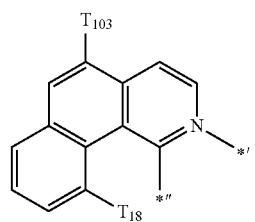
CY1(1)-24
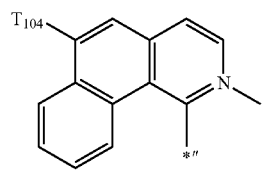
CY1(1)-25
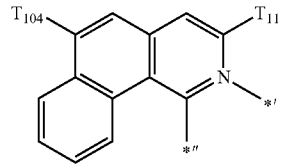
CY1(1)-26
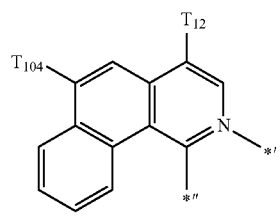
CY1(1)-27
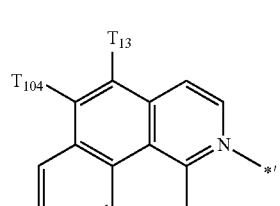
CY1(1)-28
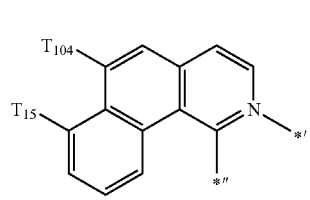
CY1(1)-29

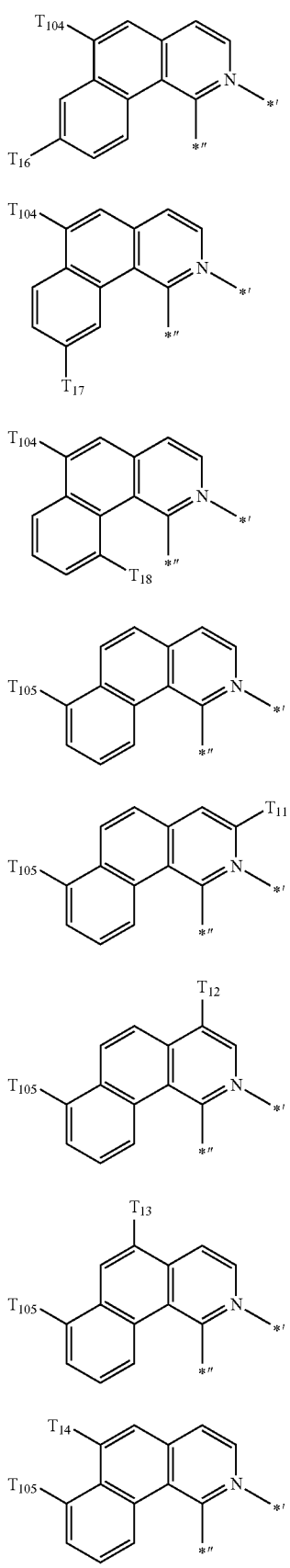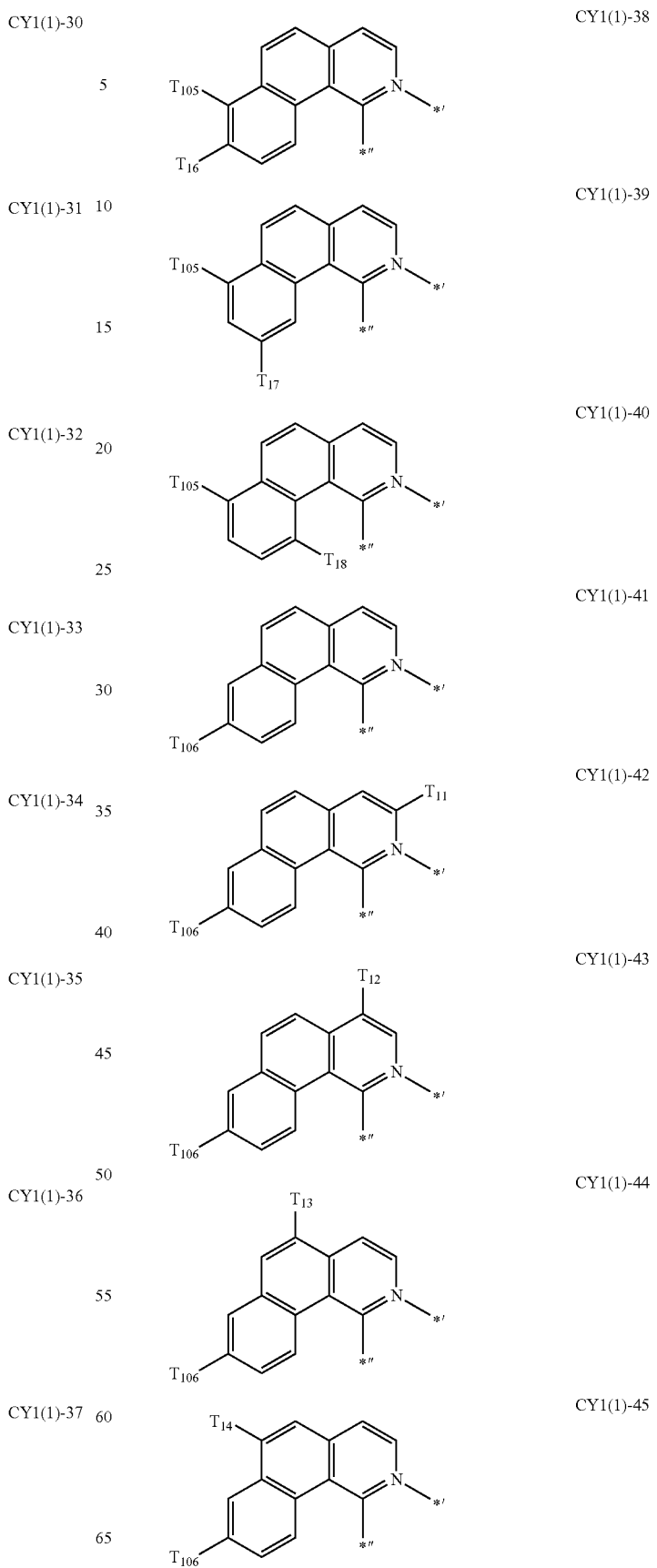

CY1(1)-46
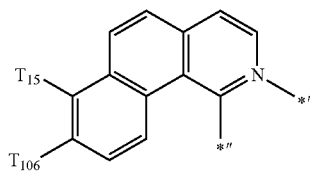
CY1(1)-47
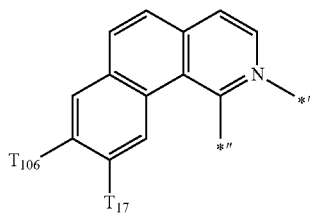
CY1(1)-48
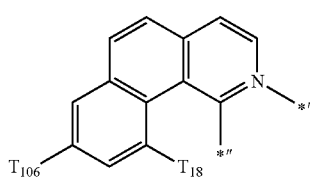
CY1(1)-49
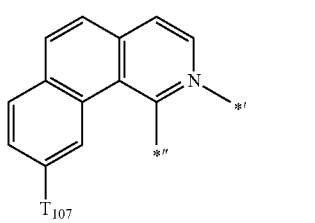
CY1(1)-50
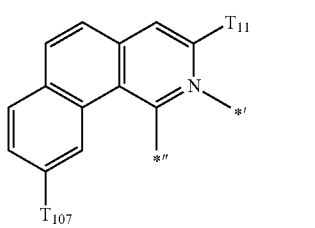
CY1(1)-51
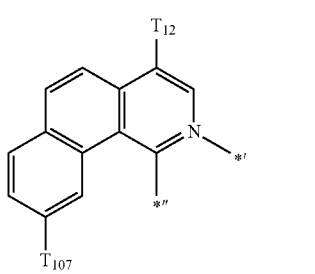
CY1(1)-52
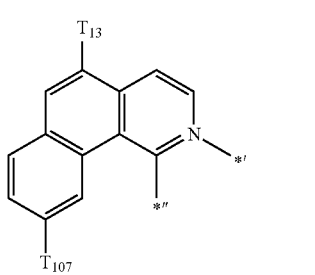
CY1(1)-53
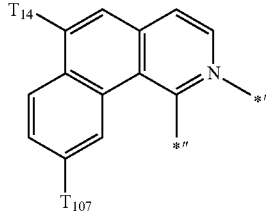
CY1(1)-54
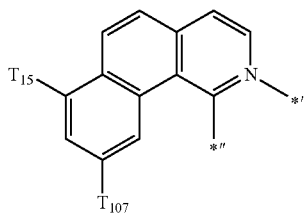
CY1(1)-55
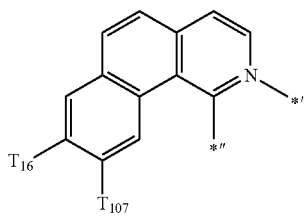
CY1(1)-56
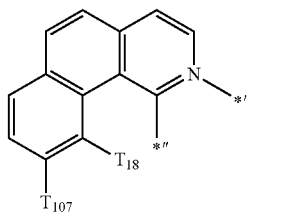
CY1(1)-57
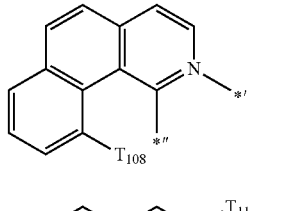
CY1(1)-58
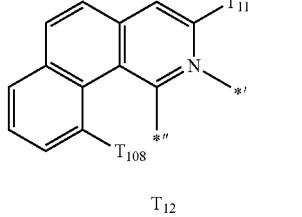
CY1(1)-59

CY1(1)-60
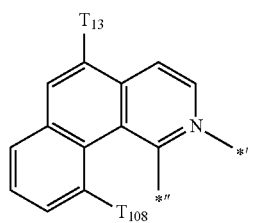
CY1(1)-61
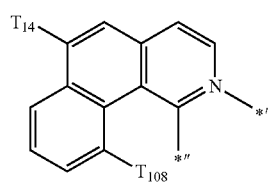
CY1(1)-62
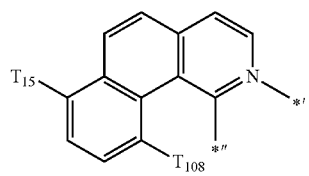
CY1(1)-63
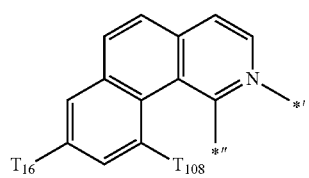
CY1(1)-64
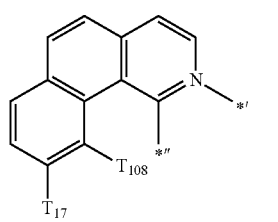
CY1(6)-2
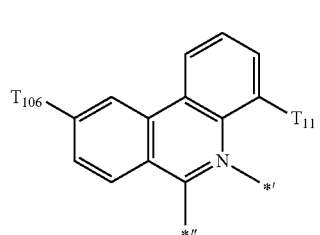
CY1(6)-3
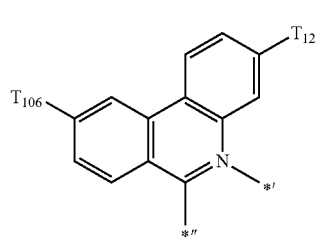
CY1(6)-4
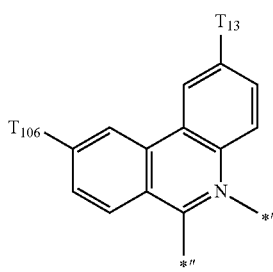
CY1(6)-5
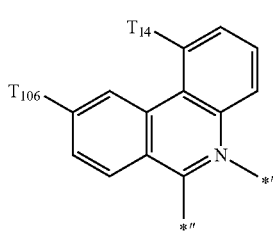
CY1(6)-6
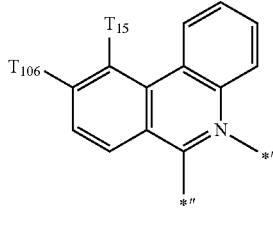
CY1(6)-7
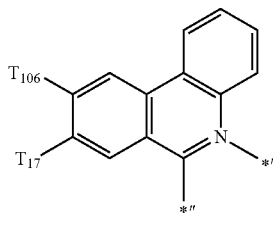
CY1(6)-8
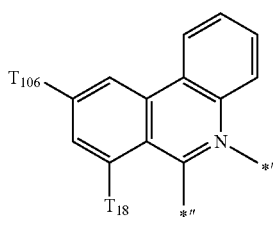
CY1(6)-10
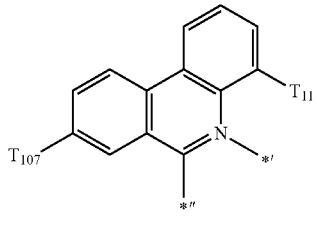
CY1(6)-11
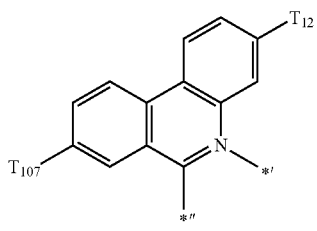

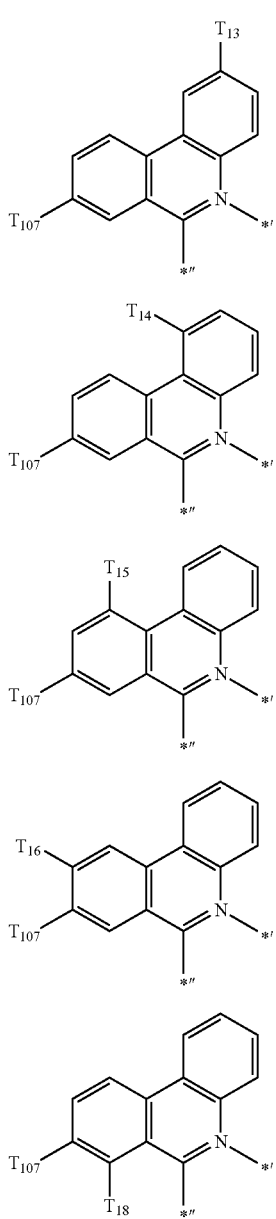

CY1(6)-12

CY1(6)-13

CY1(6)-14

CY1(6)-15

CY1(6)-16 wherein, in Formulae CY1(1)-1 to CY1(1)-64, and CY1 (6)-2 to CY1(6)-8 and CY1(6)-10 to CY1(6)-16, indicates a binding site to Ir in Formula 1, and

*''' indicates a binding site to ring $CY_2$ in Formula 1, ring $CY_2$ is a $C_5$-$C_{30}$ carbocyclic group or a $C_1$-$C_{30}$ heterocyclic group, $T_1$, $T_2$ and $A_1$ to $A_7$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), $T_{11}$ to $T_{18}$ are the same as defined in connection with $T_1$, provided that each of $T_i$ to $T_{18}$ is not hydrogen, $T_{101}$ to $T_{108}$ in Formulae CY1(1)-1 to CY1(1)-64 each comprises at least one fluoro group (—F) and $T_{106}$ and $T_{107}$ in Formulae CY1(6)-2 to CY1(6)-8 and CY1(6)-10 to CY1(6)-16 each comprises a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof, a1 and a2 are each independently an integer of 0 to 20; when a1 is 2 or greater, two or more $T_1$(s) are identical to or different from each other; when a2 is 2 or greater, two or more $T_2$(s) are identical to or different from each other; and the sum of a1 and a2 is 1 or greater, two or more of $T_i$(s) in the number of a1 are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, two or more of $T_2$ (s) in the number of a2 are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, $T_1$ and $T_2$ are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, two or more of $A_1$ to $A_7$ are optionally linked to one another to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$, $R_{1a}$ is the same as defined in connection with $A_7$, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group are each independently:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, or a C$_1$-C$_{60}$ alkoxy group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each substituted with deuterium, —F, —C$_1$, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_3$-C$_{10}$ cycloalkyl group, a C$_1$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —Ge(Q$_{13}$)(Q$_{14}$)(Q$_{15}$), —B(Q$_{16}$)(Q$_{17}$), —P(=O)(Q$_{18}$)(Q$_{19}$), —P(Q$_{18}$)(Q$_{19}$), or any combination thereof;

a C$_3$-C$_{10}$ cycloalkyl group, a C$_1$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, or a monovalent non-aromatic condensed heteropolycyclic group, each unsubstituted or substituted with deuterium, —F, —C$_1$, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{10}$ cycloalkyl group, a C$_1$-C$_{10}$ heterocycloalkyl group, a C$_3$-C$_{10}$ cycloalkenyl group, a C$_2$-C$_{10}$ heterocycloalkenyl group, a C$_6$-C$_{60}$ aryl group, a C$_6$-C$_{60}$ aryloxy group, a C$_6$-C$_{60}$ arylthio group, a C$_1$-C$_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or any combination thereof;

—N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$); or any combination thereof, Q$_1$ to Q$_9$, Q$_{11}$ to Q$_{19}$, Q$_{21}$ to Q$_{29}$ and Q$_{31}$ to Q$_{39}$ are each independently:

hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a C$_1$-C$_{60}$ alkyl group unsubstituted or substituted with deuterium, a C$_1$-C$_{60}$ alkyl group, a C$_6$-C$_{60}$ aryl group, or any combination thereof; a C$_2$-C$_{60}$ alkenyl group; a C$_2$-C$_{60}$ alkynyl group; a C$_1$-C$_{60}$ alkoxy group; a C$_3$-C$_{10}$ cycloalkyl group; a C$_1$-C$_{10}$ heterocycloalkyl group; a C$_3$-C$_{10}$ cycloalkenyl group; a C$_2$-C$_{10}$ heterocycloalkenyl group; a C$_6$-C$_{60}$ aryl group unsubstituted or substituted with deuterium, a C$_1$-C$_{60}$ alkyl group, a C$_6$-C$_{60}$ aryl group, or any combination thereof; a C$_6$-C$_{60}$ aryloxy group; a C$_6$-C$_{60}$ arylthio group; a C$_1$-C$_{60}$ heteroaryl group; a monovalent non-aromatic condensed polycyclic group; or a monovalent non-aromatic condensed heteropolycyclic group.

2. The organometallic compound of claim 1, wherein the ring CY2 is a benzene group, a naphthalene group, a 1,2,3,4-tetrahydronaphthalene group, a thiophene group, a furan group, a pyrrole group, a cyclopentadiene group, a silole group, a benzothiophene group, a benzofuran group, an indole group, an indene group, a benzosilole group, a dibenzothiophene group, a dibenzofuran group, a carbazole group, a fluorene group, or a dibenzosilole group.

3. The organometallic compound of claim 1, wherein T$_1$, T$_2$, and A$_1$ to A$_7$ are each independently hydrogen, deuterium, —F, a substituted or unsubstituted C$_1$-C$_{20}$ alkyl group, a substituted or unsubstituted C$_3$-C$_{10}$ cycloalkyl group, a substituted or unsubstituted C$_1$-C$_{10}$ heterocycloalkyl group, a substituted or unsubstituted a phenyl group, a substituted or unsubstituted a biphenyl group, a substituted or unsubstituted a terphenyl group, —Si(Q$_3$)(Q$_4$)(Q$_5$), or —Ge(Q$_3$)(Q$_4$)(Q$_5$).

4. The organometallic compound of claim 1, wherein T$_1$, and A$_1$ to A$_7$ are each independently:

hydrogen, deuterium, —F, C$_1$-C$_{20}$ alkyl group, a C$_3$-C$_{10}$ cycloalkyl group, a C$_1$-C$_{10}$ heterocycloalkyl group, a phenyl group, a biphenyl group, or a terphenyl group;

a fluorinated C$_1$-C$_{20}$ alkyl group, a fluorinated C$_3$-C$_{10}$ cycloalkyl group, a fluorinated C$_1$-C$_{10}$ heterocycloalkyl group, a fluorinated phenyl group, a fluorinated biphenyl group, or a fluorinated terphenyl group, each unsubstituted or substituted with deuterium, C$_1$-C$_{20}$ alkyl group, a C$_3$-C$_{10}$ cycloalkyl group, a C$_1$-C$_{10}$ heterocycloalkyl group, a phenyl group, a biphenyl group, a terphenyl group, or any combination thereof;

a deuterated C$_1$-C$_{20}$ alkyl group, a deuterated C$_3$-C$_{10}$ cycloalkyl group, a deuterated C$_1$-C$_{10}$ heterocycloalkyl group, a deuterated phenyl group, a deuterated biphenyl group, or a deuterated terphenyl group, each unsubstituted or substituted with —F, C$_1$-C$_{20}$ alkyl group, a C$_3$-C$_{10}$ cycloalkyl group, a C$_1$-C$_{10}$ heterocycloalkyl group, a phenyl group, a biphenyl group, a terphenyl group, or any combination thereof, or —Si(Q$_3$)(Q$_4$)(Q$_5$), or —Ge(Q$_3$)(Q$_4$)(Q$_5$).

5. The organometallic compound of claim 1, wherein T$_2$ does not comprise —F and a cyano group.

6. The organometallic compound of claim 1, wherein T$_2$, and A$_1$ to A$_7$ are each independently:

hydrogen, deuterium, C$_1$-C$_{20}$ alkyl group, a C$_3$-C$_{10}$ cycloalkyl group, a C$_1$-C$_{10}$ heterocycloalkyl group, a phenyl group, a biphenyl group, or a terphenyl group;

a deuterated C$_1$-C$_{20}$ alkyl group, a deuterated C$_3$-C$_{10}$ cycloalkyl group, a deuterated C$_1$-C$_{10}$ heterocycloalkyl group, a deuterated phenyl group, a deuterated biphenyl group, or a deuterated terphenyl group, each unsubstituted or substituted with a C$_1$-C$_{20}$ alkyl group, a C$_3$-C$_{10}$ cycloalkyl group, a C$_1$-C$_{10}$ heterocycloalkyl group, a phenyl group, a biphenyl group, a terphenyl group, or any combination thereof; or —Si(Q$_3$)(Q$_4$)(Q$_5$), or —Ge(Q$_3$)(Q$_4$)(Q$_5$).

7. The organometallic compound of claim 1, wherein, in Formulae CY1(1)-1 to CY1(1)-64, CY1(6)-2 to CY1(6)-8, and CY1(6)-10 to CY1(6)-16, $T_{11}$ to $T_{18}$ are each independently:
deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, or a terphenyl group;
a deuterated $C_1$-$C_{20}$ alkyl group, a deuterated $C_3$-$C_{10}$ cycloalkyl group, a deuterated $C_1$-$C_{10}$ heterocycloalkyl group, a deuterated phenyl group, a deuterated biphenyl group, or a deuterated terphenyl group, each unsubstituted or substituted with a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof, or
—Si($Q_3$)($Q_4$)($Q_5$), or —Ge($Q_3$)($Q_4$)($Q_5$), and
$T_{101}$ to $T_{108}$ in Formulae CY1(1)-1 to CY1(1)-64 are each independently:
—F; or
a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof,
$T_{106}$ and $T_{107}$ in Formulae CY1(6)-1 to CY1(6)-16 are each independently:
a fluorinated $C_1$-$C_{20}$ alkyl group, a fluorinated $C_3$-$C_{10}$ cycloalkyl group, a fluorinated $C_1$-$C_{10}$ heterocycloalkyl group, a fluorinated phenyl group, a fluorinated biphenyl group, or a fluorinated terphenyl group, each unsubstituted or substituted with deuterium, a $C_1$-$C_{20}$ alkyl group, a $C_3$-$C_{10}$ cycloalkyl group, a $C_1$-$C_{10}$ heterocycloalkyl group, a phenyl group, a biphenyl group, a terphenyl group, or any combination thereof.

8. The organometallic compound of claim 1, wherein a group represented by

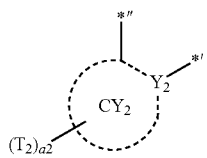

in Formula 1 is one of groups represented by Formulae CY2-1 to CY2-31:

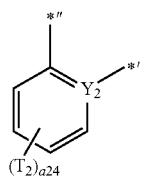

CY2-1

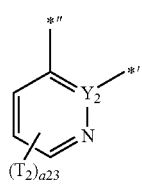

CY2-2

-continued

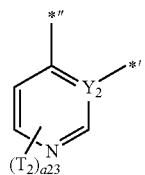

CY2-3

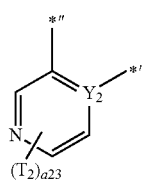

CY2-4

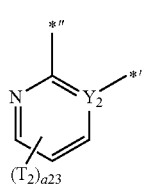

CY2-5

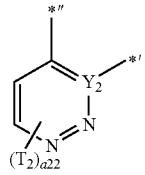

CY2-6

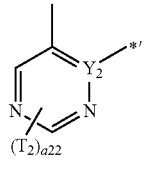

CY2-7

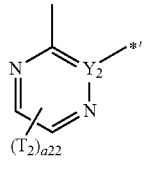

CY2-8

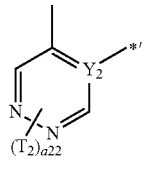

CY2-9

CY2-10

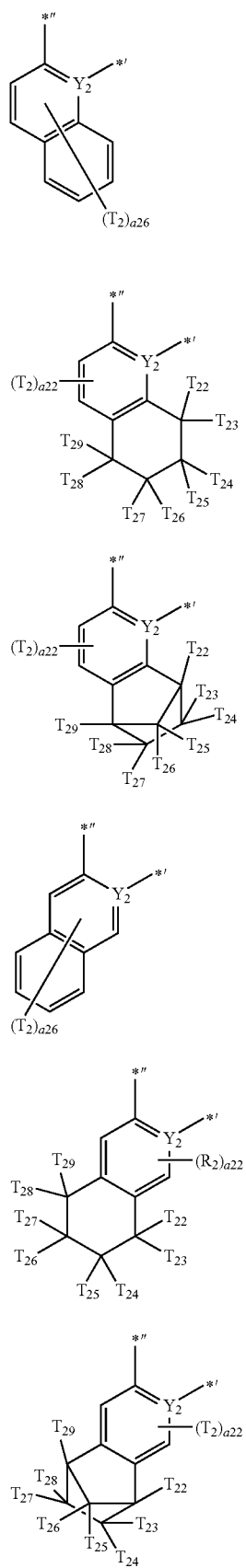
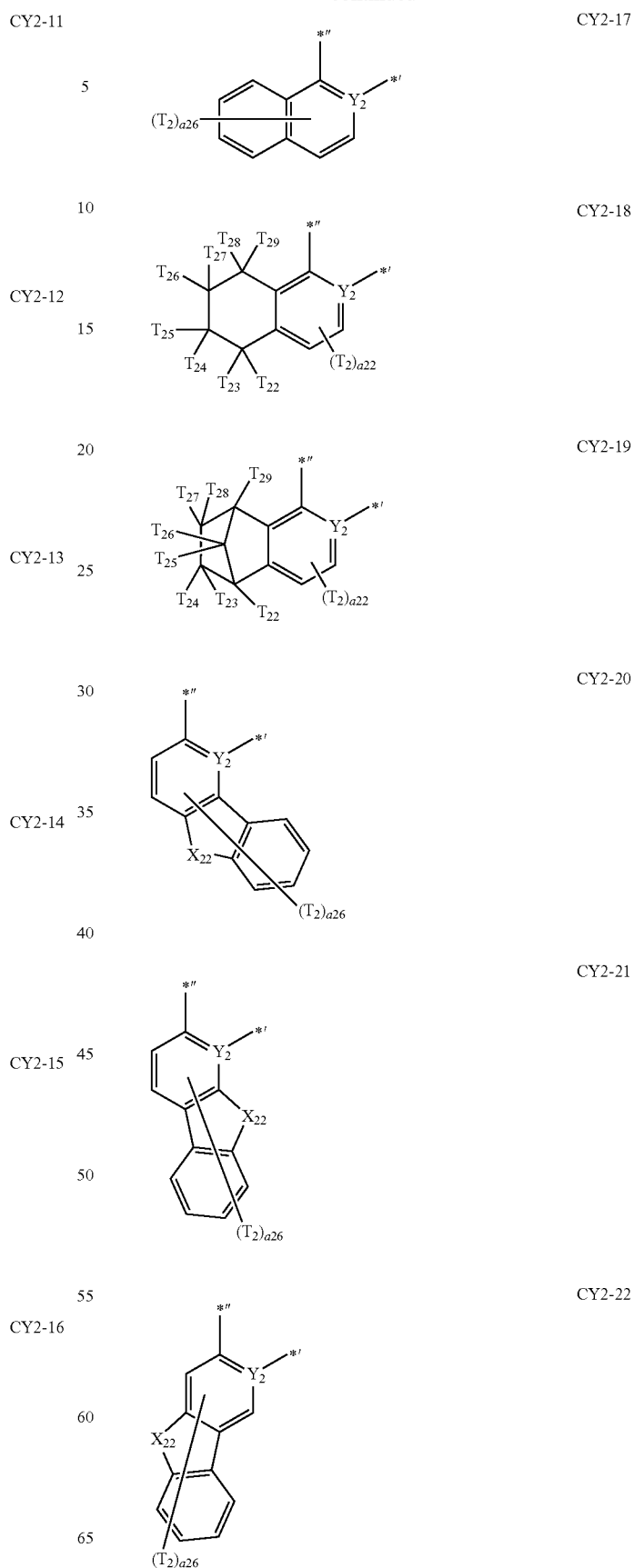

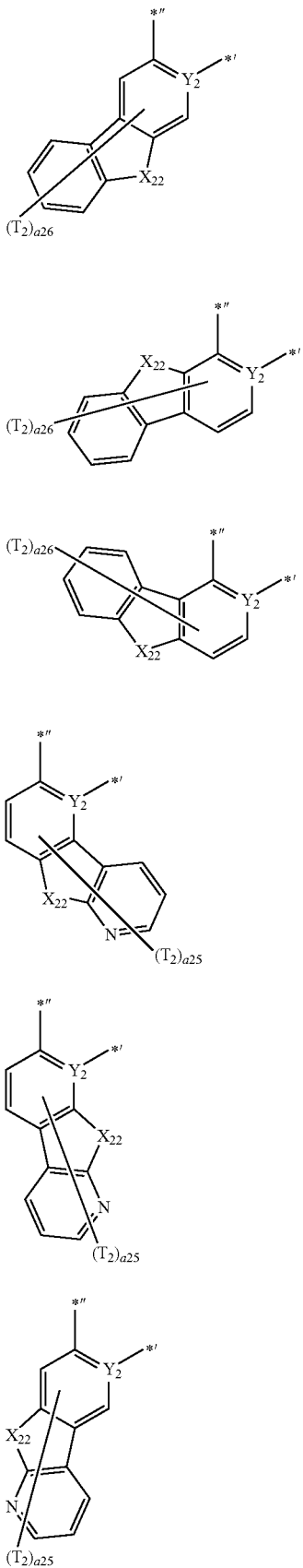

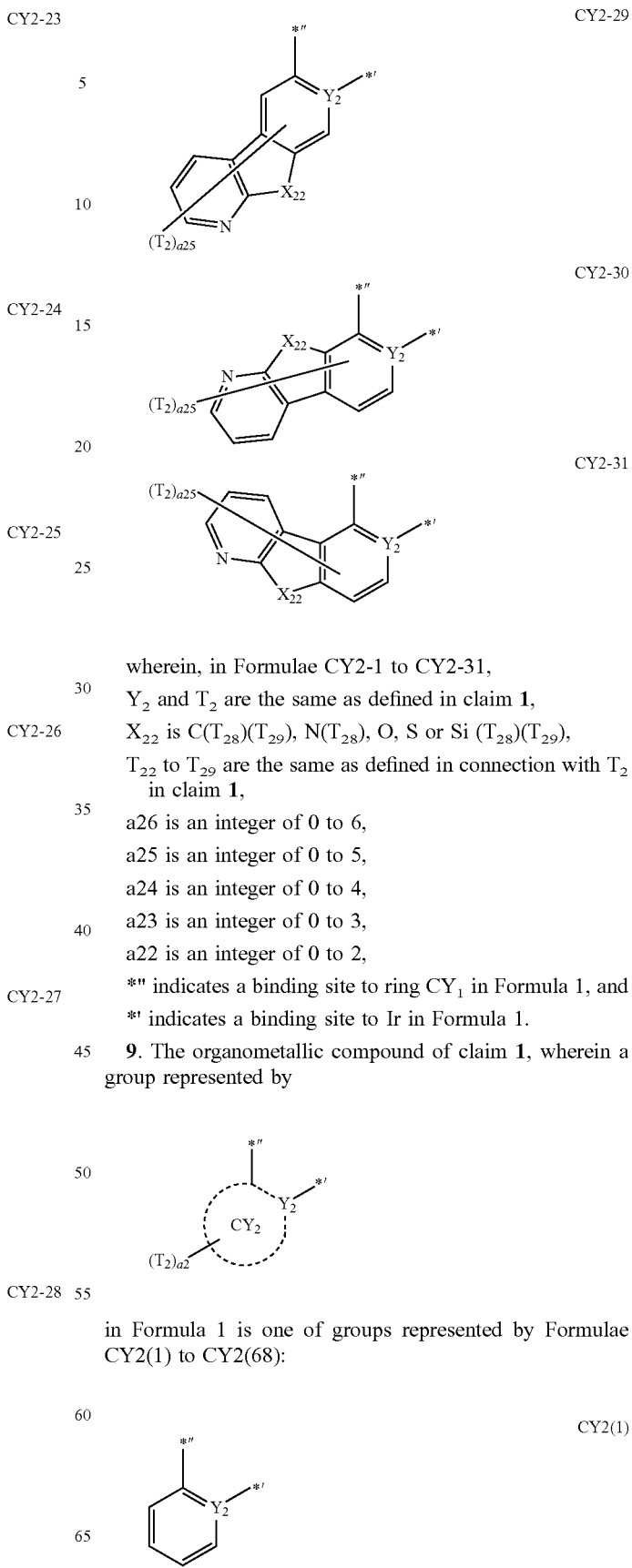

wherein, in Formulae CY2-1 to CY2-31,

Y$_2$ and T$_2$ are the same as defined in claim 1,

X$_{22}$ is C(T$_{28}$)(T$_{29}$), N(T$_{28}$), O, S or Si (T$_{28}$)(T$_{29}$),

T$_{22}$ to T$_{29}$ are the same as defined in connection with T$_2$ in claim 1, a26 is an integer of 0 to 6, a25 is an integer of 0 to 5, a24 is an integer of 0 to 4, a23 is an integer of 0 to 3, a22 is an integer of 0 to 2,

*" indicates a binding site to ring CY$_1$ in Formula 1, and

*' indicates a binding site to Ir in Formula 1.

9. The organometallic compound of claim 1, wherein a group represented by in Formula 1 is one of groups represented by Formulae CY2(1) to CY2(68):

-continued

CY2(2)
CY2(3)
CY2(4)
CY2(5)
CY2(6)
CY2(7)
CY2(8)
CY2(9)

-continued

CY2(10)
CY2(11)
CY2(12)
CY2(13)
CY2(14)
CY2(15)
CY2(16)
CY2(17)

CY2(18) 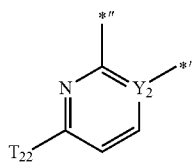
CY2(19) 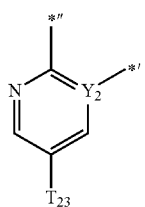
CY2(20) 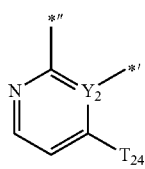
CY2(21) 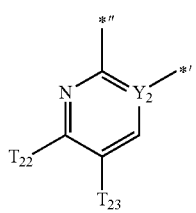
CY2(22) 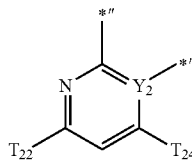
CY2(23) 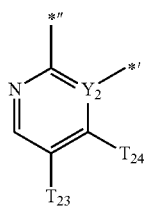
CY2(24) 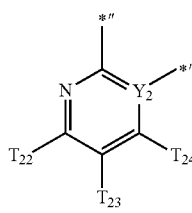
CY2(25) 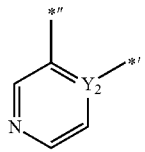
CY2(26) 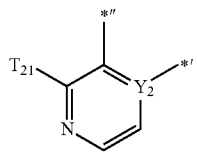
CY2(27) 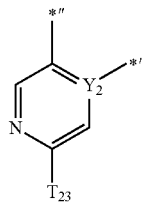
CY2(28) 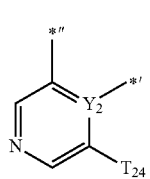
CY2(29) 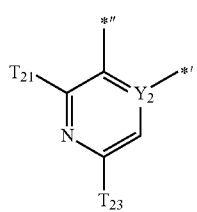
CY2(30) 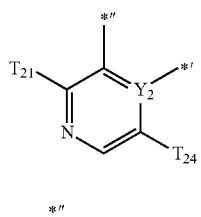
CY2(31) 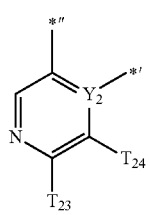
CY2(32) 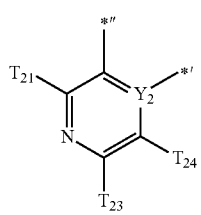
CY2(33) 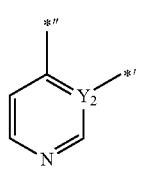

CY2(34) 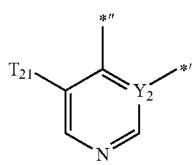
CY2(35) 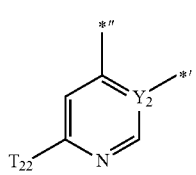
CY2(36) 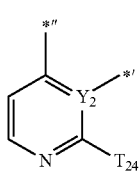
CY2(37) 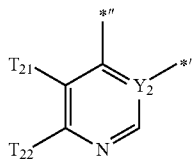
CY2(38) 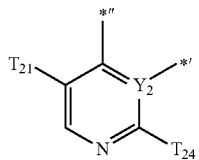
CY2(39) 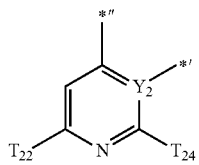
CY2(40) 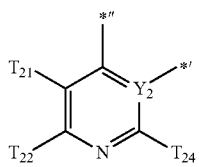
CY2(41) 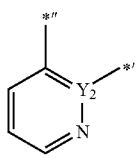
CY2(42) 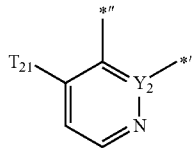
CY2(43) 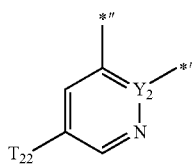
CY2(44) 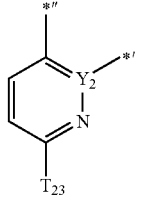
CY2(45) 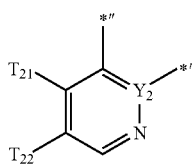
CY2(46) 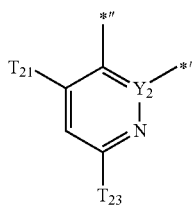
CY2(47) 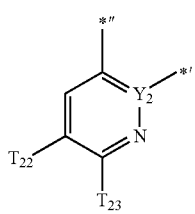
CY2(48) 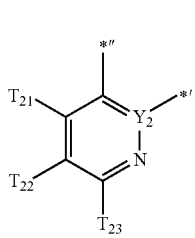
CY2(49) 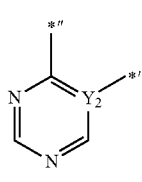
CY2(50) 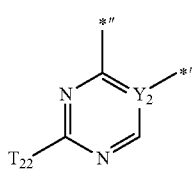

CY2(51) 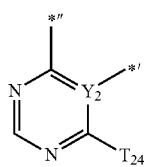
CY2(52) 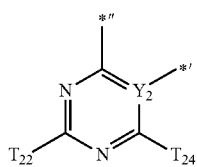
CY2(53) 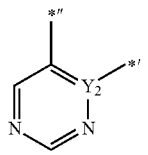
CY2(54) 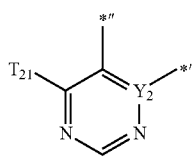
CY2(55) 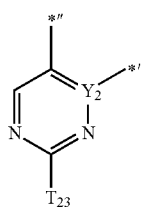
CY2(56) 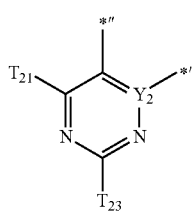
CY2(57) 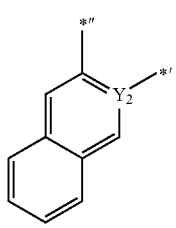
CY2(58) 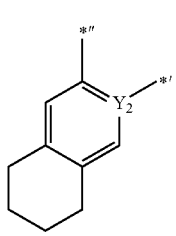
CY2(59) 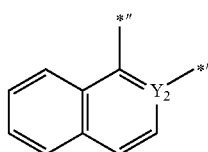
CY2(60) 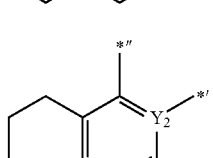
CY2(61) 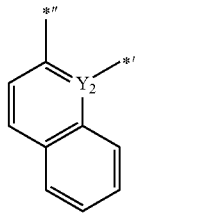
CY2(62) 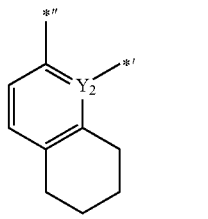
CY2(63) 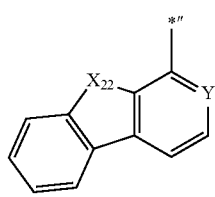
CY2(64) 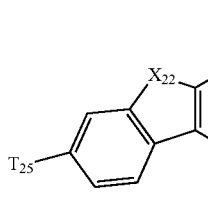
CY2(65) 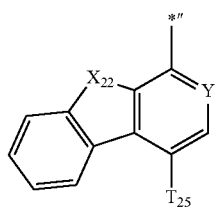
CY2(66) 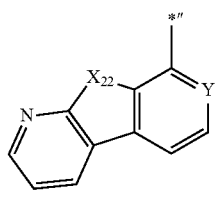

-continued

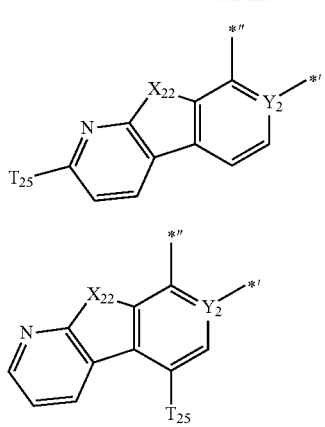

CY2(67)

CY2(68)

wherein, in Formulae CY2(1) to CY2(68),
$Y_2$ is the same as defined in claim 1,
$X_{22}$ is C $(T_{28})(T_{29})$, N$(T_{28})$, O, S, or Si $(T_{28})(T_{29})$,
$T_{21}$ to $T_{25}$, $T_{28}$, and $T_{29}$ are the same as defined in connection with $T_2$ in claim 1, but each of
$T_{21}$ to $T_{24}$ are not hydrogen,
*" indicates a binding site to ring $CY_1$ in Formula 1, and
*' indicates a binding site to Ir in Formula 1.

10. The organometallic compound of claim 1, wherein the organometallic compound satisfies at least one of Condition 1 to Condition 3:
Condition 1
$A_1$ to $A_6$ in Formula 1 are each independently a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group;
Condition 2
at least one of $A_1$ to $A_6$ in Formula 1 are each independently a substituted or unsubstituted $C_2$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group; and
Condition 3
$A_7$ in Formula 1 is deuterium, a substituted or unsubstituted $C_1$-$C_{60}$ alkyl group, a substituted or unsubstituted $C_3$-$C_{10}$ cycloalkyl group, a substituted or unsubstituted $C_2$-$C_{10}$ heterocycloalkyl group, a substituted or unsubstituted $C_6$-$C_{60}$ aryl group, a substituted or unsubstituted $C_2$-$C_{60}$ heteroaryl group, a substituted or unsubstituted monovalent non-aromatic condensed polycyclic group, or a substituted or unsubstituted monovalent non-aromatic condensed heteropolycyclic group.

11. The organometallic compound of claim 1, wherein the organometallic compound satisfies at least one of Condition 4 and Condition 5:
Condition 4
in Formula 1, two or more of $A_1$ to $A_3$ of the group represented by *—$C(A_1)(A_2)(A_3)$ are linked with C in the group represented by *—$C(A_1)(A_2)(A_3)$ to form a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$ so that the group represented by *—$C(A_1)(A_2)(A_3)$ is a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$,
Condition 5
in Formula 1, two or more of $A_4$ to $A_6$ of the group represented by *—$C(A_4)(A_5)(A_6)$ are linked with C in the group represented by *—$C(A_4)(A_5)(A_6)$ to form a $C_5$-$C_{30}$ carbocyclic group unsubstituted or substituted with at least one $R_{1a}$, or a $C_1$-$C_{30}$ heterocyclic group unsubstituted or substituted with at least one Ria so that the group represented by *—$C(A_4)(A_5)(A_6)$ is a $C_5$-$C_{30}$ carbocyclic group unsubstituted or substituted with at least one $R_{1a}$, or a $C_1$-$C_{30}$ heterocyclic group unsubstituted or substituted with at least one $R_{1a}$.

12. An organic light-emitting device comprising:
a first electrode;
a second electrode; and
an organic layer disposed between the first electrode and the second electrode and comprising an emission layer, the organic layer comprising at least one organometallic compound represented by Formula 1 of claim 1.

13. The organic light-emitting device of claim 12, wherein the first electrode is an anode,
the second electrode is a cathode,
the organic layer further comprises a hole transport region between the first electrode and the emission layer, and an electron transport region between the emission layer and the second electrode,
the hole transport region comprises a hole injection layer, a hole transport layer, an electron blocking layer, a buffer layer or any combination thereof, and
the electron transport region comprises a hole blocking layer, an electron transport layer, an electron injection layer, or any combination thereof.

14. The organic light-emitting device of claim 12, wherein the organometallic compound is in the emission layer.

15. The organic light-emitting device of claim 14, wherein the emission layer further comprises a host, and an amount of the host in the emission layer is larger than an amount of the organometallic compound in the emission layer.

16. An electronic apparatus comprising the organic light-emitting device of claim 12.

* * * * *